United States Patent
Tayanaka

[11] Patent Number: 6,107,213
[45] Date of Patent: *Aug. 22, 2000

[54] METHOD FOR MAKING THIN FILM SEMICONDUCTOR

[75] Inventor: Hiroshi Tayanaka, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/818,239

[22] Filed: Mar. 14, 1997

Related U.S. Application Data

[63] Continuation-in-part of application No. 08/595,382, Feb. 1, 1996, Pat. No. 5,811,348.

[30] Foreign Application Priority Data

| Mar. 18, 1996 | [JP] | Japan | 8-061552 |
| Sep. 4, 1996 | [JP] | Japan | 8-234480 |

[51] Int. Cl.$^7$ .................................................. H01L 21/20

[52] U.S. Cl. .......................................... 438/762; 438/960

[58] Field of Search ................................... 438/455, 458, 438/761, 762, 763, 960, 962

[56] References Cited

U.S. PATENT DOCUMENTS

| 4,727,047 | 2/1988 | Bozler et al. . | |
| 5,811,348 | 9/1998 | Matsushita et al. | 438/455 |
| 5,854,123 | 12/1998 | Sato et al. . | |
| 5,856,229 | 1/1999 | Sakaguchi et al. . | |

FOREIGN PATENT DOCUMENTS

| 0 554 795 A1 | 8/1993 | European Pat. Off. . |
| 0 793 263 A2 | 9/1997 | European Pat. Off. . |
| 62-279625 | 12/1987 | Japan . |

OTHER PUBLICATIONS

Patent Abstracts of Japan, vol. 010, No. 039 (E–381), Feb. 15, 1986 & JP 60 196955 A (Toko Inc), Oct. 5, 1985.

T. Yasumatsu, et al., "Ultrathin Si films grown epitaxially on porous silicon", Applied Surface Science, vol. 48/49, May 1991, pp. 414–418, XP–002093161.

M. Ohnishi, et al., "New Type Structures Of A–Si Solar Cell Submodules Fabricated By Microscopic Hole Spacing Technique", Record Of The Photovoltaic Specialists Conference, Kissimimee, May 21–25, 1990, vol. 2, No. Conf. 21, May 21, 1990, pp. 1394–1399, XP 000480389, Institute Of Electrical and Electronics Engineers.

Patent Abstracts of Japan, vol. 018, No. 066 (E–1501), Feb. 3, 1994 & JP 05 283722 A (Canon Inc), Oct. 29, 1993.

V. Labunov, et al., "Heat Treatment Effect on Porous Silicon", Thin Solid Films, vol. 137, pp. 123–134, 1986.

N. Sato, et al., "Epitaxial Growth on Porous Si for a new Bond and Etch–back SOI", The Electrochemical Society, Spring Meeting, May 22–27, 1994, Extended Abstracts, vol. 94–1, Abstract No. 443, pp. 705–706.

*Primary Examiner*—Charles Bowers
*Assistant Examiner*—Keith Christianson
*Attorney, Agent, or Firm*—Hill & Simpson

[57] ABSTRACT

The present invention provides new and improved methods for making crystalline semiconductor thin films which may be bonded to different kinds of substrates. The thin films may be flexible. In accordance with preferred methods, a multi-layer porous structure including two or more porous layers having different porosities is formed in a semiconductor substrate. A semiconductor thin film is grown on the porous structure. Electrodes and/or a desired support substrate may be attached to the grown film. The grown film is separated from the semiconductor substrate along a line of weakness defined in the porous structure. The separated thin film attached to the support substrate may be further processed to provide improved film products, solar panels and light emitting diode devices. These thin film semiconductors are excellent in crystallinity and may be inexpensively produced, thereby enabling production of solar cells and light emitting diodes at lower cost.

20 Claims, 27 Drawing Sheets

PROCESS DIAGRAM (FIRST)

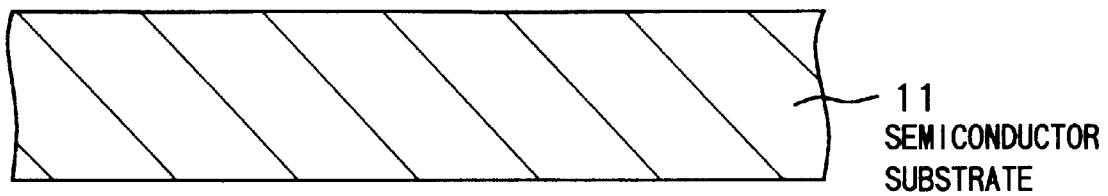
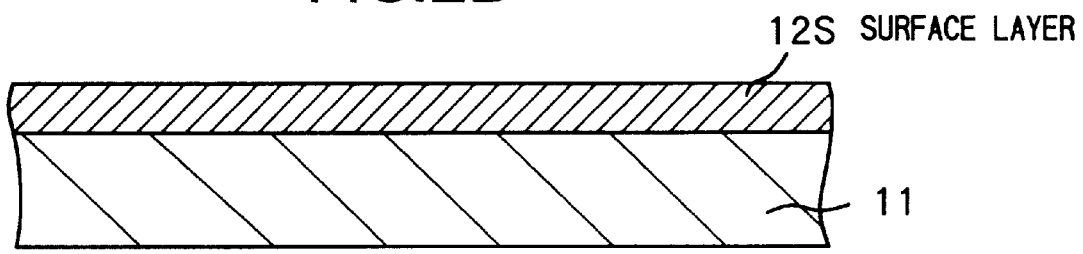
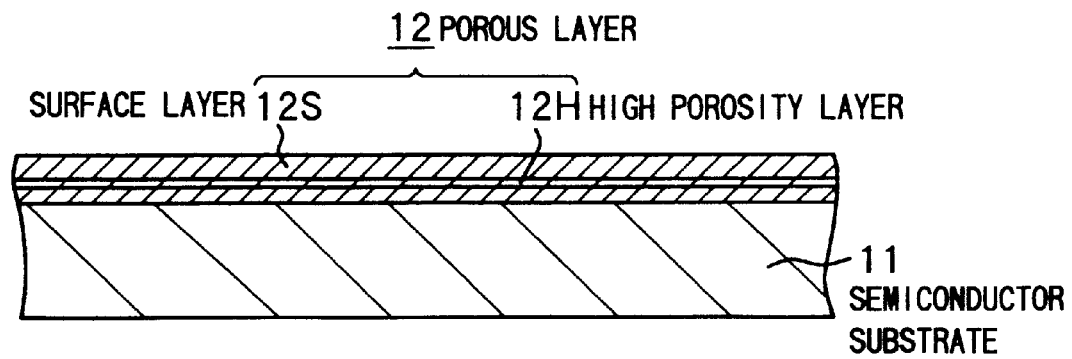
PROCESS DIAGRAM (FIRST)

PROCESS DIAGRAM (SECOND)

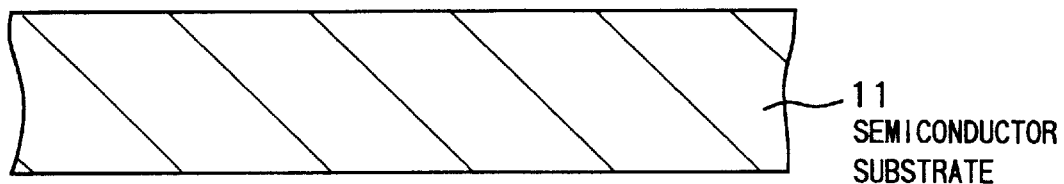
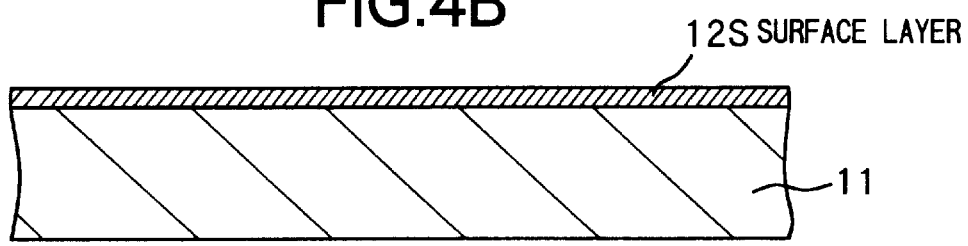
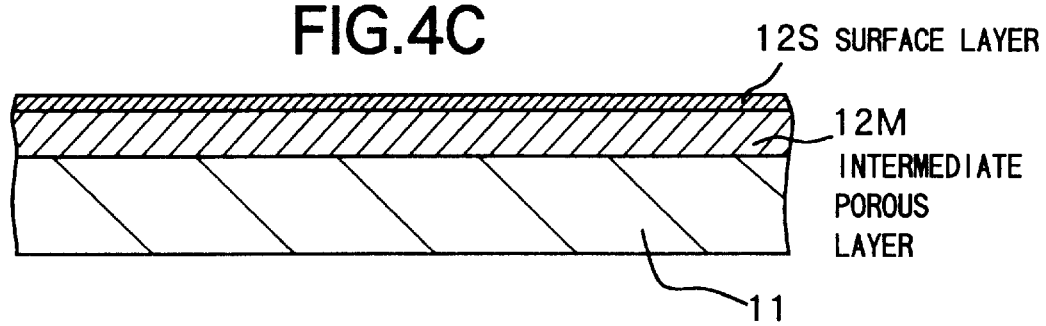
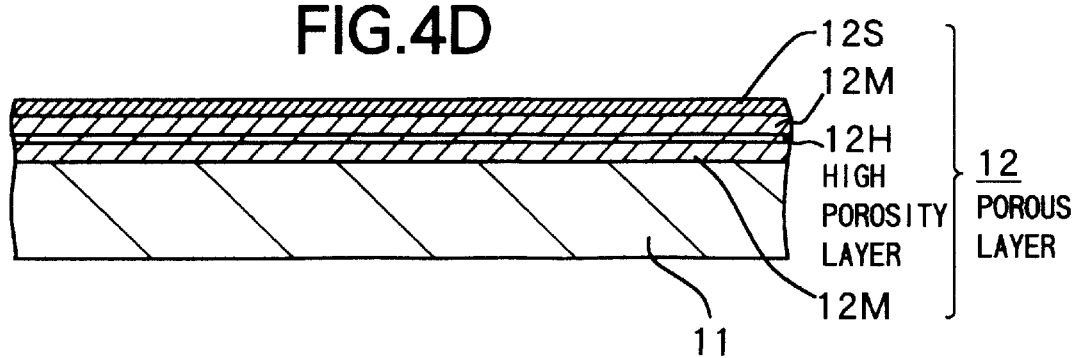
PROCESS DIAGRAM (FIRST)

FIG.5A
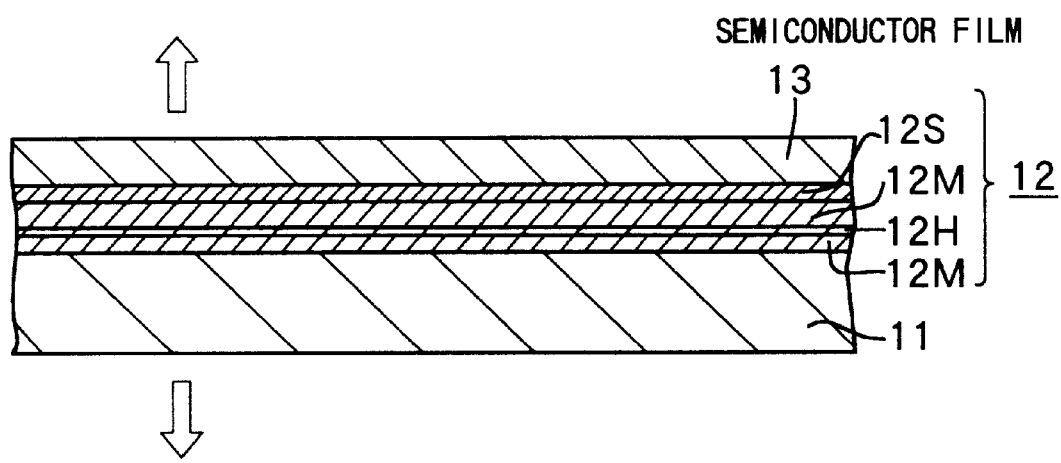
FIG.5B
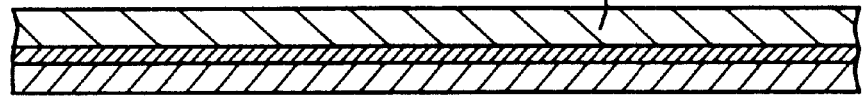
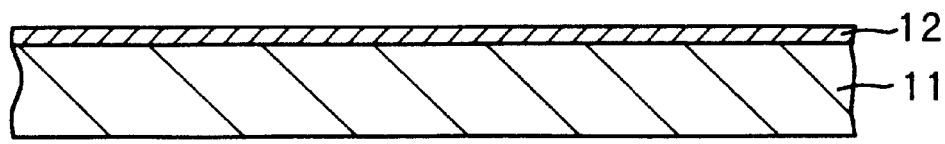
PROCESS DIAGRAM (SECOND)

PROCESS DIAGRAM (FIRST)

PROCESS DIAGRAM (SECOND)

FIG.8A
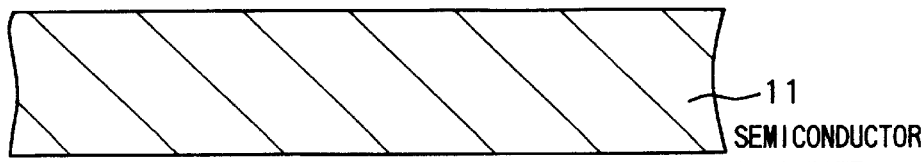
FIG.8B
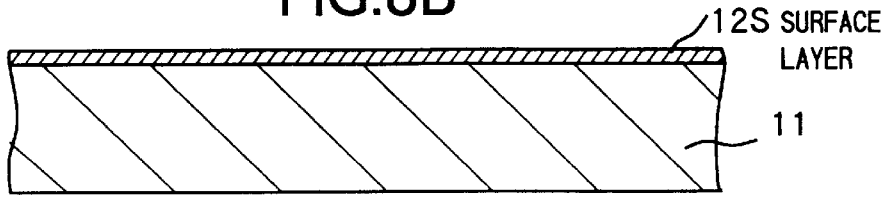
FIG.8C
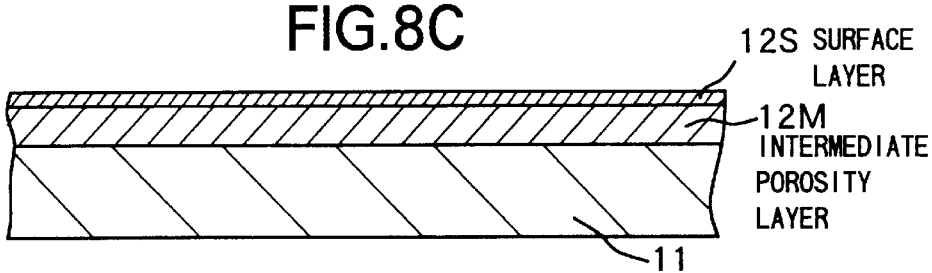
FIG.8D
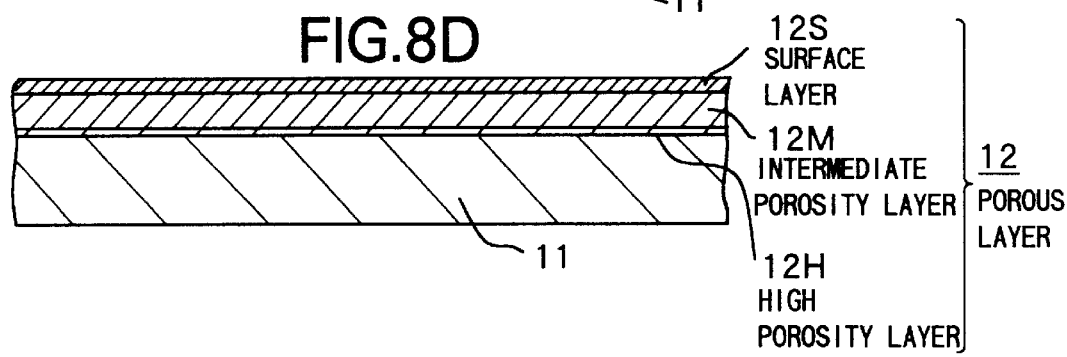
FIG.8E
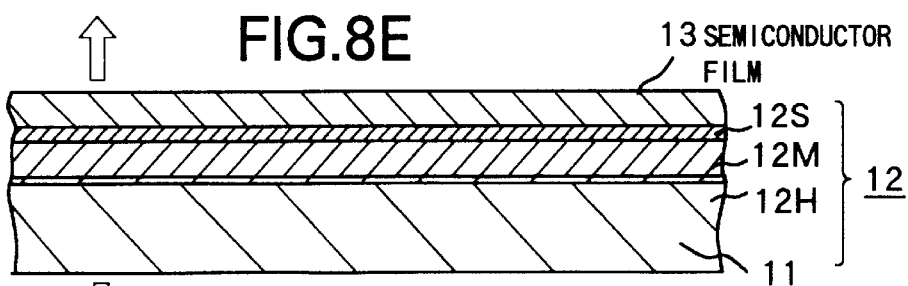
FIG.8F
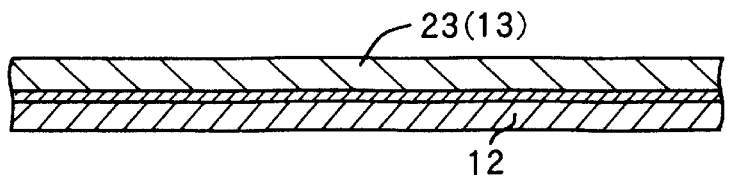
PROCESS DIAGRAM

11 SEMICONDUCTOR SUBSTRATE

12S SURFACE LAYER
11

12S SURFACE LAYER
12M INTERMEDIATE POROSITY LAYER
11

12S
12M
12H HIGH POROSITY LAYER
12M
11

12 POROUS LAYER

PROCESS DIAGRAM (FIRST)

FIG.10A
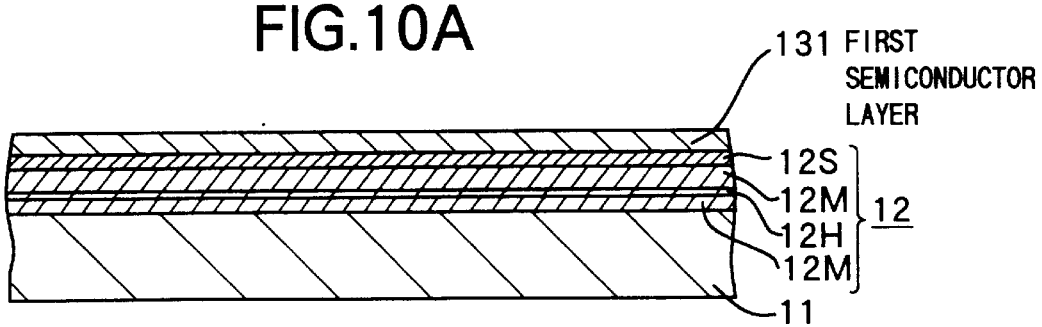
FIG.10B
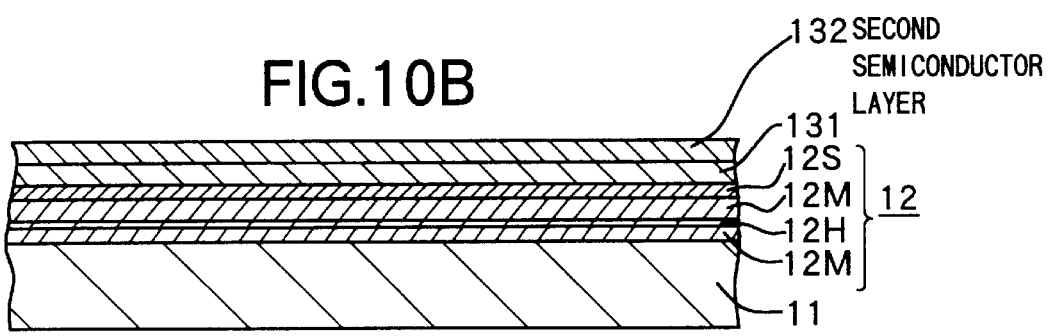
FIG.10C
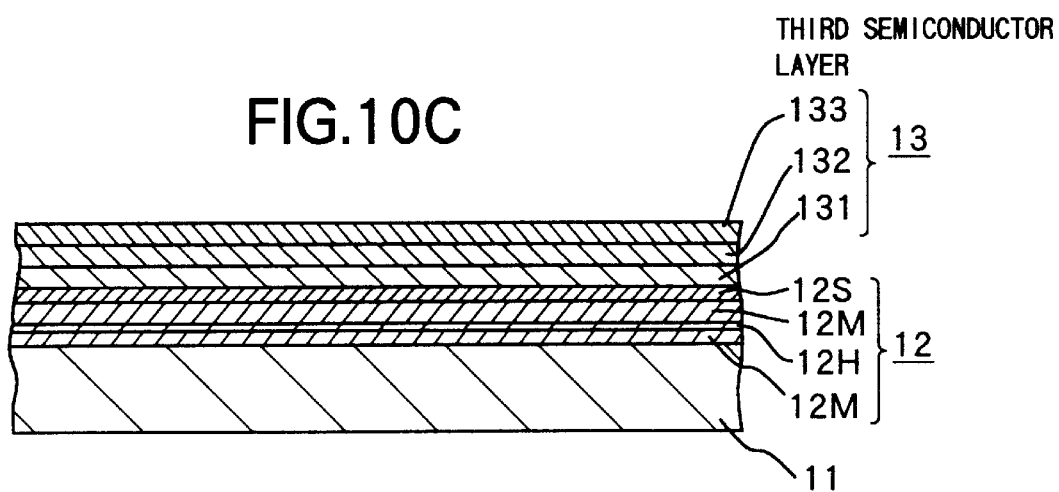
FIG.10D
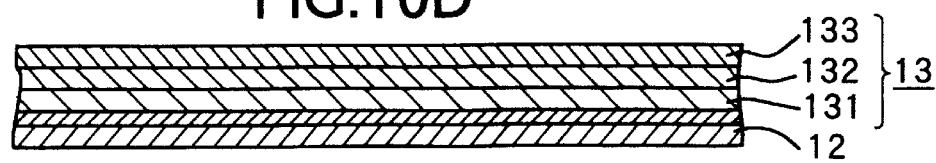
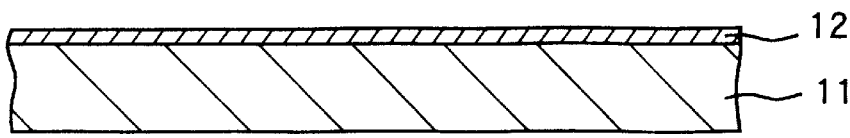
PROCESS DIAGRAM (SECOND)

PROCESS DIAGRAM (SECOND)

PROCESS DIAGRAM (THIRD)

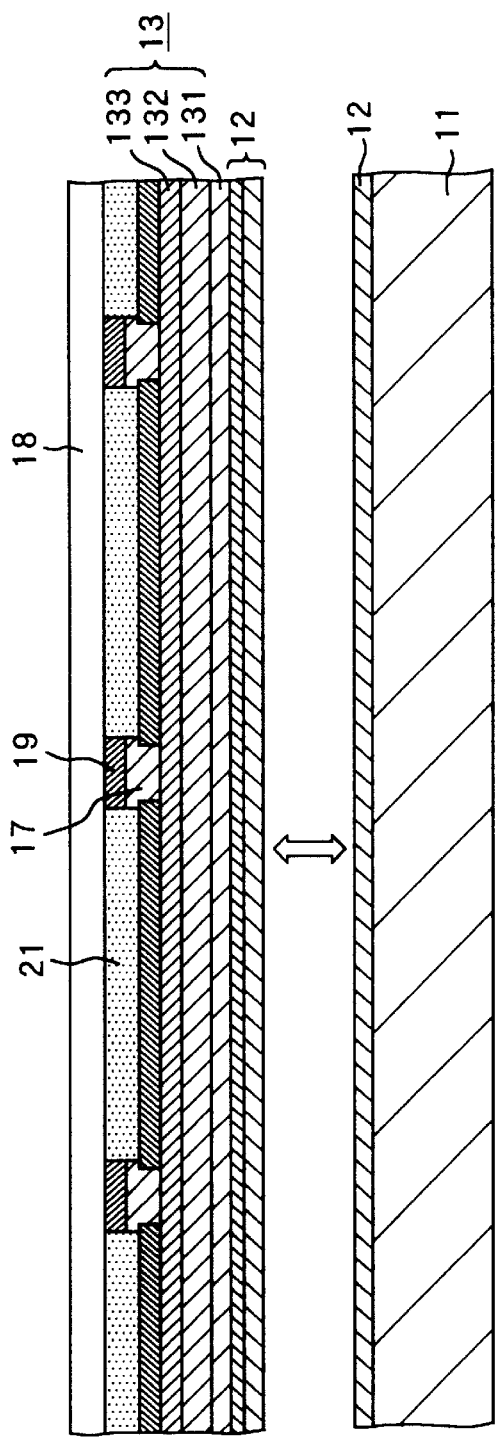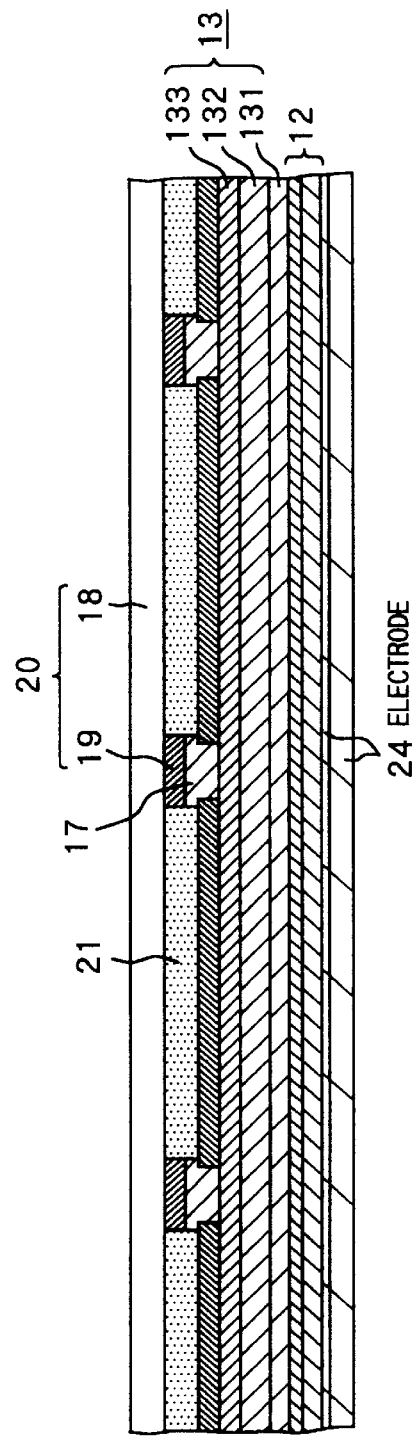
FIG.14A
FIG.14B PROCESS DIAGRAM (FOURTH)

PROCESS DIAGRAM (FIRST)

PROCESS DIAGRAM (SECOND)

PROCESS DIAGRAM

PROCESS DIAGRAM

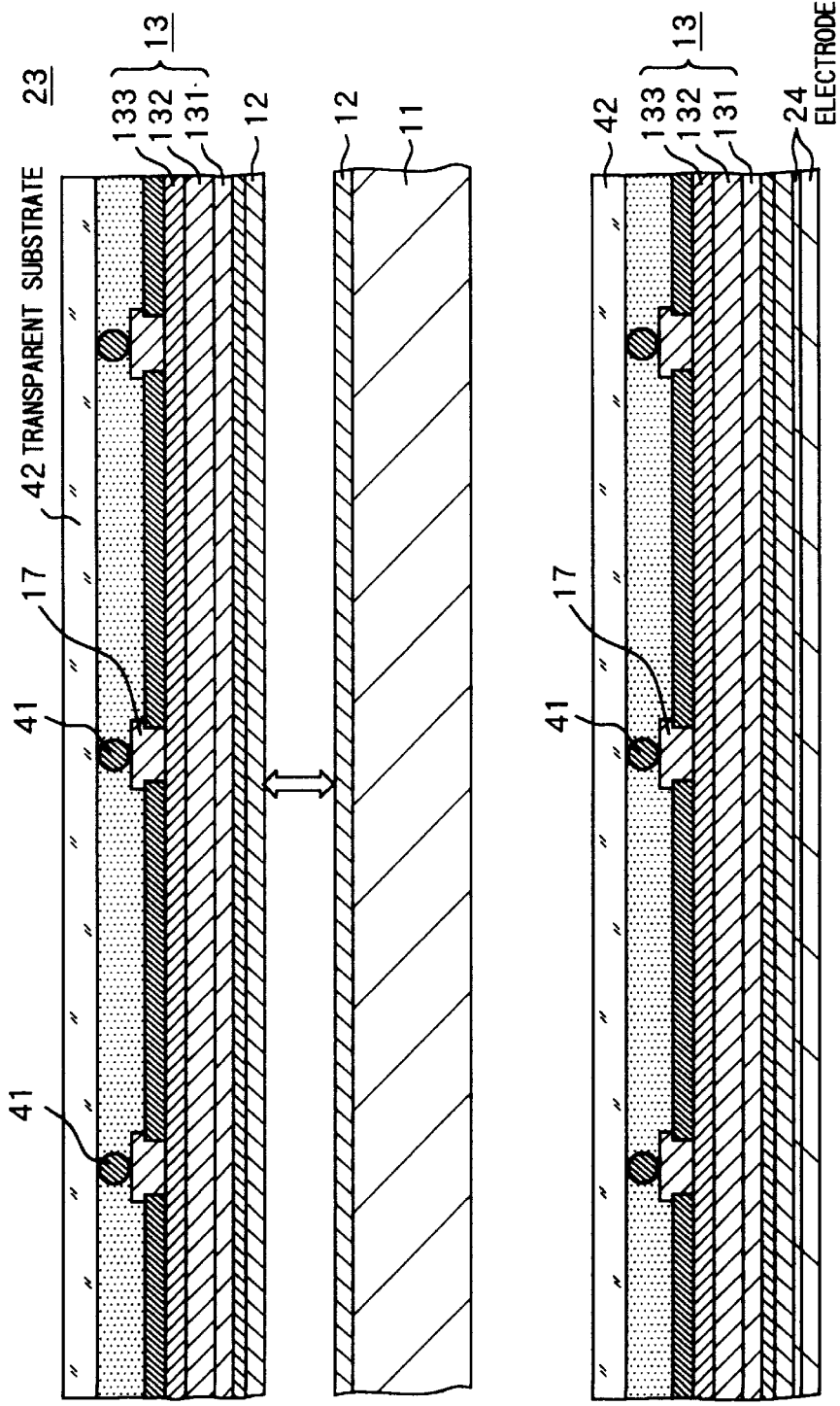

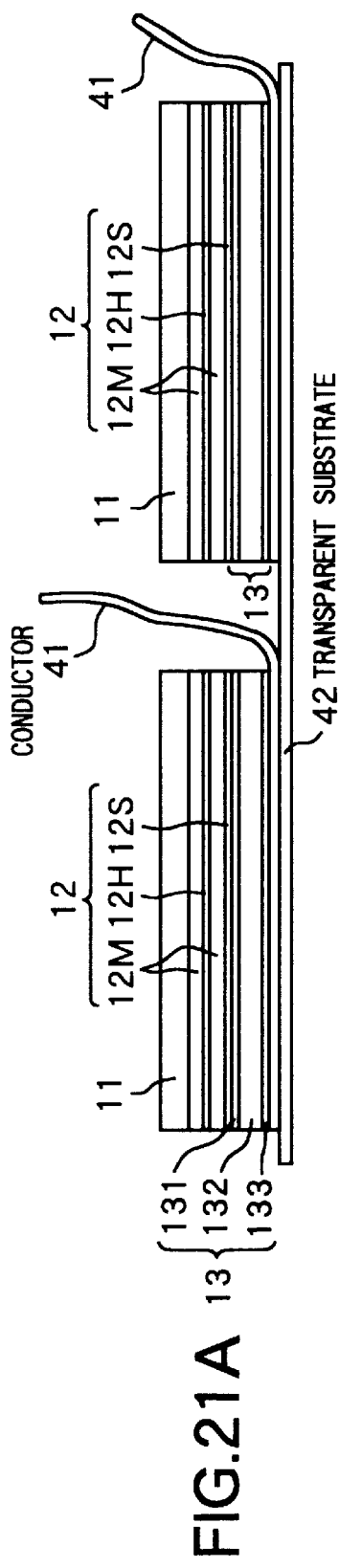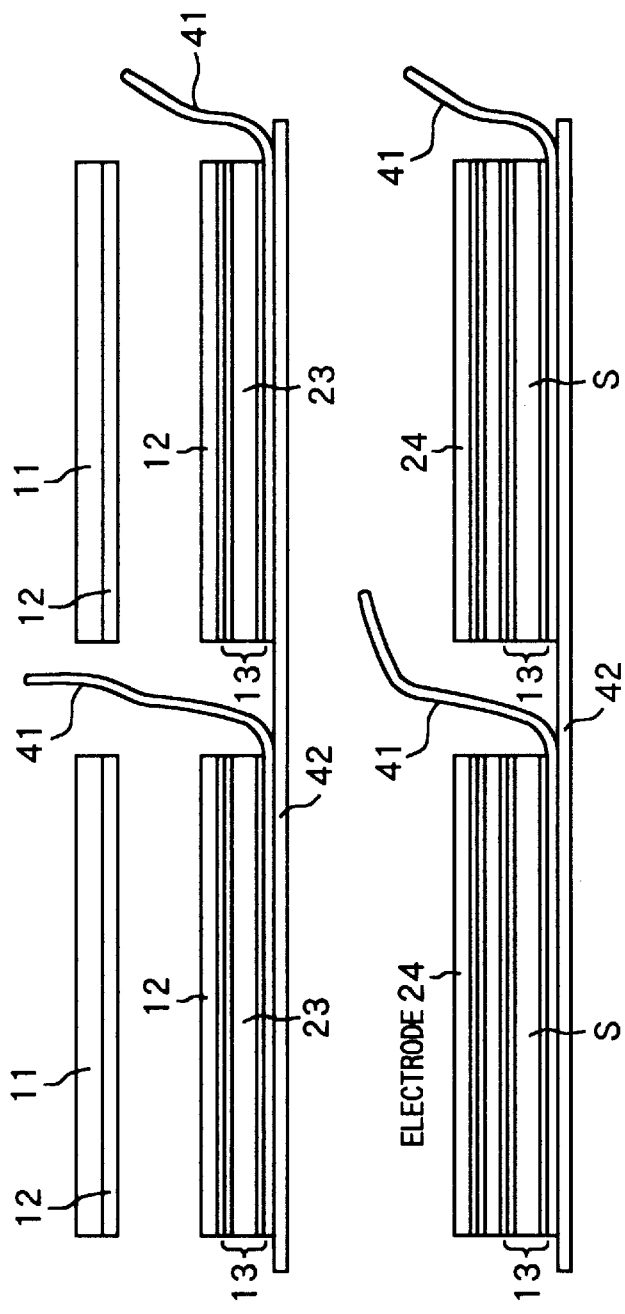
FIG.21A
FIG.21B
FIG.21C

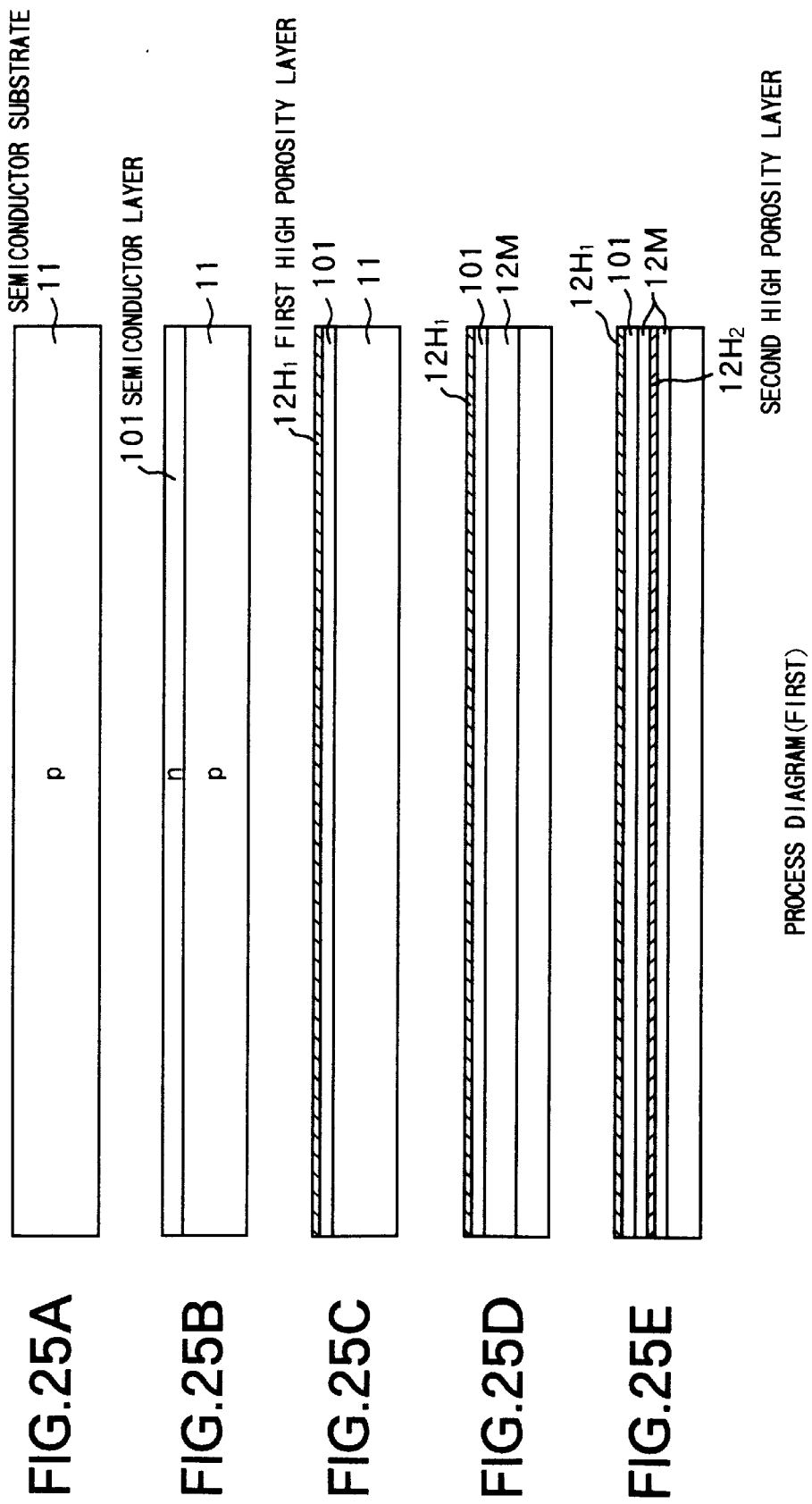

PROCESS DIAGRAM (SECOND)

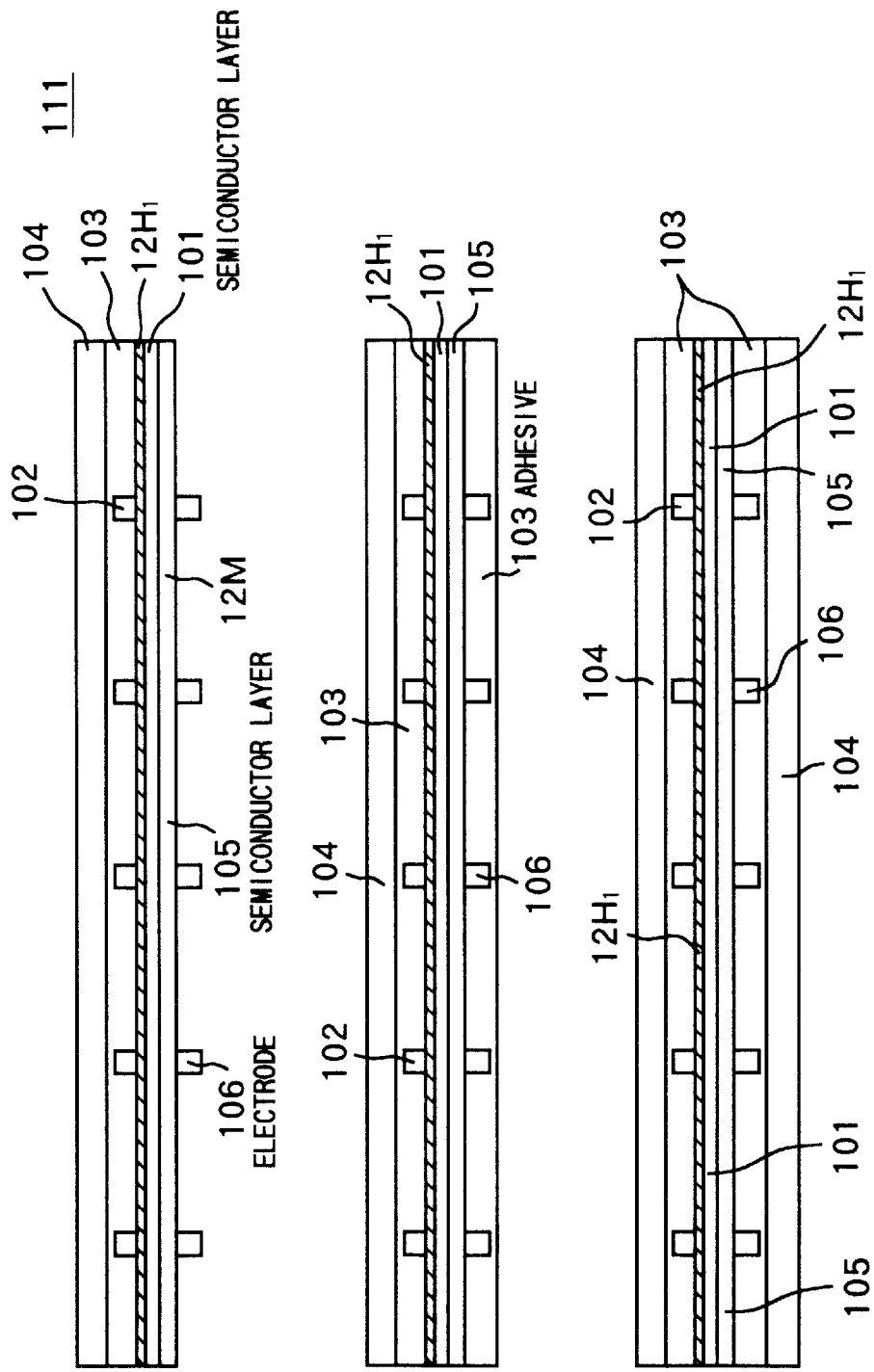

_6,107,213_

METHOD FOR MAKING THIN FILM SEMICONDUCTOR

CROSS-REFERENCE TO RELATED APPLICATION

This application is a Continuation-In-Part of commonly assigned U.S. patent application Ser. No. 08/595,382, filed Feb. 1, 1996 now U.S. Pat. No. 5,811,348.

BACKGROUND OF THE INVENTION

The present invention relates to a process for producing a thin film semiconductor, a solar cell, and a light emitting diode. More particularly, it relates to a method for forming a semiconductor film layer on a substrate having a plurality of porous layers defined therein having controlled and differing relative porosities.

As the material of the solar cell, various materials have been studied. Silicon, for which there are abundant reserves and which is free from apprehension of pollution, is the center of these efforts. Ninety percent or more of the amount of production of solar cells in the world are silicon solar cells as well. The tasks in solar cells are how to achieve a low cost, a high efficiency of conversion of light to electricity, a high reliability, and a small number of years for energy recovery. For the requests for high conversion efficiency and high reliability, single crystal silicon is most suitable, but it is difficult to fabricate single crystal silicon at a low cost. Therefore, at present, in the field of solar cells, particularly solar cells having a large surface area, active research and development is proceeding on solar cells using thin film polycrystalline silicon or thin film amorphous silicon.

In a thin film polycrystalline Si solar cell, the purity of the silicon is raised by refining techniques from metal class silicon using plasma or the like. An ingot is prepared by a casting process, and a wafer is prepared by a multi-wire or other high speed slicing technology. However, process for removing the boron and phosphorus from the metal class silicon, the preparation of an ingot of a good quality crystal by a casting process, enlargement of the surface area of the wafer, and a multi-wire or other high speed slicing technology require a very high grade of technology, so a substrate which is sufficiently cheap and has a good quality has not yet been fabricated at present. Further, the film thickness of the wafer is approximately 200 μm, therefore a flexible substrate cannot be formed.

Amorphous silicon can be formed on the surface of a plastic substrate by a CVD (chemical vapor deposition) process. Therefore, it is possible to form flexible thin film amorphous silicon. As a result, solar cells having a wide range of applications can be formed. However, there are drawbacks in that the conversion efficiency is lower than that of the polycrystalline silicon and single crystal silicon, and the conversion efficiency deteriorates during use.

Single crystal silicon offers the promise of a high conversion efficiency and a high reliability. Thin film single crystal silicon can be fabricated by the SOI (Silicon On Insulator) technique, which is a manufacturing technique of integrated circuits etc., but the productivity is low. Using the SOI technique, the manufacturing cost becomes considerably high, this is a problem in application to a low cost solar cell. Further, the processing temperature in the preparation of single crystal silicon is relatively high, so it is difficult to form this on a plastic substrate or glass substrate having a low heat resistance. Since it is difficult to form single crystal silicon on a plastic substrate, the manufacture of flexible thin film single crystal silicon is difficult.

When constructing window glass equipped with solar cells, in other words, solar cells are arranged on a surface of a window glass, solar cars with solar cells arranged on the roof, etc., the use of a flexible solar cell is desirable from the viewpoint of the simplification of the manufacture and the ease of rational arrangement for enlarging the light receiving surface. Nevertheless, the only semiconductor silicon which can be used to make the flexible solar cells at the present time is amorphous silicon.

SUMMARY OF THE INVENTION

The present invention provides a method for making a thin film semiconductor with which a thin film semiconductor, for example, thin film single crystal silicon, can be reliably produced on a mass production basis. Therefore, a reduction of cost can be achieved and processes for producing a solar cell and a light emitting diode with which a solar cell having a high opto-electric conversion efficiency can be reliably and easily produced at a low cost.

In an embodiment, the present invention provides a process for producing a solar cell with which the terminal of the solar cell can be easily and reliably led outside with a low resistance.

In an embodiment, a new and improved method for making a thin film semiconductor is provided comprising the steps of providing a semiconductor substrate having a surface. The surface portion of the substrate is treated in at least one anodization process to define a plurality of porous layers having varying degrees of porosity adjacent the surface. In a preferred embodiment, the substrate is anodized in a first anodization step at a first current density to provide a first porous layer adjacent the surface having a first porosity. A second anodization step is performed at a second, higher current density to provide a second porous layer adjacent the first porous layer opposite the surface having a porosity greater than the first porosity. The difference in porosity between the first porous layer and the second porous layer provides an inherent line or zone of relative weakness located in the second porous layer or at or adjacent to the interface between the first porous layer and the second porous layer. The line of weakness or fragility introduced by the strain caused by the difference in the lattice constants of the adjacent porous layers permits separation of the surface layer and any film grown thereon from the remainder of the second porous layer and the substrate. In an especially preferred embodiment, a third anodization step at a third higher current density is performed to define third porous layer having a third porosity higher then the second porosity. The third porous layer is disposed within the second porous layer or adjacent to the second porous layer. In accordance with this embodiment, a relative line of weakness is defined by the third porous layer or at or adjacent an interface formed between the third porous layer and the second porous layer. After a plurality of porous layers are defined adjacent the surface of the substrate, at least one semiconductor film layer is formed on the first porous layer and surface. Thereafter, the semiconductor film is separated from the semiconductor substrate along the line of relative weakness to provide a thin film semiconductor product.

According to the present invention, a thin film semiconductor is prepared by a changing a surface of a semiconductor substrate to form a porous structure comprising two or more porous layers having different porosities; growing a semiconductor film on the surface of the porous structure; and separating, removing and/or peeling the semiconductor film from the semiconductor substrate in a controlled or directed manner along the line of weakness created in the porous structure layers.

Further, in the process for producing a solar cell according to the present invention, a solar cell is produced by method comprising the steps of changing the surface of a semiconductor substrate to form a porous structure comprising two or more porous layers having different porosities; epitaxially growing a semiconductor film comprising multiple layers constituting the solar cell on the surface of this porous layer; and peeling or otherwise separating the multi-layer epitaxial semiconductor film from the semiconductor substrate along a line of weakness defined in the porous structure layers.

Furthermore, in a process for producing a light emitting diode according to the present invention, the light emitting diode is prepared by a method comprising the steps of changing the surface of a semiconductor substrate to form a porous structure layer comprising two or more porous layers including a first porous layer constituting a light emitting portion and a second porous separation layer, having a higher porosity, disposed beneath the light emitting portion and thereafter, peeling or separating the light emitting portion from the semiconductor substrate along the line of weakness defined in the separation layer of the porous structure.

As mentioned above, according to the process of the present invention, the semiconductor substrate surface per se is changed to form the porous layer, a semiconductor film is formed on the substrate by epitaxial growth, and this semiconductor film is peeled from the semiconductor substrate by breakage in the porous layer or at an interface with the porous layer, thereby the intended thin film semiconductor or solar cell is obtained. Accordingly, the epitaxially grown semiconductor film can be formed with any sufficiently thin thickness. Further, the peeling of the thin film semiconductor from the substrate can be reliably carried out by appropriately selecting the strength of the porous layer, for example, by the selecting the porosity in the porous layer. As described above, according to the present invention, a thin film semiconductor can be obtained with any sufficiently thin thickness with a good yield. Further, in the production of solar cells, a solar cell having a sufficiently high optoelectric conversion efficiency can be formed for the reasons that the active portion to be constituted by this epitaxial film can be constituted sufficiently thin and it can be formed by the single crystal thin film semiconductor layer, which is epitaxially grown. Further, since it is now possible to provide a flexible structure, various applications, for example, applications for window glass equipped with solar cells, solar car, etc. become easier to produce.

Further, in the light emitting diode embodiment according to the present invention, a superlattice structure can be formed by the porous layers having different porosities and therefore an improvement of the light emitting efficiency can be achieved.

Other objects and advantages of the present invention will become apparent from the following Detailed Description of the Preferred Embodiments taken in conjunction with the drawings, in which:

BRIEF DESCRIPTION OF THE DRAWINGS

FIGS. 2(a)–2(c) are cross-sectional views illustrating the sequence of steps for forming a porous structure on a semiconductor substrate in accordance with an embodiment of the method of the present invention;

FIGS. 4(a)–4(d) are cross-sectional views illustrating the steps for forming a second porous structure in accordance with an alternate embodiment;

FIGS. 5(a)–5(b) are cross-sectional views illustrating the steps of growing a semiconductor film on the porous structure of FIGS. 4(a)–4(d) and separating the semiconductor film from the semiconductor substrate;

FIGS. 8(a)–8(f) are cross-sectional views illustrating another embodiment of the process for forming a multilayer porous structure on a semiconductor substrate, forming a semiconductor film on the porous structure and separating the semiconductor film from the semiconductor substrate;

FIGS. 10(a)–10(d) are cross-sectional views illustrating formation of a multilayer semiconductor film on the porous structure shown in FIGS. 9(a)–9(d) and separating of the multilayer film from the semiconductor substrate;

FIGS. 14(a)–14(b) are cross-sectional views illustrating separation of the created solar panel structure from the semiconductor substrate and attachment of a rear side metal electrode, respectively;

FIGS. 20(a)–20(b) are cross-sectional views illustrating separation of the solar panel structure from the semiconductor substrate and attachment of a back electrode, respectively;

FIGS. 21(a)–21(c) are side elevation views of a plurality of solar panel structures showing the method of the present invention through an intermediate stage of formation;

FIGS. 25(a)–25(e) are cross-sectional views illustrating formation of a hetero junction and porous structure in a semiconductor substrate in accordance with an embodiment of the method for making a light emitting diode of the present invention.

FIGS. 27(a)–27(c) are cross-sectional views illustrating the further steps of attaching a second array of electrodes and a second support substrate in accordance with an embodiment of the invention; and FIG. 28 is a process diagram of another embodiment of the process of the present invention (fourth).

DETAILED DESCRIPTION OF THE PREFERRED EMBODIMENTS

Figure 1:
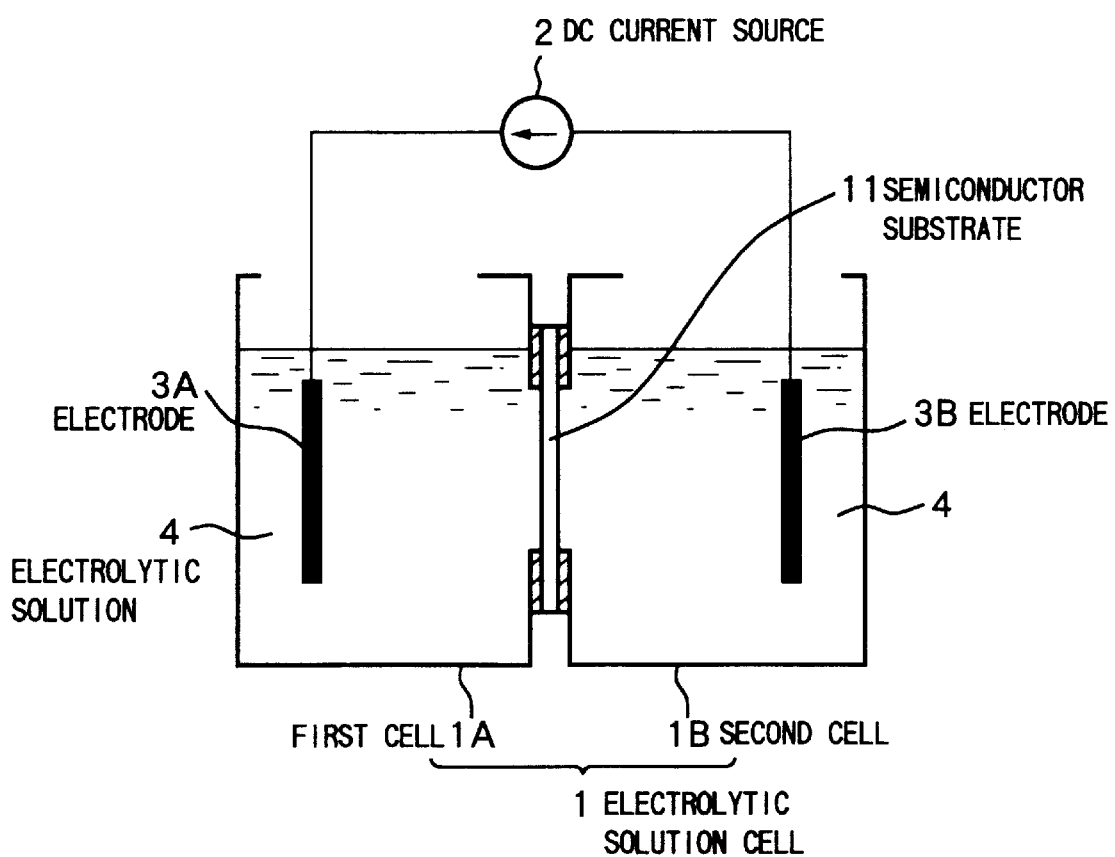
FIG. 1 is a schematic side elevation view of an example of an anodizing device for working the present invention.

In accordance with an embodiment of the present invention, the surface of a semiconductor substrate may be changed by anodization to form a porous structure comprising two or more porous layers, each having different porosities. Then, a semiconductor film is epitaxially grown on the surface of this porous layer. Thereafter, this epitaxial semiconductor film is peeled or separated from the semiconductor substrate along a line of weakness formed in the porous structure to produce the intended thin film semiconductor.

On the other hand, the remaining semiconductor substrate may be repeatedly used for the production of the above thin film semiconductor. Further, this semiconductor substrate per se, which becomes thin due to the repeated use, can be used as the thin film semiconductor.

In the step of forming the porous layer, a low porosity layer is formed in the surface of the substrate. Thereafter, a high porosity layer is formed beneath an interface (in the present specification, the interface of the semiconductor substrate means an interface between the semiconductor substrate, which is not made porous, and the porous layer) between the low porosity layer and the semiconductor substrate.

Further, in the step for forming the porous layer, for example, a low porosity layer in the surface of the substrate, an intermediate porosity layer formed beneath the low porosity layer, having a higher porosity than that of the surface layer, and a high porosity layer formed in this intermediate porosity layer or beneath the inter-mediate porosity layer, having a higher porosity than that of the intermediate porosity layer can be formed.

The porous layer can be formed by anodization. This anodization process comprises at least two or more steps conducted with different current densities. Accordingly, in the anodization process, a step for anodizing the surface of the semiconductor substrate with a lower current density and a step for anodizing the same with a higher current density thereafter are adopted.

For example, in the anodization, it is possible to adopt a step for anodizing the surface of the semiconductor substrate with a low current density; a step for further anodizing the same with an intermediate low current density slightly higher than this low current density; and a step for further anodizing the same with a higher current density than this.

Further, in the anodization with a high current density, it is possible to intermittently pass a current with a high current density.

Further, in the anodization with the intermediate low current density, the current density thereof can be gradually increased.

Further, the anodization can be performed in an electrolytic solution containing hydrogen fluoride and ethanol or in an electrolytic solution containing hydrogen fluoride and methanol.

Further, in the anodizing step, the composition of the electrolytic solution can be changed when the current density is changed.

After forming the porous layer, the layer is preferably heated in a hydrogen gas atmosphere. Further, after forming the porous layer and before the heating step in the hydrogen gas atmosphere, preferably the porous layer is thermally oxidized.

Various shapes of the semiconductor substrate can be used for the present invention. For example, it can be shaped as a wafer, that is, a disk, or a column-like ingot having a curved surface obtained from a pulling up of a single crystal.

The semiconductor substrate can be constituted by various semiconductor substrates such as a single crystal substrate of silicon Si, an Si polycrystalline substrate in certain cases, or a compound semiconductor substrate, for example, a GaAs single crystal. A Si single crystal substrate is preferably used for the production of an Si single crystal thin film and a solar cell by an Si single crystal thin film.

Further, an n-type or a p-type impurity-doped semiconductor substrate or an intrinsic semiconductor substrate can be used. For anodization of the present invention, a semiconductor substrate having a low resistance doped with a p-type impurity at a high concentration, i.e., a so-called p+-type Si substrate, is desirably used. As a p+-type Si substrate, an Si substrate, in which boron, B, a p-type impurity, is doped to about $10^{19}$ atoms/cm and having a resistance thereof of about 0.01 to 0.02 $\Omega$cm, can be used. When the p+-type Si substrate is anodized, thin and long fine pores, extending in a vertical direction generally perpendicular to the surface of the substrate, are formed. In the anodization process, the substrate is changed to form a porous layer while maintaining its crystallinity, therefore a desirable porous layer is formed.

As mentioned above, the semiconductor film is epitaxially grown on the porous layer while maintaining its crystallinity.

Due to this, it is possible to constitute the single crystal semiconductor film. Further, when constructing a solar cell or other devices, the grown semiconductor film may comprise a multi-layer semiconductor film.

According to the present invention, the semiconductor film epitaxially grown on the porous layer is separated from the semiconductor substrate through a directed fracture of the porous layer. Prior to peeling or separation, a support substrate comprised, for example, a flexible plastic sheet can be bonded onto the semiconductor film as a support substrate. The semiconductor film can be peeled from the semiconductor substrate together with the support substrate via the porous layer formed on this semiconductor substrate.

This support substrate is not limited to a flexible sheet. For the support substrate, it is possible to use a glass substrate, a resin substrate, or a flexible or rigid transparent printed circuit board to which desired printed interconnections are applied.

In the surface of the semiconductor substrate, two or more porous layers having different porosities are formed. The first porous layer of the outermost surface is preferably formed as a dense porous layer which has a relatively small porosity to provide improved growth of an epitaxial semiconductor film on this porous layer. By forming a second porous layer having a relatively high porosity spaced inwardly, adjacent to the surface of the substrate and first porous layer, the mechanical strength falls due to the high porosity of the second layer itself, or expressed differently, the bond between the first and second porous layers becomes fragile due to the strain caused by the difference of the lattice constants of each of these layers. Due to this, the peeling of the epitaxial semiconductor film, that is, separation, can be easily carried out via the high porosity layer. For example, it becomes also possible to form a porous layer which is so weak that it can be separated by ultrasonic irradiation and excitation of the substrate.

The high porosity layer formed is easier to peel because of the larger the porosity thereof, but if this porosity is too large, breakage in the high porosity layer may occur before the peeling step of the semiconductor film on the porous layer. Therefore, the porosity in this high porosity layer is preferably made 40 percent to 70 percent.

Further, with the increasing of the porosity, the strain becomes large. If the influence of this strain becomes larger in the surface layer of the first porous layer, cracks may occur in the surface layer. Further, if the influence of the strain reaches up to the surface of the porous layer, crystal defects may be caused in the semiconductor film epitaxially grown on the porous layer. Therefore, in the porous layer, an intermediate porosity layer, having an intermediate porosity which is higher than that of the surface layer, but lower than that of the high porosity layer, is preferably formed between the high porosity layer and the surface layer. In this case, the intermediate porosity layer can be a buffer layer for relieving the strain. Accordingly, the porosity of the high porosity layer can be made large enough so that the peeling of the epitaxial semiconductor film can be reliably carried out. Additionally, an epitaxial semiconductor film which is excellent in crystallinity, can be formed on the porous layer.

The anodization, for changing the surface of the semiconductor substrate to form a porous layer, can be performed by a well known method. For example, a double cell method shown in Ito et al., "Surface Technology", vol. 46, no. 5, pp. 8 to 13, 1995 (Anodization of Porous Si) is applicable. A schematic structural view shown in FIG. 1 is used for the double cell method. In this method, an electrolytic solution cell 1 having a first and second cells 1A and 1B is used. The semiconductor substrate 11, on which the porous layer is to be formed, is arranged between the two cells 1A and 1B. Two platinum electrodes 3A and 3B connected to a DC current source 2 are arranged between the first and second cells 1A and 1B. In the first and second cells 1A and 1B, an electrolytic solution 4 contains, for example, hydrogen fluoride HF and ethanol $C_2H_5OH$ or hydrogen fluoride HF and methanol $CH_3OH$. The semiconductor substrate 11 is arranged so that its two surfaces are in contact with the electrolytic solution 4 in the first and second cells 1A and 1B. The two platinum electrodes 3A and 3B are arranged immersed in the electrolytic solution 4. Then, a current is supplied between the two electrodes 3A and 3B by the DC current source 2 using the electrode 3A as a cathode. The current is supplied so as the surface of the semiconductor substrate 11 facing the electrode 3A is corroded and becomes porous.

According to this double cell method, it is unnecessary to coat an ohmic electrode on the semiconductor substrate and introduction of the impurities into the semiconductor substrate from this ohmic electrode is avoided.

The structure of the porous layer can be changed by selecting the conditions in the anodization process, whereby the crystallinity of the semiconductor film, to be formed, on the porous layer and the peeling property change.

In the process of the present invention, as mentioned above, a porous layer comprising two or more layers having different porosities is formed. In this case, a multi-step anodizing method comprising two or more steps conducted by different current densities is used. More specifically, to prepare a relatively dense, low porosity layer having small fine pores in the surface of the semiconductor substrate, the first anodization step is applied with a lower current density. The film thickness of the porous layer is proportional to the current supply time, therefore, in this step, the anodization time is selected to form a desired film thickness. Thereafter, second anodization is carried out with a higher current density so as to form a high porosity layer beneath the low porosity layer formed. As a result, a porous layer comprising at least a low porosity layer having a lower porosity and a high porosity layer having a higher porosity is formed.

In this case, a large strain may occur near the interface between the low porosity layer and the high porosity layer due to the difference of the lattice constants. When this strain reaches a certain value or more, the porous layers separate into two. Accordingly, by form-ing the porous layers under anodizing conditions below and near the critical condition which causes the separation due to the strain or the lowering of the mechanical strength, the semiconductor film epitaxially grown on a porous layer can be easily separated via the porous layer.

The first anodization step can be carried out with the lower current density of about 0.5 to 10 $mA/cm^2$ for a period of about 1 to about 60 minutes, preferably 2 to 20 minutes, by using a p-type silicon single crystal substrate of 0.01 to 0.02 $\Omega$cm and a ratio of HF (49% solution) and C2H5OH (95% solution) of 1:1 (volume ratio) (hereinafter, HF and C2H5OH indicates the volume ratio in the 49% solution and 95% solution, respectively). Further, the second anodization can be carried out with a higher current density of about 40 to 300 $mA/cm^2$ for a period of about 1 to 10 seconds, preferably a time of approximately 3 seconds.

In the first and second anodization steps, the strain caused in the high porosity layer may become considerably large, therefore the influence of this strain may reach up to the low porosity layer. In this case, as mentioned above, the crystal defects may be introduced in the epitaxial semiconductor film formed on the porous layer. Therefore, in the porous layer, an intermediate porosity layer, having a higher porosity than the surface layer, but a lower porosity than that of the high porosity layer, is preferably formed between the low porosity layer and the high porosity layer, as a buffer layer for relieving the strain generated by them. More specifically, a first anodization with a lower current density is carried out at first, a second anodization of a slightly higher cur-rent density than that in the first anodization is carried out, and then a third anodization is carried out with a considerably higher current density than them. The conditions of the first anodization are not particularly limited, but when a p-type silicon single crystal substrate of 0.01 to 0.02 Ωcm is used and an electrolytic solution of $HF:C_2H_5OH=1:1$ is used as the electrolytic solution, preferably the first, second and third anodization can be carried out with a current density of about 0.5 to 3 mA/cm2, 3 to 20 mA/cm2, and 40 to 300 mA/cm2, respectively. For example, when the anodization is carried out with a current density of 1 mA/cm2, 7 mA/cm2, and 200 mA/cm2, the porosity becomes about 16%; 26% and 60 to 70%, respectively. According to the above mentioned method, the semiconductor layer having good crystallinity can be epitaxially grown on the porous layer.

Further, in the anodization process, the intermediate porosity layer can be formed beneath the low porosity layer while the porosity of the low porosity layer is held as it is. Accordingly, the porous layer becomes a two-layer structure of the low porosity layer and the intermediate porosity layer. Further, in the third anodization step, if the current density is selected about 90 mA/cm2 or more, a high porosity layer is formed within the intermediate porosity layer, though the principle is not clear.

Further, in the step forming the intermediate porosity layer, by changing the current density gradually or stepwise, an intermediate porosity layer, with a porosity which rises gradually or stepwise from the low porosity layer toward the high porosity layer, is formed between the low porosity surface layer and the high porosity layer. As a result, the strain between the low porosity layer and the high porosity layer is relieved more and an epitaxial semiconductor film having a good crystallinity can be further reliably formed on the porous layer.

The separation will occur by a large strain caused by the different lattice constants at the interface between the peeling layer (separation layer) of the high porosity layer and a buffer layer of the intermediate porosity layer. If some special action is taken in third anodization step, the separation becomes even easier. This is obtained by applying the current intermittently in the third anodization step with the higher current density, for example, not supplying the current continuously for 3 seconds, but by the alternative steps comprising supplying current for 1 second and then stopping the current for a predetermined time, for example, about 1 minute. By intermittently supplying current in discrete steps, the high porosity layer, as the separation layer, can be formed beneath the intermediate porosity layer. In this case, the porous layer, remaining with the semiconductor layer after separation, can be removed by the electrolytic grinding or other chemical or mechanical etching methods.

As mentioned above, by forming the high porosity layer beneath the intermediate layer, a distance between the high porosity layer, in which the strain occurs, and the surface of the porous layer is larger and the buffering effect by the intermediate porosity layer becomes larger, thus a semiconductor film having a good crystallinity can be formed.

Further, when the high porosity layer is formed beneath the intermediate porosity layer, the thickness of the entire porous layer can be reduced, and the thickness of the semiconductor substrate consumed for forming this porous layer can be reduced, and the number of times of repeated use of this semiconductor substrate can be made larger.

Accordingly, by the selection of the anodization conditions, it is possible to introduce a large strain in the separation layer and in addition, to keep the influence of this strain from reaching the epitaxially grown surface of the semiconductor film.

In order to perform the epitaxial growth of the semiconductor on the porous layer with a good crystallinity, it is desired to form the surface of the porous layer with the small fine pores, which serve as the seeds of the crystal growth on the porous layer. To make the small fine pores, a high HF concentration electrolytic solution can be used. In this case, in the low current anodization step for forming the low porosity layer, an electrolytic solution having a high HF concentration is used. Next, the intermediate porosity layer which serves as the buffer layer is formed, then the HF concentration of the electrolytic solution is lowered and the anodization with a high current density is finally carried out. By this process, it is possible to make the size of the fine pores of the surface layer very small, whereby an epitaxial semiconductor film having a good crystallinity can be formed on the porous layer. In addition, in the high porosity layer, the porosity can be raised to a necessary sufficiently high level, so the peeling of the epitaxial semiconductor film can be carried out well.

Regarding the change of the electrolytic solution in the anodization process, in the first step forming the surface low porosity layer, the anodization is carried out using an electrolytic solution of, for example, $HF:C_2H_5OH=2:1$; in the second step forming the intermediate porosity layer serving as the buffer layer, the anodization is carried out using an electrolytic solution of a slightly low HF concentration, for example, $HF:C_2H_5OH=1:1$; and further, in the third step forming the high porosity layer, the anodization with a high current density is carried out using an electrolytic solution with a reduced HF concentration of, for example, $HF:C_2H_5OH=1:1$ to 1:2.

In the anodization process, when changing the current density in the period from the first step to second step, the current supply can be stopped before the second step. Or after the first step, the second step can be conducted without interruption of the current supply.

Further, the anodization process can be conducted in a dark place where the light is blocked, to make the unevenness of the surface of the porous layer smaller and raise the crystallinity of the semiconductor film epitaxially grown on the porous layer.

Additionally, the anodized porous layer of silicon can be utilized as a light emitting diode. In this case, the anodization is preferably carried out while irradiating light to rise the light emitting efficiency. Further, oxidizing the anodized porous layer, a blue shift of the wavelength of emitted light occurs. Further, the semiconductor substrate, which may be p-type or n-type, preferably has a high resistance so as not to introduce the impurities.

Employing the above mentioned process, a semiconductor substrate formed on the surface (one surface or both surfaces) of the porous layer can be obtained. Further, the thickness of the entire porous layer is not particularly limited, but the thickness can be made 1 to 50 μm, preferably 3 to 15 μm, usually about 8 μm. The thickness of the entire porous layer is preferably reduced as much as possible so that the semiconductor substrate may be repeatedly used as much as possible.

Additionally, the porous layer is preferably annealed preceding the epitaxial growth of the semiconductor on the porous layer. This annealing can be a hydrogen annealing which can be conducted by a heat treatment in a hydrogen gas atmosphere. By the hydrogen annealing, the natural oxidized film formed on the surface of the porous layer can be completely removed and the oxygen atoms in the porous layer can be removed as much as possible. As a result, the surface of the porous layer becomes smooth, and an epitaxial semiconductor film having a good crystallinity can be formed. Simultaneously, by this annealing, the strength of the interface between the high porosity layer and the intermediate porosity layer can be further weakened, and the separation of the epitaxial semiconductor film from the substrate can be more easily carried out. This hydrogen annealing can be carried out in a temperature range of from about 950° C. to 1150° C.

Further, oxidizing the porous layer at a low temperature before the hydrogen annealing, the internal portion of the porous layer is oxidized. Due to this no large structural change will occur in the porous layer even if the heat treatment in the hydrogen gas atmosphere is applied. Accordingly, the strain between the high porosity and intermediate porosity layers is isolated in an area remote or separate from the surface of the first porous layer, and an epitaxial semiconductor film having a good crystallinity can be formed. In this case, the low temperature oxidation can be carried out in a dry oxidation atmosphere at 400° C. for about 1 hour.

After the hydrogen annealing, as mentioned above, a semiconductor can be epitaxially grown on the surface of the porous layer. In the epitaxial growth of this semiconductor, the porous layer formed in the surface of the single crystal semiconductor substrate maintains its crystallinity although it is porous. Therefore, the epitaxial growth on this porous layer is possible. The epitaxial growth on the surface of this porous layer can be carried out by a CVD process at a temperature of, for example, 700° C. to 1100° C.

Further, in both of the hydrogen annealing and the epitaxial growth of the semiconductor, as the method of heating the semiconductor substrate to the predetermined temperature, the so-called susceptance heating system or the conduction heating system directly supplying a current through the semiconductor substrate per se for heating can be adopted.

The above-mentioned semiconductor film epitaxially grown on the porous layer can be a single layer semiconductor film or multi-layer semiconductor film by lamination of a plurality of semiconductor layers. Further, this semiconductor film can be the same substance as that for the semiconductor substrate or different substances. As the semiconductor film, various types of the semiconductor film or films can be used. For example, a single crystal Si semiconductor film, a compound semiconductor of GaAs etc., a Si compound, for example $Si_{1-y}Ge_y$, or films suitably combined and stacked the same can be used.

Further, in a case the semiconductor film is a compound semiconductor, a compound semiconductor substrate can be used as the semiconductor substrate. In this case, by anodizing the compound semiconductor substrate, the compound semiconductor film can be formed on the porous layer. When a compound semiconductor is epitaxially grown on the porous layer made of the compound semiconductor, the lattice mismatch can be reduced in comparison with the case where the compound semiconductor is epitaxially grown on a Si semiconductor substrate, and therefore a thin film compound semiconductor having a good crystallinity can be formed.

Further, n-type or p-type impurities can be introduced into the semiconductor film formed on the porous layer at the time of the epitaxial growth thereof. Alternatively, it is also possible to introduce the impurities in the entire surface or selectively by an ion implantation, diffusion, etc. after forming the epitaxial semiconductor film. In this case, the conductivity type and the concentration and type of impurities are selected in accordance with the object of use thereof.

Further, the thickness of the epitaxial semiconductor film can be appropriately selected in accordance with the purpose of the thin film semiconductor. For example, when forming a semiconductor integrated circuit on the thin film semiconductor, since the active layer of the semiconductor element has a thickness of about several micrometers, the semiconductor film can be formed to a thickness of for example about 5 μm.

When epitaxially growing a semiconductor film made by single crystal silicon to form the thin film semiconductor solar cell, as the semiconductor film, for example, a $p^+$-type semiconductor layer, a $p^-$-type semiconductor layer, and an $n^+$-type semiconductor layer, in this order on the porous layer can be used. The impurity concentration and the film thickness of these layers are not particularly limited, but for example, preferably, the $p^+$-type semiconductor layer is given a film thickness within a range of from 0 to 1 μm, typically about 0.5 μm, and a boron B. as a p-type impurity, concentration within a range of from $10^{18}$ to $10^{20}$ atoms/cm$^3$, typically about $10^{19}$ atoms/cm$^3$; the p-type semiconductor layer is given a film thickness within a range of from 1 to 30 μm, typically about 5 μm, and a boron concentration within a range of from $10^{14}$ to $10^{17}$ atoms/cm$^3$, typically about $10^{16}$ atoms/cm$^3$; and the $n^+$-type semiconductor layer is given a film thickness within a range of from 0.1 to 1 μm, typically about 0.5 μm, and a concentration of phosphorus, P. or arsenic, As, within a range of from $10^{18}$ to $10^{20}$ atoms/cm$^3$, typically about $10^{19}$ atoms/cm$^3$.

Further, the semiconductor film can be constituted by epitaxial growth of a $p^+$-type Si layer, p-type $Si_{1-x}Ge_x$ graded layer, undoped $Si_{1-y}Ge_y$ layer, n-type $Si_{1-x}Ge_x$ graded layer, and $n^+$-type silicon layer in this order and this used to prepare a double hetero structure solar cell. As typical examples of the layers for constituting this double hetero structure, preferably, for the $p^+$-type Si layer, the impurity concentration is about $10^{19}$ atoms/cm$^3$ and the film thickness is about 0.5 μm; for the p-type $Si_{1-x}Ge_x$ graded layer, the impurity concentration is about $10^{16}$ atoms/cm$^3$ and the film thickness is about 1 μm; for the undoped $Si_{1-y}Ge_y$ layer, y is 0.7 and the film thickness is about 1 μm; for the n-type $Si_{1-x}Ge_x$ graded layer, the impurity concentration is about $10^{16}$ atoms/cm$^3$ and the film thickness is about 1 μm; and for the $n^+$-type Si layer, the impurity concentration is about $10^{10}$ cm$^{-3}$ and the film thickness is about 0.5 μm. Further, the ratio of composition x of Ge in the p-type and n-type $Si_{1-x}Ge_x$ graded layers is preferably gradually increased from x=0 of the layers existing on both sides to y of the undoped $Si_{1-y}Ge_y$. Due to this, the lattice constants match at the interfaces, whereby a good crystallinity can be obtained.

In such a double hetero structure solar cell of, carriers and light can be effectively confined in the undoped $Si_{1-y}Ge_y$ layer, and therefore a high conversion efficiency can be obtained.

Alternatively, the processing for a solar cell can be carried out before the peeling from the semiconductor substrate. In this case, the peeling process will be carried out after the attachment of a support substrate on the semiconductor film formed on the porous layer and the semiconductor film is peeled from the semiconductor substrate together with the support substrate.

The support substrate in the solar cell can be constituted by various substrates for example a glass sheet such as window glass, a metal substrate, a ceramic substrate, or a flexible substrate comprised of a transparent resin film or sheet (hereinafter, simply referred to as a sheet) etc.

Next, the steps for constructing the solar cell will be explained. It is possible to perform these steps after or before peeling the semiconductor film from the semiconductor substrate.

In the process for constructing the solar cell, as mentioned above, multi-layer silicon semiconductor film is epitaxially grown on the semiconductor substrate on the surface of which the porous layer is formed. Next, for example, thermal oxidation processing is carried out to form an oxide film having thickness of about 10 to 200 nm on the surface of the semiconductor film. Then, the oxide film of the surface of the semiconductor film is patterned to form an interconnection layer by the photolithography. Alternatively, it is also possible to form openings at only the portions where connection to the semiconductor film is necessary. Thereafter, for example a conductive layer for constituting the electrode and interconnection layer, for example, a single metal layer such as Al or multiple metal layers formed by lamination of a plurality of metal layers are finally formed on the entire surface by vapor deposition etc. and this is patterned to form the required electrodes and interconnection pattern by the photolithography and the etching. Alternatively, the electrodes and interconnection pattern can be formed by a printing method.

Further, a so-called printed circuit board made of a transparent resin sheet, on which the required electrodes and interconnection pattern, i.e., so-called printed interconnections are formed, is prepared in advance and this printed circuit board is attached on the semiconductor film formed on the porous layer to form the electrical contact at the corresponding parts. At this time, the electrodes of the semiconductor film and the printed circuit are joined by for example solder. Further, parts other than the electrodes can be bonded by using a transparent binder such as an epoxy resin.

In this way, the adhesion of a printed circuit board and thin film single crystal silicon (Si), which had not been possible in the past, can be carried out extremely easily in the present invention. Further, in the present invention, the support substrate is not limited to a printed circuit board—a transparent resin sheet can be adhered as well. After the support substrate such as a printed circuit or a transparent resin sheet is adhered, tensile stress may be applied with the semiconductor substrate, thereby causing destruction in the high porosity layer or at an interface between the high porosity layer and intermediate porous layer or interface between the high porosity layer and the semiconductor substrate, the epitaxial semiconductor film to be easily peeled from the semiconductor substrate the support substrate. In this way, a flexible solar cell, comprised of a thin film semiconductor on the support substrate such as a printed circuit board, can be obtained.

After the peeling process, the porous layer sometimes remains on the back surface of the semiconductor film opposite to the support substrate. In this case, it is possible to remove this porous layer by for example etching. Alternatively, a metal film such as a silver paste used as the other ohmic electrode or the light reflecting film can be formed on this porous layer without removing. This light reflecting surface will improve the opto-electric conversion efficiency. Further, it is also possible to adhere a metal sheet or form a resin layer on the back surface of the semiconductor film as a protective layer.

On the other hand, the semiconductor substrate from which the semiconductor film is peeled may be ground at its surface subjected to a similar operation repeatedly to form a porous layer and solar cells etc. The thickness of the semiconductor substrate can be made for example about 200 to 300 $\mu$m, while the thickness of the semiconductor substrate consumed per preparation of the solar cell is about 3 to 20 $\mu$m, so even the thickness consumed after 10 repeated uses is about 30 to 200 $\mu$m. Therefore, the semiconductor substrate can be sufficiently repeatedly utilized. Accordingly, according to the process of the present invention, an expensive single crystal semiconductor substrate can be repeatedly used, and therefore a solar cell can be produced with a low energy while reducing the costs. Further, the semiconductor substrate made sufficiently thin by this repeated procedure can itself be used to constitute a solar cell.

Next, the embodiments of the present invention will be explained. However, the present invention is not limited to these embodiments. First, an explanation will be made of an embodiment of the process of production of a thin film semiconductor. according to the present invention.

[Embodiment 1]

FIG. 2 and FIG. 3 show process diagrams of this Embodiment 1. First, a wafer-like semiconductor substrate 11 made of a single crystal Si, doped with boron B at a high concentration, having a resistivity of for example 0.01 to 0.02 $\Omega$cm was prepared (FIG. 2A).

Then, the surface of this semiconductor substrate 11 was anodized to form a porous layer in the surface of the semiconductor substrate 11. In this embodiment, the anodization was carried out by employing an anodizing device having a double cell structure explained in FIG. 1. Namely, the semiconductor substrate 11 made of the single crystal Si was arranged between the first and second cells 1A and 1B, and an electrolytic solution made of HF:$C_2H_5$OH=1:1 was filled into the two cells 1A and 1B. Then, a current was passed between the Pt electrodes 3A and 3B immersed in the electrolytic solutions of the electrolytic solution cells 1A and 1B by a DC current source 2.

First, current was supplied with a low current density of 7 mA/$cm^2$ for 13 minutes. By this step, a surface layer 12S having a porosity of 26% and a thickness of about 10 $\mu$m was formed (FIG. 2B).

The current supply was stopped once, then a current was supplied with a high current density of 200 mA/$cm^2$ for 3 seconds. By this step, a high porosity layer 12H having a porosity of about 60% higher than that of the surface layer 12S was formed in the surface layer 12S. Accordingly, the high porosity layer was sandwiched between the previously formed surface layer 12S (FIG. 2C). In this way, a porous layer 12 made of the surface layer 12S and the high porosity layer 12H was formed.

In the porous layer 12, the surface layer 12S and the high porosity layer 12H have greatly different porosities, therefore a large strain is introduced at the interface between the surface layer 12S and the high porosity layer 12H and the strength becomes extremely weak around the vicinity of the interface. Accordingly, a line of weakness is defined at or about the interface which is useful to facilitate targeted separation of grown semiconductor films from the substrate in later steps.

After forming the porous layer 12, in the Si epitaxial growing device, a heat treatment, that is, an annealing at 1100° C., was carried out for the semiconductor substrate 11 in an $H_2$ atmosphere under a normal pressure. The heating step was performed by raising the heating temperature from room temperature to 1100° C. in about 20 minutes and then holding at 1100° C. for about 30 minutes. By this annealing in $H_2$, the surface of the porous layer 12 became smooth, and the strength near the interface between the intermediate porosity layer 12M and the high porosity layer 12H was made further fragile.

Figure 3A:
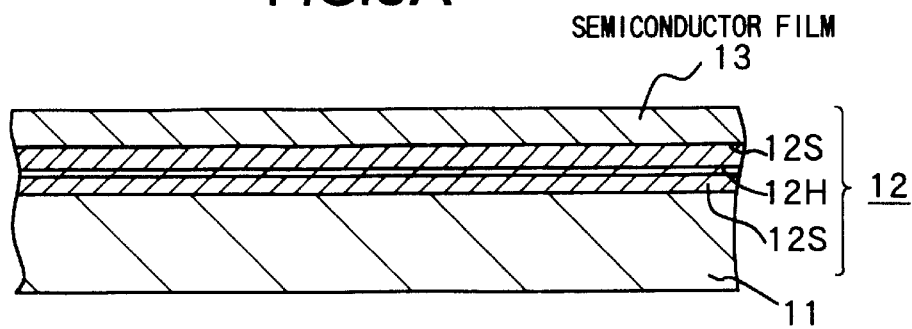
FIGS. 3(a)–3(d) are cross-sectional views illustrating the steps of growing an epitaxial semiconductor film, bonding a structural support to the semiconductor film, separating the semiconductor film from the semiconductor substrate along a line of weakness defined in the porous layer structure to provide the separated semiconductor film product.

Thereafter, the temperature was reduced from the annealing temperature of 1100° C. to 1030° C. in the $H_2$ atmosphere and epitaxial growth of Si was carried out for 17 minutes by using $SiH_4$ gas as a source gas. As a result, an epitaxial semiconductor film 13 made of single crystal Si having a thickness of about 5 µm was formed on the surface of the porous layer 12 (FIG. 3A).

Figure 3B:
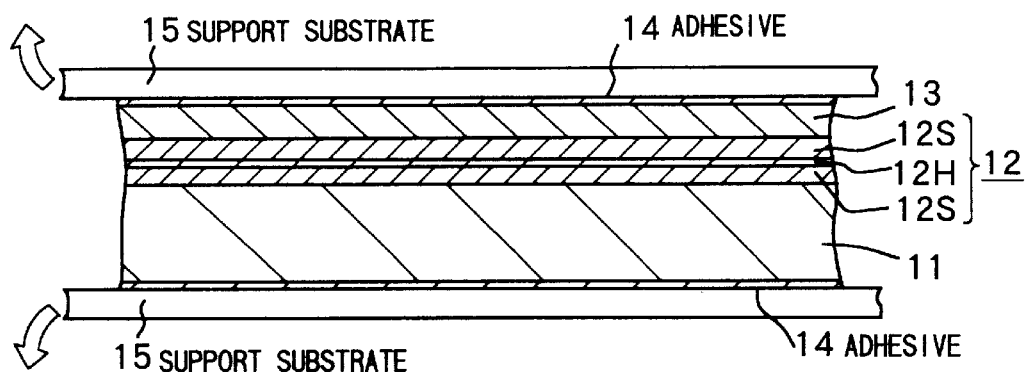

The epitaxial semiconductor film 13 was peeled from the semiconductor substrate 11 in the next step. For this peeling step, a binder 14 was coated on the surface of the epitaxial semiconductor film 13 and the back surface of the semiconductor substrate 11, respectively, and a flexible support substrate 15 made of a PET (polyethylene terephthalate) sheet was adhered by these binders 14 (FIG. 3B). The bonding strength of the support substrate 15 by this binder 14 was selected to be a higher strength than the separation strength in the porous layer 12.

Figure 3C:
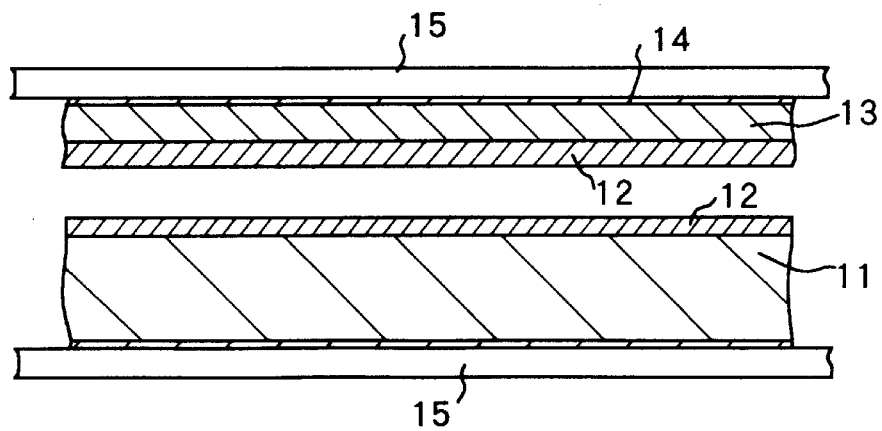

An external outward and opposed pulling force for separating the support substrates 15 from each other was applied to the two substrates 15. By this, separation occurred along the line of weakness in the fragile porous layer 12 with peeling occurring in the high porosity layer 12H, or, at or in the vicinity of an interface with the high porosity layer 12H and the epitaxial semiconductor film 13 was peeled from the semiconductor substrate 11 (FIG. 3C).

Figure 3D:
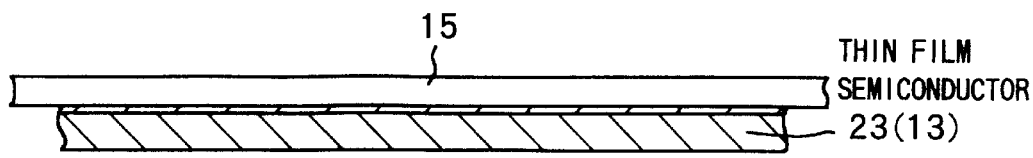

The thin film semiconductor 23 is constituted by the epitaxial semiconductor film 13 separated in this way (FIG. 3D). In this example, any remaining porous layer with the thin film semiconductor 23 was removed by chemical or mechanical etching.

[Embodiment 2]

FIGS. 4–5 are process diagrams of the Embodiment 2. First, similar to Embodiment 1, a wafer-like semiconductor substrate 11 made of single crystal Si doped with boron B at a high concentration and having a resistivity of for example 0.01 to 0.02 Ωcm was prepared (FIG. 4A).

Next, the surface of this semiconductor substrate 11 was anodized to form a porous layer in the surface of the semiconductor substrate 11. Also in this Embodiment 2, similar to Embodiment 1, the anodizing device of the double cell structure explained referring to FIG. 1 was used. And an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

In this Embodiment 2, first, current was supplied for 8 minutes with a low current density of 1 $mA/cm^2$. By this, a dense surface layer 12S having a porosity of 16% and a thickness of 1.7 µm having a very small pore diameter in comparison with the surface layer 12S in Embodiment 1 was formed (FIG. 4B). The current supply was stopped once, then a current was supplied with a current density of 7 $mA/cm^2$ for 8 minutes. By this, an intermediate porosity layer 12M of a porosity of 26% and thickness of 6.3 µm having a higher porosity in comparison with the surface layer 12S was formed beneath of the surface layer 12S (FIG. 4C). The current supply was stopped once again, then a current was supplied with a high current density of 200 $mA/cm^2$ for 3 seconds. By this, in the intermediate porosity layer 12M, a high porosity layer 12H, given a higher porosity than this intermediate porosity layer 12M, that is, having a porosity of about 60% and thickness of 0.05 µm, was formed (FIG. 4D). In this way, a porous layer 12 comprising the surface layer 12S, the intermediate porosity layer 12M, and the high porosity layer 12H was formed.

In the porous layer 12, the porosity greatly differs between the intermediate porosity layer 12M and the high porosity layer 12H. Therefore, a large strain and an associated line of weakness is introduced at and the vicinity of the interface of these intermediate porosity layer 12M and high porosity layer 12H, thus the strength around this interface becomes extremely weak.

After the formation of the porous layer 12, the annealing, the epitaxial growth of Si, and the peeling are carried out in the same way as in described in Embodiment 1.

More particularly, in the ordinary pressure Si epitaxial growing device, first, the semiconductor substrate 11 was annealed in an $H_2$ atmosphere. The annealing, that is, the heat treatment, was performed by raising the heating temperature from room temperature to 1100° C. in about 20 minutes, then holding at 1100° C. for about 30 minutes. In this $H_2$ annealing, the surface layer 12S becomes smoother if the fine pores of the porous layer are small. Therefore, the surface layer 12S having small fine pores becomes smoother by this annealing in $H_2$ and the strength near the interface between the intermediate porosity layer 12M and the high porosity layer 12H was made further fragile.

Thereafter, the temperature was reduced from the annealing temperature of 1100° C. to 1030° C. in $H_2$, and the epitaxial growth of Si was carried out for 17 minutes by using $SiH_4$ gas as the source gas. By doing this, an epitaxial semiconductor film 13 made of single crystal Si having a thickness of about 5 µm was formed on the surface layer 12S (FIG. 5A).

After the above described step, a binder 14 was coated on the surface of the semiconductor film 13 and the back surface of the semiconductor substrate 11, the PET sheets (not illustrated) were bonded by a stronger bonding strength than the separation strength in the porous layer 12 by the binder 14. Then, an external force for separating the semiconductor film 13 from the semiconductor substrate 11 was applied similar to Embodiment 1. By this, in the fragile porous layer 12, peeling occurs in the high porosity layer 12H or at the interface between the intermediate porosity layer 12M and the high porosity layer 12H or the vicinity thereof, and the epitaxial semiconductor film 13 is separated from the semiconductor substrate 11 (FIG. 5B).

The thin film semiconductor 23 is constituted by the epitaxial semiconductor film 13 separated in this way. In this example, the porous layer peeled with the thin film semiconductor 23 was again removed by chemical or mechanical etching.

In this Embodiment 2, a surface layer 12S which has a small and dense porosity, and becomes smoother by the annealing in $H_2$. Therefore, the semiconductor film 13 epitaxially grown on the surface layer 12S is formed to have a more excellent crystallinity.

Nevertheless, the porosity difference between the surface layer 12S and the high porosity layer 12H is large, the intermediate porosity layer 12M having an intermediate porosity is provided as a buffer layer between the high porosity layer 12H and the surface layer 12S, therefore, the influence of the strain due to the high porosity layer 12H can be effectively reduced.

[Embodiment 3]

Figure 6A:
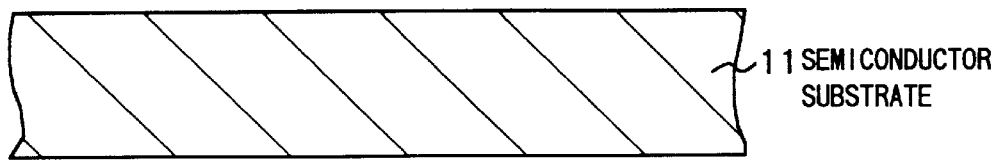
FIGS. 6(a)–6(e) are cross-sectional views illustrating the sequence of steps for forming a multilayer porous structure in accordance with a third embodiment of the invention.

FIG. 6 and FIG. 7 are process diagrams of this Embodiment 3. First, similar to Embodiments 1 and 2, a wafer-like semiconductor substrate 11 made by single crystal Si doped with boron B at a high concentration and having a resistivity of for example 0.01 to 0.02 Ωcm was prepared (FIG. 6A).

Next, the surface of this semiconductor substrate 11 was anodized to form a porous layer in the surface of the semiconductor substrate 11. In this Embodiment 3, similar to Embodiments 1 and 2, an anodizing device of a double cell structure explained referring to FIG. 1 was used. And an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

Figure 6B:
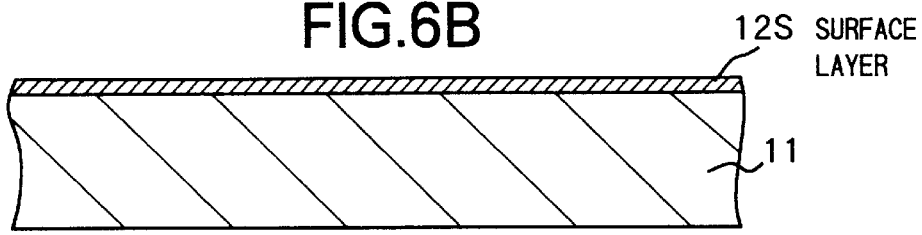
Figure 7A:
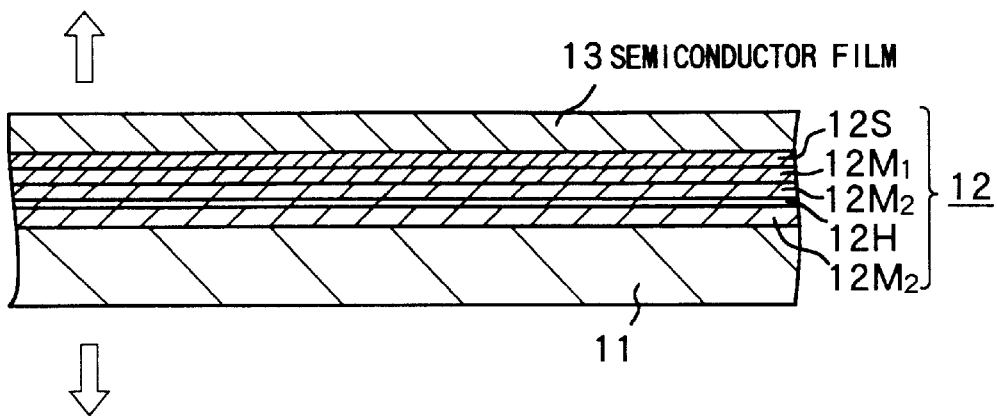
FIGS. 7(a)–7(b) are cross-sectional views illustrating the steps of forming a semiconductor film on the porous structure prepared in FIGS. 6(a)–6(e) and separating the semiconductor film from the semiconductor substrate.

In this Embodiment 3, after the above described step, the current was supplied for 8 minutes with a low current density of 1 $mA/cm^2$. By this, similar to Embodiment 2, a dense surface layer 12S having a very small pore diameter was formed (FIG. 6B).

Figure 6C:
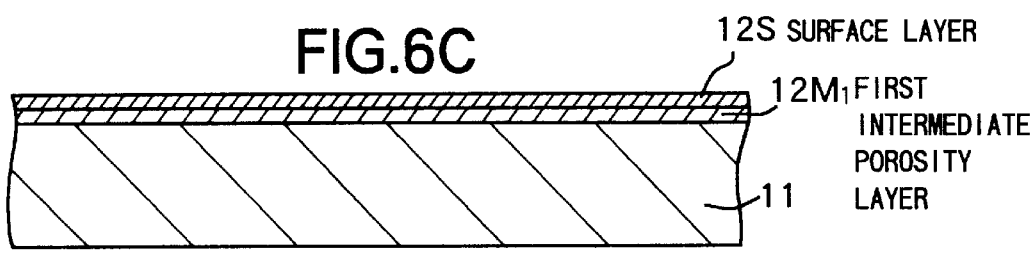

The current supply was stopped once, then, in this Embodiment 3, a current was supplied with a current density of 4 $mA/cm^2$ for 3 minutes. By this, a first intermediate porosity layer 12M1 of a porosity of 22% and thickness of 1.8 μm having a higher porosity in comparison with the surface layer 12S was formed beneath the surface layer 12S (FIG. 6C).

Figure 6D:
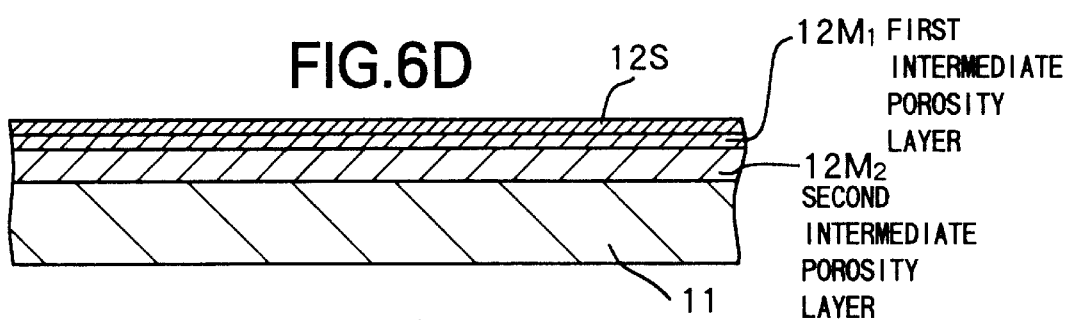

The current supply was stopped once again, then a current was further supplied with a current density of 10 $mA/cm^2$ for 6 minutes. By this, a second intermediate porosity layer 12M2 having a porosity of about 30% and a thickness of 6.6 μm was formed beneath the first intermediate porosity layer 12M1 (FIG. 6D).

Figure 6E:
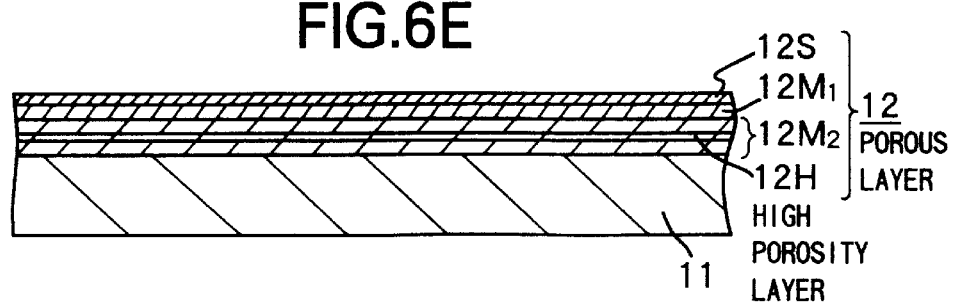

Further, the current supply was stopped once, then a current was supplied with a high current density of 200 $mA/cm^2$ for 3 seconds. By this, in the second intermediate porosity layer 12M2, a high porosity layer 12H given a higher porosity than this intermediate porosity layer 12M2, that is, having a porosity of about 60% and thickness of about 0.5 μm, was formed (FIG. 6E). In this way, a porous layer 12 comprising the surface layer 12S, the first and second intermediate porosity layers 12M1 and 12M2, and the high porosity layer 12H was formed.

In the porous layer 12, the porosity greatly differs between the second intermediate porosity layer 12M2 and the high porosity layer 12H, therefore a large strain is introduced at or the vicinity of the interface of the second intermediate porosity layer 12M2 and the high porosity layer 12H, and thus the strength at this location becomes extremely weak.

Figure 7B:
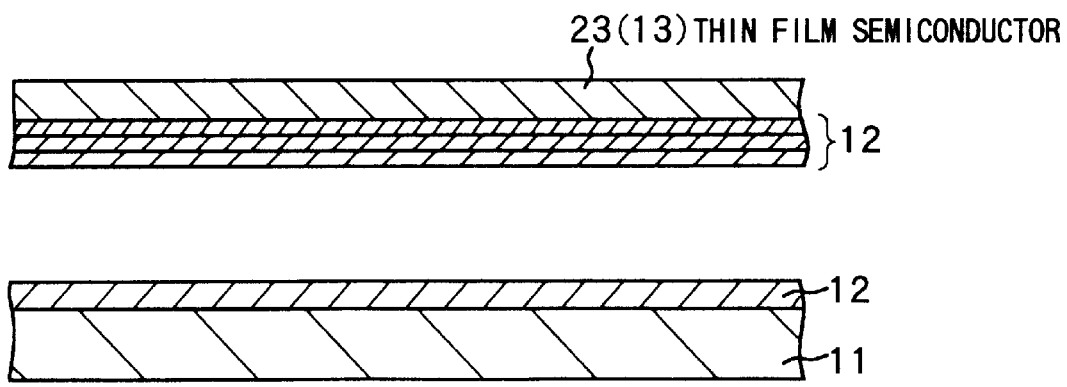

After forming the porous layer 12, annealing is carried out similar to Embodiments 1 and 2, the epitaxial semiconductor film 13 is formed by epitaxial growth of Si (FIG. 7A), and the bonding of a PET sheet (not illustrated) serving as the support substrate is carried out. The peeling of the epitaxial semiconductor film 13 and the semiconductor substrate 11 is carried out by the breakage of the high porosity 12H of the porous layer 12 or the vicinity thereof (FIG. 7B).

The thin film semiconductor 23 is formed by the epitaxial semiconductor film 13 in this way.

In this Embodiment 3, between the high porosity layer 12H and the surface layer 12S, the first and second intermediate porosity layers 12M1 and 12M2 having porosities which rise toward the high porosity layer 12H are provided. These intermediate porosity layers act as buffer layers. Therefore, the influence of the strain due to the high porosity layer 12 can be more effectively reduced.

[Embodiment 4]

In this embodiment, similar to Embodiment 2 explained referring to FIG. 4 and FIG. 5, the surface of the single crystal Si semiconductor substrate 11 is anodized to form the porous layer 12 comprised of the surface layer 12S, the intermediate porosity layer 12M, and the high porosity layer 12H formed in this intermediate porosity layer 12M and the epitaxial semiconductor film constituting the intended thin film semiconductor is epitaxially grown on this, but in this embodiment, the surface layer 12S and the intermediate porosity layer 12M were formed by a continuous anodization method in which the amount of current supplied is varied.

Also in this embodiment, similar to Embodiments 1 and 2, a semiconductor substrate 11 made of single crystal Si doped with boron B and having a resistivity of for example 0.01 to 0.02 Ωcm was prepared (FIG. 4A).

Then, similar to Embodiments 1 and 2, an anodizing device of a double cell structure explained referring to FIG. 1 was used. An electrolytic solution made of $HF:C_2H_5OH=1:1$ was filled into both of the first and second cells 1A and 1B. Then, current was passed between the Pt electrodes 3A and 3B immersed in the electrolytic solution of the electrolytic solution cells 1A and 1B by a DC current source 2.

Also in this Embodiment 4, first, current was supplied for 8 minutes with a low current density of 1 $mA/cm^2$. By this, a surface layer 12S having a porosity of 16% and a thickness of 1.7 μm was formed (FIG. 4B).

Next, in this embodiment, after forming this surface layer 12S, without stopping the current supply, the anodization was carried out gradually changing the amount of current supply from above 1 $mA/cm^2$ to 10 $mA/cm^2$ in about 16 minutes, by increasing the current at a rate of for example 1 $mA/cm^2$ per minute. By this, an intermediate porosity layer 12M having a thickness of about 6.8 μm and changed in porosity from about 16% to 30% was formed (FIG. 4C).

Thereafter, the current supply was stopped once, then current was supplied with a high current density of 200 $mA/cm^2$ for 3 seconds. By this, in the intermediate porosity layer 12M, a high porosity layer 12H given a higher porosity than this intermediate porosity layer 12M, having a porosity of about 60% and thickness of 0.5 μm, was formed (FIG. 4D). In this way, a porous layer 12 comprising the surface layer 12S, the intermediate porosity layer 12M, and the high porosity layer 12H was formed.

In the porous layer 12 formed in this way, the porosity greatly differs between the intermediate porosity layer 12M and the high porosity layer 12H, therefore a large strain is applied at the interface of these intermediate porosity layer 12M and high porosity layer 12H and the vicinity of the interface, thus the strength around here becomes extremely weak.

After forming the porous layer 12, annealing similar to Embodiments 1 and 2 is carried out in a Si epitaxial growing device in H₂ atmosphere under the normal pressure to make the surface layer 12S of the porous layer 12 smooth and weaken the strength near the interface of the intermediate porosity layer 12M and the high porosity layer 12H.

Thereafter, similar to Embodiments 1 and 2, in the Si epitaxial growing device in which the annealing was carried out, epitaxial growth of Si was carried out under the normal pressure for 17 minutes to form the epitaxial semiconductor film 13 made of single crystal Si having a thickness of about 5 μm (FIG. 5A).

After the above step, similar to Embodiment 2, a support substrate made of a PET sheet is bonded (not illustrated) and the peeling (FIG. 5B) etc. are carried out, thereby to obtain an intended thin film semiconductor 23. Also in this case, the peeling is carried out by the breakage in the porous layer, that is, the breakage of the high porosity layer 12H or the vicinity thereof.

Also in this Embodiment 4, a surface layer which has a small porosity, that is, is denser, is formed. This surface layer becomes smoother by the annealing in $H_2$. Therefore, the epitaxial semiconductor film 13 epitaxially grown on this, that is, the thin film semiconductor 23 formed by this, is formed as a semiconductor having more excellent crystallinity.

In this Embodiment 4, the porous layer 12 was formed by incrementally increasing the current density in the formation of the intermediate porosity layer 12M beneath the surface 12S, so the porosity between the high porosity layer 12H and the surface layer 12S gradually changes, and therefore the strain caused between the two layers is effectively relieved, that is, buffered, by the intermediate porosity layer 12M. After performing the annealing in the $H_2$ atmosphere, a flatter and smoother surface can be formed. Accordingly, the epitaxial semiconductor film formed on the surface layer and accordingly the finally obtained thin film semiconductor can be formed as a thin film semiconductor having a more excellent crystallinity and higher reliability.

[Embodiment 5]

FIG. 8 is a process diagram of this embodiment. In this embodiment, in the porous layer 12, the high porosity layer was formed in the bottom of or beneath the intermediate porosity layer, that is, inside of the substrate 11 which was not made porous.

In this embodiment as well, similar to Embodiments 1 and 2, a semiconductor substrate 11 made of single crystal Si doped with boron B and having a resistivity of for example 0.01 to 0.02 Ωcm is prepared (FIG. 8A).

Then, with respect to this semiconductor substrate 11, similar to Embodiments 1 and 2, an anodizing device of a double cell structure explained referring to FIG. 1 was used. And an electrolytic solution made of $HF:C_2H_5OH=1:1$ was filled into both of the first and second cells 1A and 1B. Then, a cur-rent was passed between the Pt electrodes 3A and 3B immersed in the electrolytic solutions of the electrolytic solution cells 1A and 1B by a DC current source 2.

In this Embodiment 5, similar to Embodiment 2, first, the current was supplied for 8 minutes with a low current density of 1 mA/cm². By this, a surface layer 12S having a porosity of 16% and a thickness of about 1.7 μm was formed (FIG. 8B). Then, similar to Embodiment 2, the current supply was once stopped and the anodization was carried out with a current supply of 7 mA/cm² for 8 minutes to form an intermediate porosity layer 12M having a porosity of 26% and a thickness of 6.3 μm beneath the surface layer 12S (FIG. 8C).

Thereafter, the current supply was stopped once, then, in this embodiment, a current with a high current density of 200 mA/cm² was intermittently supplied. Namely, a current of 200 mA/cm² was supplied for 0.7 second at first, the current supply was stopped again for one minute, and then a current of 200 mA/cm² was supplied for 0.7 second, the current supply was further stopped for one minute, and then a current of 200 mA/cm² was supplied for 0.7 second. Namely, the anodization was carried out by intermittently supplying current of a high current density three times. By this, a high porosity layer 12H having a higher porosity in comparison with the intermediate porosity layer 12M, i.e., a porosity of about 60%, and a thickness of about 50 nm was formed under the intermediate porosity layer 12M (FIG. 8D). In this way, a porous layer 12 comprising the surface layer 12S, the intermediate porosity layer 12M, and the high porosity layer 12H is formed.

In the porous layer 12 formed in this way, the porosity between the high porosity layer 12H and the intermediate porosity layer 12M and further between the high porosity layer 12H and the substrate 11 greatly differs, so a large strain is applied at the interface and the vicinity of the interface and the strength at this location becomes extremely weak.

After forming the porous layer 12 in this way, similar to the explanation referring to Embodiment 2, annealing was carried out in a Si epitaxial growing device in an $H_2$ atmosphere under a normal pressure to make the surface layer 12S of the porous layer 12 smooth and simultaneously the high porosity layer 12H is made fragile.

Thereafter, similar to Embodiment 2, in the Si epitaxial growing device in which the annealing was carried out, epitaxial growth of Si was carried out under the normal pressure for 17 minutes to form an epitaxial semiconductor film 13 made of single crystal Si having a thickness of about 5 μm (FIG. 8E).

Then, similar to the above embodiments, the epitaxial semiconductor film 13 and the semiconductor substrate 11 are separated (FIG. 8F).

By the intermittent supply of a large current density, the high porosity layer 12H is formed in the bottom of or beneath the intermediate porosity layer 12M. And the high porosity layer 12H can be formed with an extremely high porosity. The porosity of the high porosity layer 12H is remarkably improved by the annealing in the H2 atmosphere. Accordingly, the epitaxial semiconductor film 12 on the porous layer 12 can be extremely easily peeled in the high porosity layer 12H or the vicinity thereof.

Figure 23:
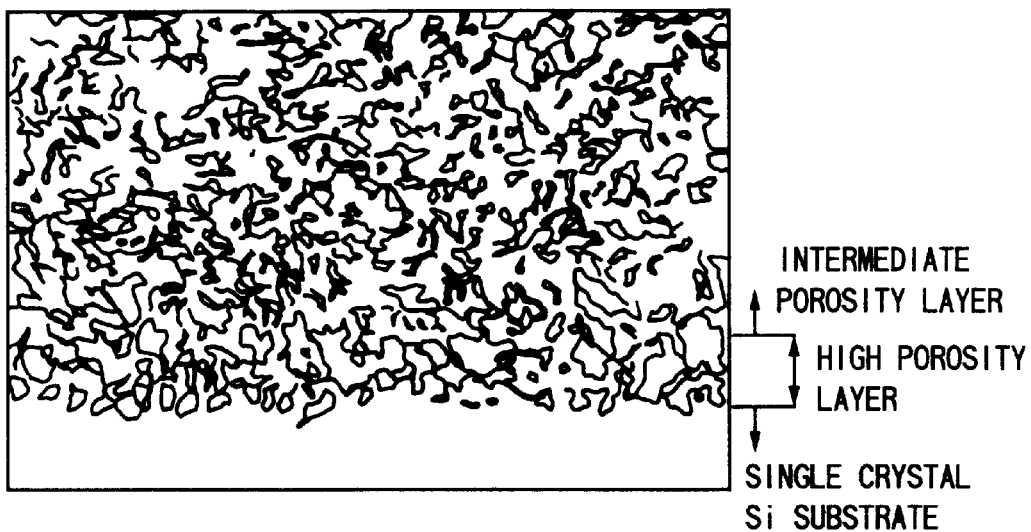
FIG. 23 is a schematic cross-sectional view of a micrograph of a principal part of a porous layer in the process of the present invention shown in cross-section before heat treatment.
Figure 24:
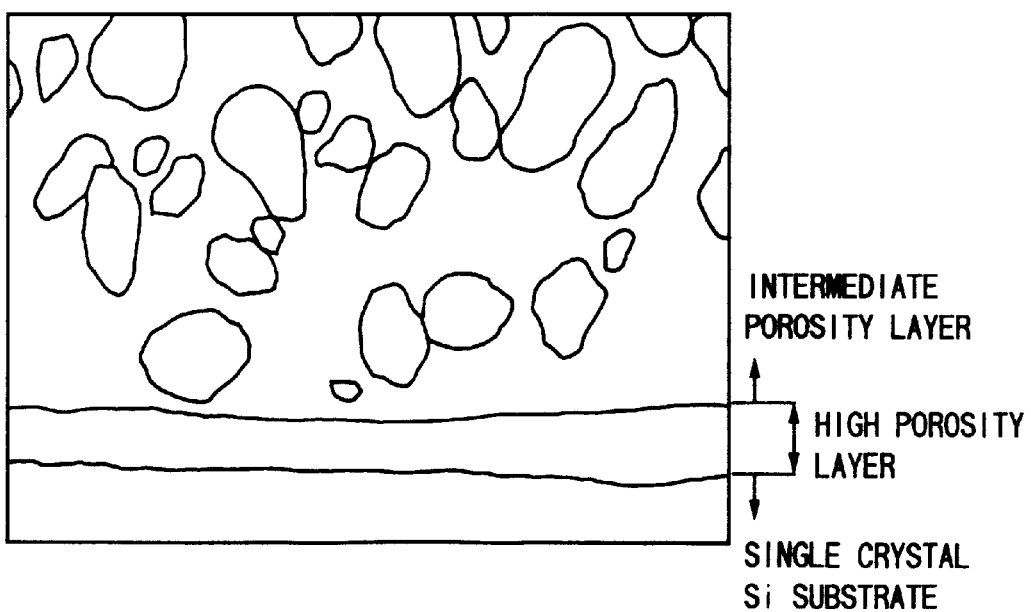
FIG. 24 is a schematic cross-sectional view of a micrograph of the principal part of the porous layer in the process of the present invention after heat treatment.

FIG. 23 and FIG. 24 are diagrammatical views based on micrographs of 100,000 magnifications of the cross-section of the intermediate porosity layer 12M and the high porosity layer 12H in this embodiment before and after the annealing in the $H_2$ atmosphere. As apparent from a comparison of the two, the growth of the crystal grains is caused by the annealing in $H_2$. A remarkable expansion and growth of the pore portions occurs particularly in the high porosity layer 12H. An extremely rough layer of a columnar form (FIG. 24 shows cross-section of part where there are no columns) is formed. The fragility in this part becomes remarkable.

Embodiment 5 shows a case where the high porosity layer 12H is formed at the interface with the semiconductor substrate 11 by the intermittent supply of a large current, but it is also possible to similarly form the high porosity layer 12H at the interface with the semiconductor substrate 11 by a means other than such an intermittent supply of a large current. This case is shown in Embodiments 6 and 7 and Embodiment 8.

[Embodiment 6]

In this embodiment, an explanation will be made by referring to the process diagram of FIG. 8. In this embodiment, the surface layer 12S and the intermediate porosity layer were formed according to a process similar to that explained referring to Embodiment 2.

Namely, in this embodiment, similar to Embodiment 2, a wafer-like semiconductor substrate 11 made of single crystal Si doped with boron B at a high concentration and having a relative resistance of for example 0.01 to 0.02 Ωcm was prepared (FIG. 8A).

Next, an anodizing device of a double cell structure explained referring to FIG. 1 was used. And an electrolytic solution made of HF:$C_2H_5OH$=1:1 was filled into both of the first and second cells 1A and 1B. Then, a current was passed between the Pt electrodes 3A and 3B immersed in the electrolytic solutions of the electrolytic solution cells 1A and 1B by a DC current source 2.

First, the current was supplied for 8 minutes with a low current density of 1 mA/cm$^2$. By this, a surface layer 12S similar to that in Embodiment 2 is formed (FIG. 8B). The current supply was once stopped, then a current was supplied with a current density of 7 mA/cm$^2$ for 8 minutes to form an intermediate porosity layer 12M similar to that in Embodiment 2 beneath the surface layer 12S (FIG. 8C). Further, the current supply was stopped once, then, in this embodiment, a current of a so-called middle current density of 60 mA/cm$^2$, lower than the large current supplied in Embodiment 2, but higher than the supplied current at the formation of the surface layer 12S and the intermediate porosity layer 12M, was supplied for 1.9 seconds. By this, similar to Embodiment 5, a high porosity layer 12H having a porosity of about 60% and a thickness of about 50 nm is formed at the interface with the surface of the semiconductor substrate 11 under the intermediate porosity layer 12M (FIG. 8D). In this way, a porous layer 12 comprising the surface layer 12S, the intermediate porosity layer 12M, and the high porosity layer 12H is formed.

In the porous layer 12 formed in this way as well, the porosity greatly differs among the high porosity layer 12H, the intermediate porosity layer 12M, and the substrate 11, therefore a large strain is applied at the interface and the vicinity of the interface, and thus the strength around here becomes extremely weak.

After the formation of the porous layer 12 in this way, similar to the explanation referring to Embodiment 2, annealing is carried out in a Si epitaxial growing device in an H2 atmosphere under a normal pressure to make the surface layer 12S of the porous layer 12 smooth and simultaneously make the strength near the interface of the intermediate porosity layer 12M and the high porosity layer 12H fragile.

Thereafter, similar to Embodiment 2, in the Si epitaxial growing device in which the annealing was carried out, epitaxial growth of Si is carried out under the pressure for 17 minutes to form an epitaxial semiconductor film 13 made of single crystal Si having a thickness of about 5 μm (FIG. 8E).

Then, similar to the above embodiments, the epitaxial semiconductor film 13 is peeled from the semiconductor substrate 11 thereby to obtain an intended thin film semiconductor 23 (FIG. 8F).

[Embodiment 7]

In this embodiment, an explanation will be made by referring to the process diagram of FIG. 8. In this embodiment as well, similar to Embodiment 2, a wafer-like semiconductor substrate 11 made of single crystal Si doped with boron B at a high concentration and having a relative resistance of for example 0.01 to 0.02 Ωcm was prepared (FIG. 8A).

Also in this case, an anodizing device of a double cell structure explained referring to FIG. 1 was used. And an electrolytic solution made of HF:$C_2H_5OH$=1:1 was filled into both of the first and second cells 1A and 1B. Then, a current was passed between the Pt electrodes 3A and 3B immersed in the electrolytic solutions of the electrolytic solution cells 1A and 1B by a DC current source 2.

Then, first, in this embodiment, a current was supplied with a low current density of 1 mA/cm$^2$ for 6 minutes. By this, a surface layer 12S having a porosity of 16% and a thickness of 1.7 μm was formed (FIG. 8B). The current supply was stopped once, then current was supplied with a current density of 4 mA/cm$^2$ for 10 minutes. By this, the intermediate porosity layer 12M having a porosity of 22% and a thickness of 5.8 μm is formed beneath the surface layer 12S, that is, on the inner side from the surface layer 12S (FIG. 8C). Further, the current supply was stopped once, then, in this embodiment, a middle current of 60 mA/cm$^2$ was supplied for 2 seconds. By this, the high porosity layer 12H having a porosity of about 60% and a thickness of about 50 nm is formed at the interface with the semiconductor substrate 11 under the intermediate porosity layer 12M (FIG. 8D). In this way, a porous layer 12 comprising the surface layer 12S, the intermediate porosity layer 12M, and the high porosity layer 12H is formed.

In the porous layer 12 formed in this way, the porosity greatly differs among the high porosity layer 12H, the intermediate porosity layer 12M, and the substrate 11, therefore a large strain is applied at the interface and the vicinity of the interface, and thus the strength around here becomes extremely weak.

After forming the porous layer 12 in this way, similar to the explanation referring to Embodiment 2, annealing is carried out in a Si epitaxial growing device in an H$_2$ atmosphere under a normal pressure to make the surface layer 12S of the porous layer 12 smooth and simultaneously make the strength near the interface of the intermediate porosity layer 12M and the high porosity layer 12H inside the porous layer 12 fragile.

Thereafter, similar to Embodiment 2, in the Si epitaxial growing device in which the annealing was carried out, epitaxial growth of Si is carried out under the normal pressure for 17 minutes to form an epitaxial semiconductor film 13 made of single crystal Si having a thickness of about 5 μm (FIG. 8E). The epitaxial semiconductor film 13 is peeled from the semiconductor substrate 11 to obtain the intended thin film semiconductor 23 (FIG. 8F).

[Embodiment 8]

In this embodiment, the explanation will be made by referring to the process diagram of FIG. 8. In this embodiment, similar to Embodiment 2, a wafer-like semiconductor substrate 11 made of single crystal Si doped with boron B at a high concentration and having a relative resistance of for example 0.01 to 0.02 Ωcm was prepared (FIG. 8A).

Then, in this case as well, anodization is carried out by using an anodizing device of a double cell structure explained referring to FIG. 1, but in this embodiment, an electrolytic solution of HF:$C_2H_5OH$=1.2:1 was filled into the first cell 1A, and an electrolytic solution of HF:$C_2H_5OH$=1:1 was filled into the second cell 1B. Then, current was passed between the Pt electrodes 3A and 3B arranged immersed in the electrolytic solutions of the electrolytic solution cells 1A and 1B by a DC current source 2.

First, current was supplied with a low current density of 1 mA/cm$^2$ for 5 minutes. By this, a surface layer 12S having a porosity of 13% and a thickness of 1.5 μm was formed (FIG. 8B). The current supply was stopped once, then the current was supplied with a current density of 5 mA/cm2 for 5 minutes. By this, an intermediate porosity layer 12M having a porosity of 18% and a thickness of 5 μm was formed under the surface layer 12S (FIG. 8C). Further, the current supply was once stopped, then a current with a middle current density of 80 mA/cm2 was supplied for 3 seconds. By this, a high porosity layer 12H having a porosity of about 60% and a thickness of about 50 nm was formed at the interface with the semiconductor substrate 11 under the intermediate porosity layer 12M which was not made porous (FIG. 8D). In this way, a porous layer 12 comprising the surface layer 12S, the intermediate porosity layer 12M, and the high porosity layer 12H is formed.

In the porous layer 12 formed in this way, the porosity greatly differs among the high porosity layer 12H, the intermediate porosity layer 12M, and the substrate 11, therefore a large strain is applied at the interface and the vicinity of the interface, and thus the strength around here becomes extremely weak.

After the formation of the porous layer 12 in this way, similar to the explanation referring to Embodiment 2, annealing is carried out in a Si epitaxial growing device in an $H_2$ atmosphere under a normal pressure to make the surface layer 12S of the porous layer 12 smooth and simultaneously make the strength near the interface of the intermediate porosity layer 12M and the high porosity layer 12H inside the porous layer 12 fragile.

Thereafter, similar to Embodiment 2, in the Si epitaxial growing device, in which the annealing was carried out, epitaxial growth of Si was carried out under the normal pressure for 17 minutes to form an epitaxial semiconductor film 13 made of single crystal Si having a thickness of about 5 μm (FIG. 8E).

Then, in this case, the bonding of for example a PET sheet (not illustrated) and the peeling of the epitaxial semiconductor film 12 from the semiconductor substrate 11 are carried out to obtain the intended thin film semiconductor 23 (FIG. 8F).

[Embodiment 9]

This embodiment is based on a process similar to Embodiment 2, but an oxidation step is added preceding the heat treatment with respect to the porous layer 12 in the $H_2$ atmosphere. This will be explained by referring to FIGS. 4 and 5. In this embodiment, similar to Embodiment 2, a wafer-like semiconductor substrate 11 made of single crystal Si doped with boron B at a high concentration and having a relative resistance of 0.01 to 0.02 Ωcm was prepared (FIG. 4A).

Further, an anodizing device of a double cell structure explained referring to FIG. 1 was used. And an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

First, a current was supplied with a current density of 1 mA/cm$^2$ for 8 minutes to form a surface layer 12S (FIG. 4B). The current supply was stopped once, then a current was supplied with a current density of 7 mA/cm$^2$ for 8 minutes to form an intermediate porosity layer 12M under the surface layer 12S (FIG. 4C). The current supply was stopped once, then a current of 200 mA/cm$^2$ was supplied for 3 seconds to form the high porosity layer 12H in the intermediate porosity layer 12M and thereby form a porous layer 12 comprised of the surface layer 12S, the intermediate porosity layer 12M, and the high porosity layer 12H (FIG. 4D).

Thereafter, in this embodiment, the oxidation step is carried out. This oxidation was performed according to dry oxidation comprised of heating in an oxygen atmosphere to 400° C. By this process, the internal portion of the porous layer 12 is oxidized, the occurrence of a large structural change in the porous layer is prevented even by the later heat treatment in the $H_2$ atmosphere and the influence of the strain caused in the vicinity of the interface of the high porosity layer 12H exerted on the surface layer 12S can be effectively avoided.

After this, by a similar method to that in Embodiment 2, the substrate 11 is heat treated in an $H_2$ atmosphere by a Si epitaxial growing device under a normal pressure, then the epitaxial growth of Si is carried out (FIG. 5A), and the adhesion, peeling, etc. of the support substrate by for example a PET sheet are carried out, thereby to obtain the intended thin film semiconductor 23 (FIG. 5B).

[Embodiment 10]

This embodiment shows a case where the concentration of the electrolytic solution is changed in the anodization of the porous layer 12. In this case, the explanation will be made by referring to FIG. 4 and FIG. 5. In this embodiment, a wafer-like semiconductor substrate 11 made of single crystal Si doped with boron B at a high concentration and having a relative resistance of 0.01 to 0.02 Ωcm was prepared (FIG. 4A).

Then, anodization was carried out by using an anodizing device of a double cell structure explained referring to FIG. 1, but in this case, an electrolytic solution of $HF:C_2H_5OH=2:1$ was filled into the first cell 1A, an electrolytic solution of $HF:C_2H_5OH=1:1$ was filled into the second cell 1B, the Si substrate was sandwiched between these electrolytic solution cells, and a current was passed between the Pt electrodes 3A and 3B disposed in the electrolytic solution tanks 1A and 1B as the electrodes.

First, a current was supplied with a current density of 1 mA/cm$^2$ for 8 minutes. By this, a surface layer 12S having a porosity of 16% and a thickness of 1.7 μm was formed (FIG. 4B). The current supply was stopped once, then a current was supplied at 7 mA/cm$^2$ for 8 minutes. By this, an intermediate porosity layer 12M having a porosity of 26% and a thickness of 6.3 μm was formed (FIG. 4C).

Next, the concentration of the electrolytic solution of the first cell 1A was changed to $HF:C_2H_5OH=1:1$. Then, the current density was raised to 200 mA/cm$^2$, and current was supplied for 3 seconds. By this, a high porosity layer 12H having a porosity of about 60% and a thickness of about 0.5 μm was formed in the intermediate porosity layer 12M (FIG. 4D). In this way, a porous layer 12 comprising the surface layer 12S, the intermediate porosity layer 12M, and the high porosity layer 12H is formed.

After this, similar to that in Embodiment 2, the substrate 11 is heat-treated in an $H_2$ atmosphere by a Si epitaxial growing device, then the epitaxial growth of Si is carried out (FIG. 5A), and the adhesion, peeling (FIG. 5B), etc. of the support substrate (not illustrated) by PET are carried out, thereby to obtain the thin film semiconductor 23.

In this embodiment, in the formation of the surface side of the porous layer 12, that is, the surface layer 12S and the intermediate porosity layer 12M, the HF concentration is raised. When the HF concentration of the electrolytic solution is raised in this way, the porosity of the porous layer becomes small. Therefore, in this case, since a porous layer having an extremely fine pore diameter is formed in the surface portion of the porous layer 12, the epitaxial semiconductor film to be epitaxially grown on this is formed as a film excellent in crystallinity.

Then, in this case, in the formation of the high porosity layer 12H, if the HF concentration of the electrolytic solution is high, a sufficient porosity may not be obtained with the current supply of a current density of 200 mA/cm$^2$ for about 3 seconds, but in this embodiment, in the production of the high porosity layer 12H, the HF concentration of the electrolytic solution is lowered, so a high porosity layer 12H having a sufficiently high porosity can be produced.

[Embodiment 11]

This embodiment also shows a case where the concentration of the electrolytic solution is changed in the anodization process. This will be explained by referring to FIG. 6 and FIG. 7. In this embodiment, a wafer-like semiconductor substrate 11 made of single crystal Si doped with boron B at a high concentration and having a relative resistance of 0.01 to 0.02 Ωcm was prepared (FIG. 6A).

Then, an anodizing device of a double cell structure explained referring to FIG. 1 was used. And an electrolytic solution of HF:$C_2H_5$OH=2:1 was filled into the first cell 1A, an electrolytic solution of HF:$C_2H_5$OH=1:1 was filled into the second cell 1B, the Si substrate was sandwiched between these electrolytic solution tanks 1A and 1B. Then, a current was passed between the Pt electrodes 3A and 3B disposed in the electrolytic solution cells 1 A and 1 B as the electrodes.

First, the current was supplied with a current density of 1 mA/cm$^2$ for 8 minutes. By this, a surface layer 12S having a porosity of about 14% and a thickness of about 2.0 μm was formed (FIG. 6B). The current supply was stopped once, then a current was supplied at 7 mA/cm$^2$ for 6 minutes. By this, a first intermediate porosity layer 12M1 having a porosity of about 20% and a thickness of about 6.4 μm was formed (FIG. 6C).

Next, the concentration of the electrolytic solution of the first tank 1A was changed to HF:$C_2H_5$OH=1:1. Then, a current was supplied again at 7 mA/cm$^2$ for 2 minutes. By this, a second intermediate porosity layer 12M2 having a porosity of about 26% and a thickness of about 1.7 μm was formed (FIG. 6D).

Thereafter, the current supply was stopped once, and the concentration of the electrolytic solution of the first tank 1A was further changed to HF:$C_2H_5$OH=1:1.5 to lower the concentration of the electrolytic solution further. In this state, the current density was raised to 200 mA/cm$^2$ and the current supplied for 2 seconds. By doing this, a high porosity layer 12H having a porosity of about 60% and thickness of about 0.5 μm was formed in the second intermediate porosity layer 12M2 (FIG. 6E). By this, a porous layer 12 comprising the surface layer 12S, the intermediate porosity layer 12M, and the high porosity layer 12H was formed.

Thereafter, by a process similar to Embodiments 2 and 3, etc., the substrate 11 was heat-treated in an H$_2$ atmosphere by a Si epitaxial growing device under a normal pressure, then the epitaxial growth of Si is carried out to form the epitaxial semiconductor film 13 (FIG. 7A), and the epitaxial semiconductor film 13 is peeled from the semiconductor substrate 11 to obtain the intended thin film semiconductor 23 (FIG. 7B). Also in this example, the porous layer adhered to the thin film semiconductor 23 was removed by etching.

In this embodiment, the first and second intermediate porosity layers 12M1 and 12M2 were formed. In the step for forming the second intermediate porosity layer 12M2, the concentration of the electrolytic solution was lowered. The concentration of the electrolytic solution was further lowered in the step for forming the high porosity layer 12H. Therefore, the porosity was stepwise raised from the surface layer 12S toward the high porosity layer 12H, and therefore the influence of the strain upon the surface of the porous layer 12 by the high porosity layer 12H can be effectively relieved, and the crystallinity of the epitaxial semiconductor film 13 to be epitaxially grown on the porous layer 12 can be made higher.

Further, in the anodization of the high porosity layer 12H, the concentration of the electrolytic solution was further lowered, therefore the fragility of this high porosity layer 12H can be further raised, and the separation, that is, the peeling property of the epitaxial semiconductor film 13 from the substrate 11, can be enhanced.

[Embodiment 12]

Figure 9A:
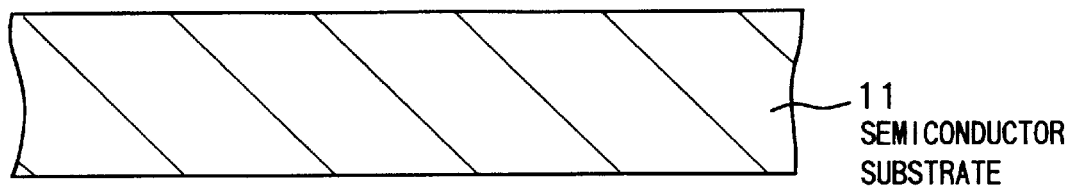
FIGS. 9(a)–9(d) are cross-sectional views illustrating another embodiment of the method of the present invention for forming a multilayer porous structure on a semiconductor substrate.

This embodiment also shows a case where the epitaxial semiconductor film, that is, the thin film semiconductor, has a multi-layer structure, i.e., p$^+$/p$^-$/n$^+$ structure. FIG. 9 and FIG. 10 are process diagrams of this embodiment. In this embodiment, a wafer-like semiconductor substrate 11 made of single crystal Si doped with boron B at a high concentration and having a relative resistance of for example 0.01 to 0.02 Ωcm was prepared (FIG. 9A).

Next, an anodizing device of a double cell structure explained referring to FIG. 1 was used, an electrolytic solution of HF:$C_2H_5$OH=1:1 was filled into both of the first and second cells 1A and 1B, and a current was passed between the Pt electrodes 3A and 3B immersed in the electrolytic solutions of the electrolytic solution cells 1A and 1B by a DC current source 2.

Figure 9B:
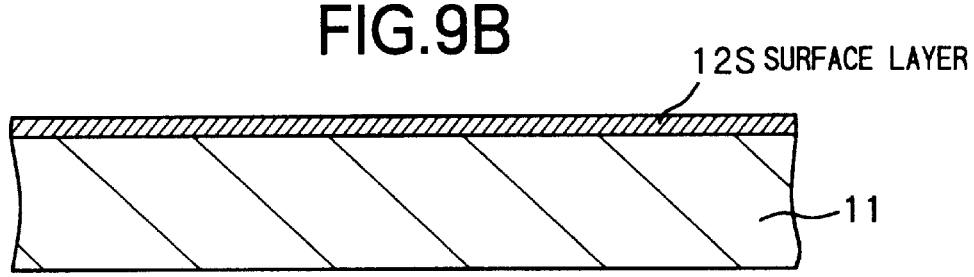
Figure 9C:
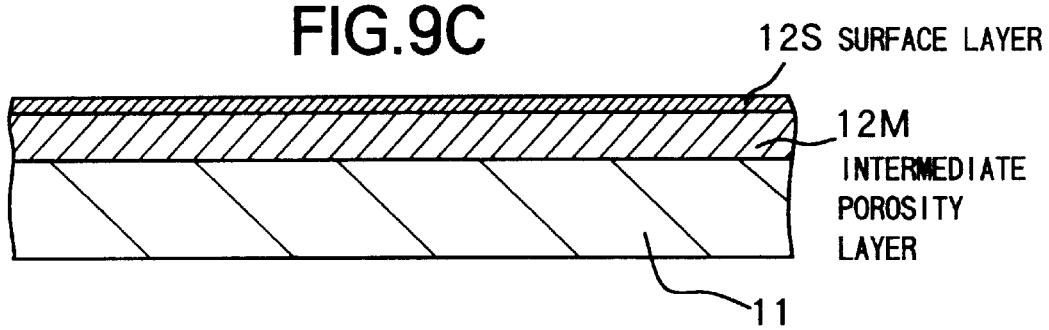
Figure 9D:
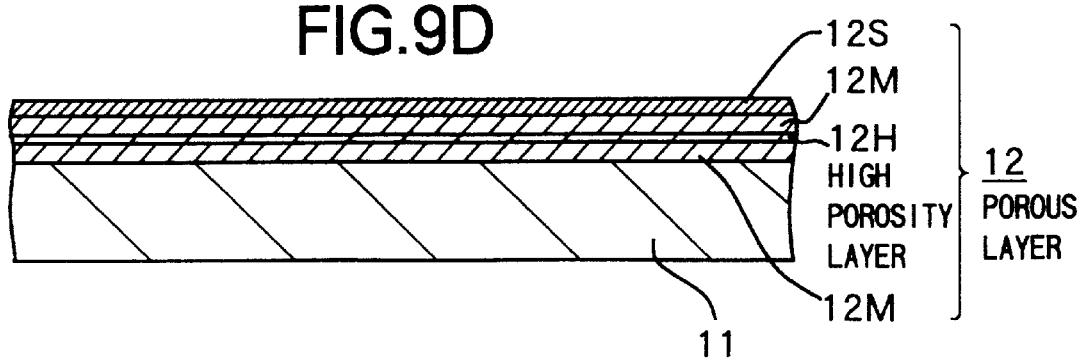

First, a current was supplied at a current density of 1 mA/cm$^2$ for 8 minutes to form a surface layer 12S (FIG. 9B). The current supply was stopped once, then a current was supplied with a current density of 7 mA/cm$^2$ for 8 minutes to form the intermediate porosity layer 12M (FIG. 9C). Further, the current supply was stopped once, then a current of 200 mA/cm$^2$ was supplied for 3 seconds. By performing this, a high porosity layer 12H was formed in the intermediate porosity layer 12M (FIG. 9D). In this way, a porous layer 12 comprised of the surface layer 12S, the intermediate porosity layer 12M, and the high porosity layer 12H is formed.

After forming the porous layer 12 in this way, similar to that explained by referring to Embodiment 2, the annealing is carried out in a Si epitaxial growing device in an H$_2$ atmosphere under a normal pressure to make the surface layer 12S of the porous layer 12 smooth and make the strength near the interface of the intermediate porosity layer 12M and the high porosity layer 12H fragile.

Thereafter, in the ordinary pressure Si epitaxial growing device in which the annealing was carried out, epitaxial growth, using SiH$_4$ gas and B$_2$H$_6$ gas, was carried out for 2 minutes to form a first epitaxial semiconductor layer 131 comprised of p$^+$ Si doped with boron B at a high concentration (FIG. 10A).

Next, the flow rate of the B$_2$H$_6$ gas was changed and Si epitaxial growth was carried out for 17 minutes to form a second epitaxial semiconductor layer 132 made of p$^-$ Si doped with boron at a low concentration (FIG. 10B).

Thereafter, PH$_3$ gas is supplied in place of the B$_2$H$_6$ gas and Si epitaxial growth doped with phosphorus to a high concentration is carried out on the p$^-$ epitaxial semiconductor layer 132 for 2 minutes to form a third epitaxial semiconductor film 133 made of n$^+$ Si (FIG. 10C). In this way, an epitaxial semiconductor film 13 having a p$^+$/p$^-$/n$^+$ structure comprising the first to third epitaxial semiconductor layers 131 to 133 is constituted.

After this, similar to the above embodiments, the peeling of the epitaxial semiconductor layer 13 from the substrate 11 and the other process are carried out to obtain the intended thin film semiconductor 23 (FIG. 10D). In this example, the porous layer adhered to the thin film semiconductor 23 was removed by etching. The thin film semiconductor 23 made of this p$^+$/p$^-$/n$^+$ three-layer structure can constitute a solar cell.

[Embodiment 13]

In this embodiment, instead of Si film in the process of Embodiment 12, the epitaxial semiconductor film 13 is formed as an epitaxial semiconductor film by GaAs. Namely, in this case, in the steps of FIG. 9A to FIG. 9D, steps similar to those in Embodiment 12 are employed, and then, in the epitaxial growth of the epitaxial semiconductor film 13, hetero epitaxial growth is carried out at a substrate temperature of 720° C. for 1 hour by an ordinary pressure MOCVD device by using TMGa (trimethyl gallium) and $AsH_3$ as the source material gas according to the MOCVD (Metal Organic Chemical Vapor Deposition) process, thereby, an epitaxial semiconductor film 13 made of GaAs having a film thickness of about 3 μm is formed.

Thereafter, the epitaxial semiconductor film 13 is peeled from the semiconductor substrate 11 to obtain the thin film semiconductor 23 made of the epitaxial semiconductor film 13.

[Embodiment 14]

This embodiment shows a case where a solar cell is produced. FIG. 11 to FIG. 14 are process diagrams thereof. In this embodiment, an epitaxial semiconductor film made of a $p^+/p^-/n^+$ three-layer structure is formed by a similar process to that for Embodiment 12. Namely, in this embodiment, a wafer-like semiconductor substrate 11 made of single crystal Si doped with boron B at a high concentration and having a relative resistance of for example 0.01 to 0.02 Ωcm was prepared.

Then, in this case, an anodizing device of a double cell structure explained referring to FIG. 1 was used, and an electrolytic solution of $HF:C_2H_5OH=1:1$ was filled into both of the first and second cells 1A and 1B, and a current was passed between the Pt electrodes 3A and 3B immersed in the electrolytic solution of the electrolytic solution cells 1A and 1B by a DC current source 2.

Figures 11A, 11B, 11C:
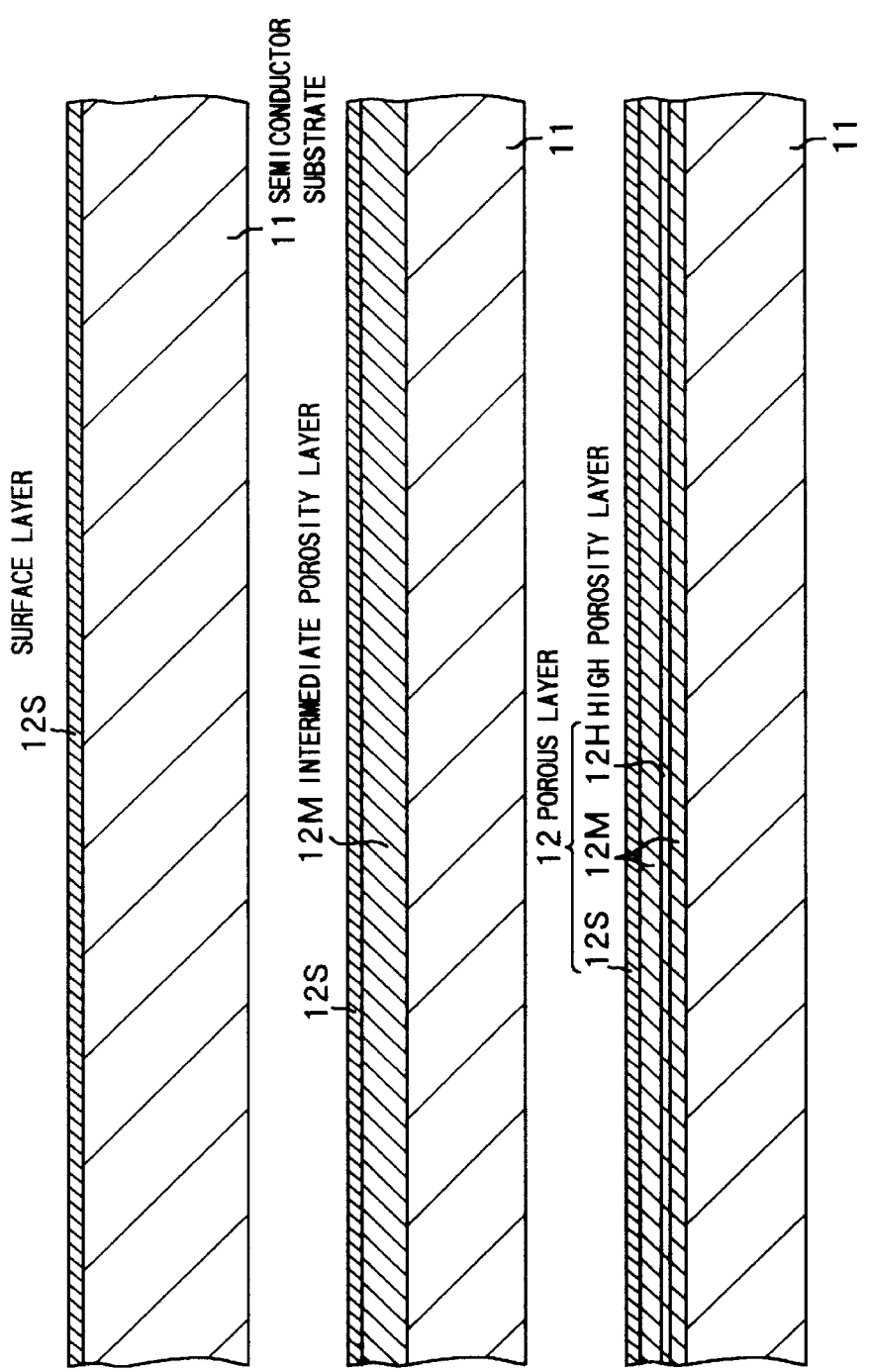
FIGS. 11(a)–11(c) are cross-sectional views illustrating formation of a multilayer porous structure on a semiconductor substrate.

First, a current was supplied with a current density of 1 $mA/cm^2$ for 8 minute to form a surface layer 12S (FIG. 11A). The current supply was stopped once, then a current was supplied with a current density of 7 $mA/cm^2$ for 8 minutes to form an intermediate porosity layer 12M (FIG. 11B). Further, the current supply was stopped once, then a current of 200 $mA/cm^2$ was supplied for 3 seconds. By this, a high porosity layer 12H was formed in the intermediate porosity layer 12M (FIG. 11C). In this way, a porous layer 12 comprised of the surface layer 12S, the intermediate porosity layer 12M, and the high porosity layer 12H is formed.

After forming this porous layer 12, annealing in an $H_2$ atmosphere is carried out in a Si epitaxially growing device by a process similar to that explained referring to Embodiment 2. When performing this, the surface layer 12S of the porous layer 12 is made smooth and the strength near the interface of the intermediate porosity layer 12M and the high porosity layer 12H is weakened.

Figure 12A:
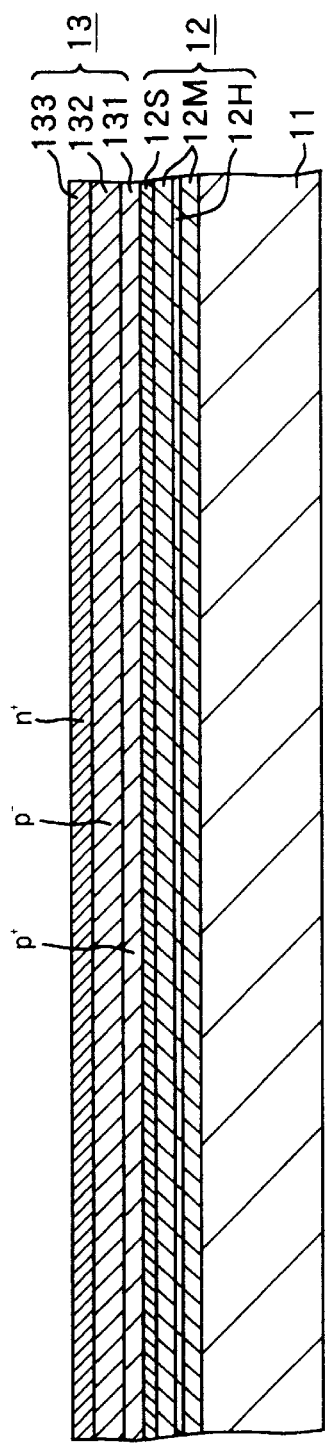
FIGS. 12(a)–12(b) are cross-sectional views illustrating formation of a multilayer semiconductor film on the porous structure shown in FIGS. 11(a)–11(c) and formation and patterning of an insulating layer thereon to define contact holes, respectively.

Thereafter, in the Si epitaxial growing device in which the annealing was carried out, epitaxial growth using $SiH_4$ gas and $B_2H_6$ gas was carried out for 2 minutes to form a first epitaxial semiconductor layer 131 made of $p^+$ Si having a thickness of 0.5 μm and doped with boron B to $10^{19}$ atoms/cm³. Next, the flow rate of the $B_2H_6$ gas was changed and the Si epitaxial growth was carried out for 17 minutes to form a second epitaxial semiconductor layer 132 made of $p^-$ Si having a thickness of 5 μm and doped with boron B to $10^{16}$ atoms/cm³. Further, $PH_3$ gas was supplied in place of the $B_2H_6$ gas and epitaxial growth was carried out for 2 minutes to form a third epitaxial semiconductor layer 133 made of $n^+$ Si doped with phosphorus P to a high concentration of $10^{19}$ atoms/cm³. By this, an epitaxial semiconductor film 13 having a $p^+/p^-/n^+$ structure comprising the first to third epitaxial semiconductor layers 131 to 133 was formed (FIG. 12A).

Figure 12B:
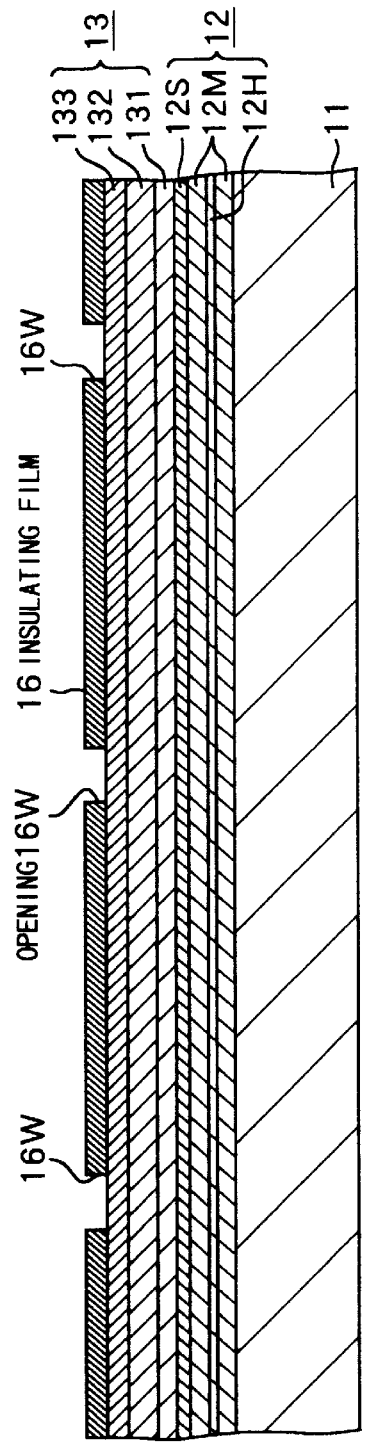

Next, in this embodiment, an $SiO_2$ film, that is, a transparent insulating film 16, is formed on the epitaxial semiconductor film 13 by surface thermal oxidation and then is patterned by photolithography to form openings 16W for contact with an electrode or interconnections (FIG. 12B). The openings 16W can be formed in a parallel array of stripes extending in a direction orthogonal to the sheet surface in the figure while maintaining a required interval between them. It is possible to reduce the production of carriers at the interface and recombination to a maximum extent by the $SiO_2$ film formed in this way.

Figure 13A:
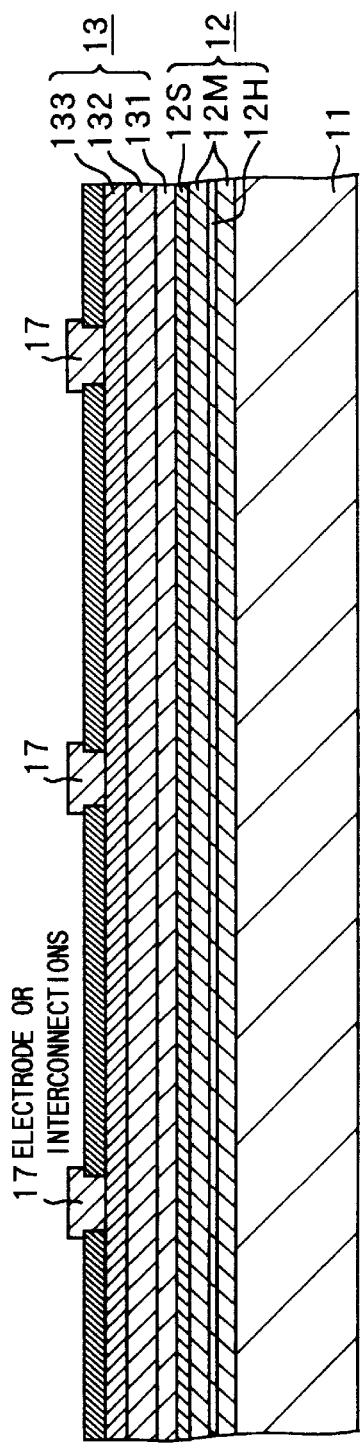
FIGS. 13(a)–13(b) are cross-sectional views illustrating formation of electrodes in the contact holes of the substrate prepared in FIG. 11(c) and attachment of a printed circuit board substrate to the electrodes and semiconductor substrate, respectively.

Next, a metal film is vapor deposited over the entire surface and pattern etching is carried out by photolithography to form the electrodes or interconnections 17 on the light receiving surface side along the stripe-like openings 16W (FIG. 13A). This metal film as the electrodes or interconnections 17 can be constituted by a multilayer film formed by successively vapor depositing for example a Ti film having a thickness of 30 nm, Pd having a thickness of 50 nm, and Ag of a thickness of 100 nm and further applying Ag plating on this. Thereafter, annealing is carried out for 20 to 30 minutes at 400° C.

Figure 13B:
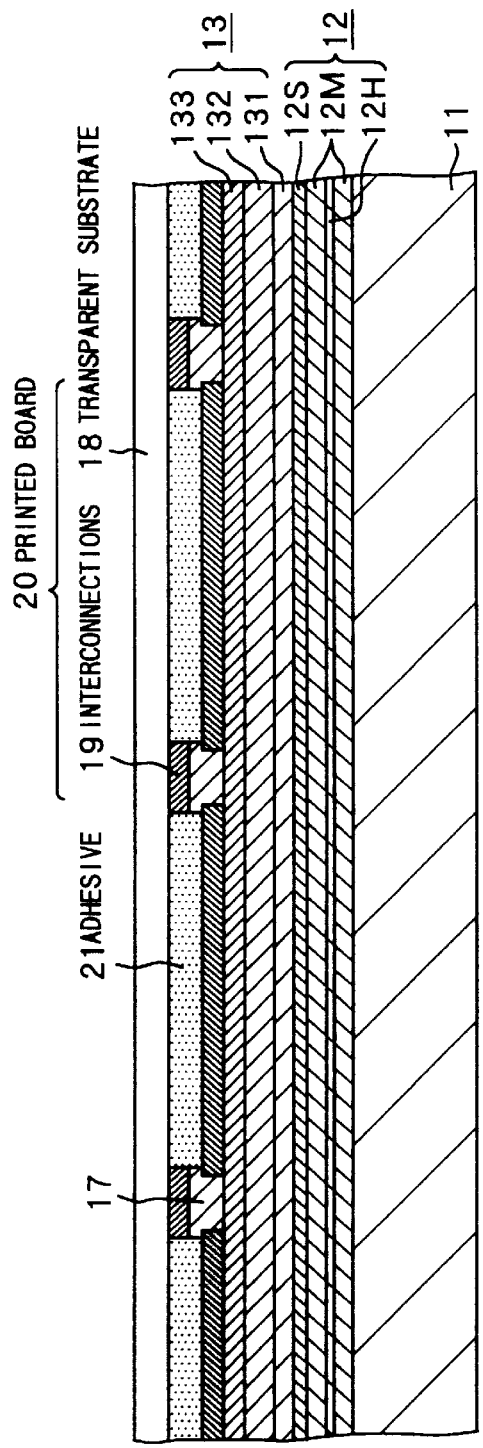

On the other hand, a flexible printed circuit board 20 comprised of the transparent substrate 18 made of, for example, a flexible plastic sheet, on which interconnections 19 of the required circuit are formed, is prepared. This printed circuit board 20 is laid on the epitaxial semiconductor film 13 on which the insulating film 16 is formed, and they are bonded by a binder 21 which is transparent and is insulative. At this time, the interconnections 19 and the electrodes or interconnections 17, which should be connected to each other, are made to face each other and a solder is interposed between them so as to form the electrical connection (FIG. 13B). At this time, as the binder 21, one having a slightly stronger strength than the separation strength of the porous layer is used.

Next, an external force for separating the semiconductor substrate 11 from the printed circuit board 20 is given. When performing this, the semiconductor substrate 11 and the epitaxial semiconductor film 13 are separated at the fragile high porosity layer 12H of the porous layer 12 or the vicinity thereof. As a result, a thin film semiconductor 23, having the epitaxial semiconductor film 13, is obtained on the printed circuit board 20 (FIG. 14A).

In this case, the porous layer 12 remains on the back surface of the thin film semiconductor 23. Silver paste is coated on this back surface and a metal sheet is further bonded on the silver paste to constitute another back surface electrode 24. In this way, a solar cell having a thin film semiconductor 23 having a $p^+/p^-/n^+$ structure is constituted on the printed circuit board 20 (FIG. 14B). In this case, the metal electrode 24 acts also as a film protecting the device layer at the back surface of the solar cell.

Note that, the above Embodiment 14 shows a case where a solar cell which can be similarly made flexible is integrally formed on a flexible printed circuit board, but it is also possible to adopt a structure where the solar cell is integrally formed on a rigid substrate such as a glass substrate.

Next, embodiments of the process for producing a thin film semiconductor or a solar cell, where the anodization conditions for forming particularly the high porosity layer of the porous layer serving as the separation layer are changed, will be explained.

[Embodiment 15]

Figure 15A:
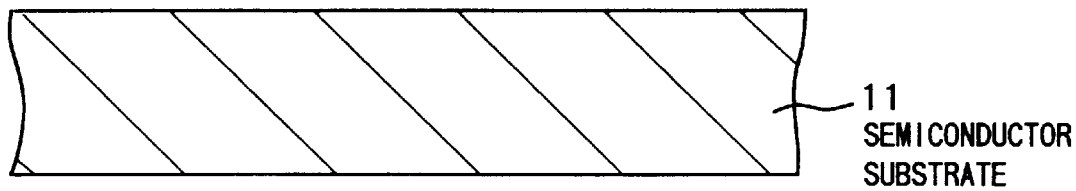
FIGS. 15(a)–15(d) are cross-sectional views illustrating formation of a multilayered porous structure in a semiconductor substrate.

The explanation will be made by referring to the process diagrams of FIG. 15 and FIG. 16. In this case, similar to Embodiment 6, a semiconductor substrate 11 made of single crystal Si doped with boron B and having a resistivity of for example 0.01 to 0.02 Ωcm is prepared (FIG. 15A).

For forming the porous layer in this semiconductor substrate 11, an anodizing device of a double cell structure explained referring to FIG. 1 was used and an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

Figure 15B:
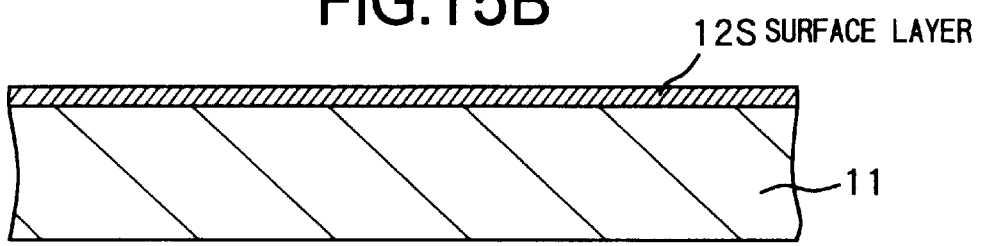
Figure 15C:
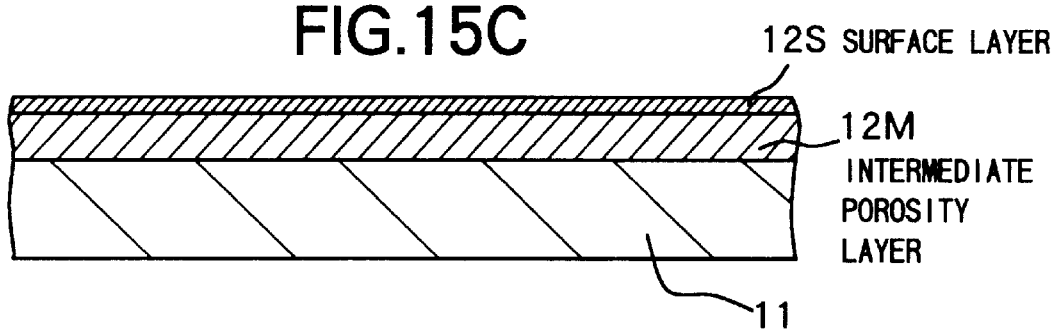
Figure 15D:
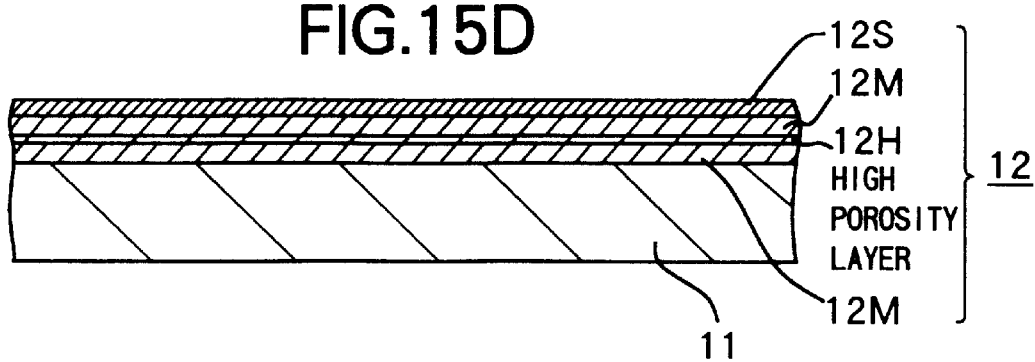

First, a current was supplied with a current density of 1 $mA/cm^2$ for 8 minutes. In this way, a surface layer 12S of a low porosity was formed (FIG. 15B). The current supply was stopped once, then a current was supplied with 7 $mA/cm^2$ for 8 minutes. In this way, an intermediate porosity layer 12M was formed (FIG. 15C). Further, the current supply was stopped once, then, in this embodiment, a current was supplied at 90 $mA/cm^2$ for 5 seconds. By this, a high porosity layer 12H was formed in the intermediate porosity layer 12M (FIG. 15D). After this, a current was supplied at 7 $mA/cm^2$ for 8 minutes. In this way, a porous layer 12 comprising the surface layer 12S, the intermediate porosity layer 12M, and the high porosity layer 12H is formed.

Figure 16A:
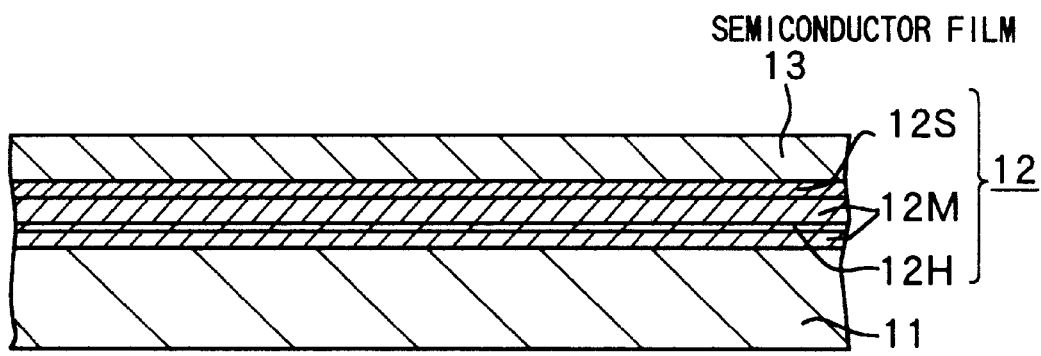
FIGS. 16(a)–16(b) are cross-sectional views illustrating formation of an epitaxially grown semiconductor thin film on the porous substrate of FIG. 15(d) and separation of the semiconductor thin film from the semiconductor substrate, respectively.

Thereafter, annealing similar to that in Embodiment 2 was carried out and epitaxial growth of Si was carried out for 17 minutes on the porous layer 12 to form an epitaxial semiconductor film 13 made of single crystal Si having a thickness of about 5 μm (FIG. 16A).

Figure 16B:
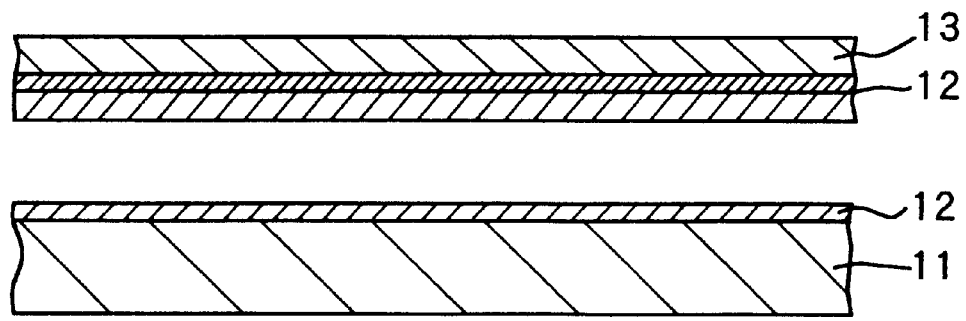

Then, an external force was given in a direction for separating the epitaxial semiconductor film 13 from the semiconductor substrate 11. When performing this, the epitaxial semiconductor film 13 is separated at the high porosity layer 12H or in the vicinity thereof, and the thin film semiconductor 23 is obtained (FIG. 16B).

[Embodiment 16]

Figure 17A:
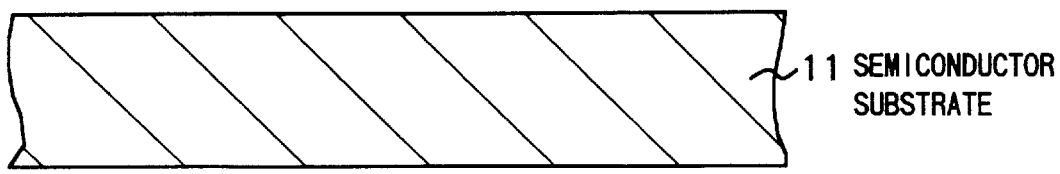
FIGS. 17(a)–17(e) are cross-sectional views illustrating formation of another porous structure on a semiconductor substrate, and formation of an epitaxially grown semiconductor thin film thereon.

The explanation will be made by referring to the process diagram of FIG. 17. In this case, similar to Embodiment 6, a semiconductor substrate 11 made of single crystal Si doped with boron B and having a resistivity of for example 0.01 to 0.02 Ωcm is prepared (FIG. 17A).

For forming the porous layer in this semiconductor substrate 11, an anodizing device of a double cell structure explained referring to FIG. 1 was used and an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

Figure 17B:
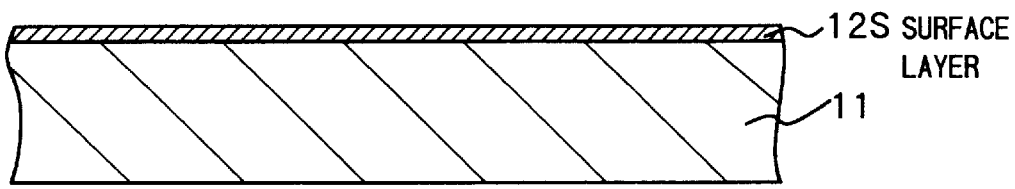
Figure 17C:
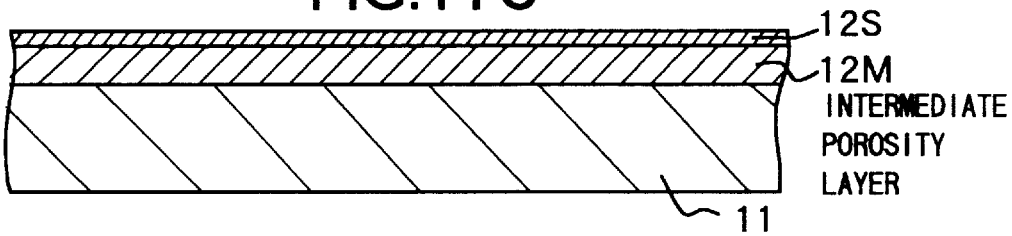
Figure 17D:
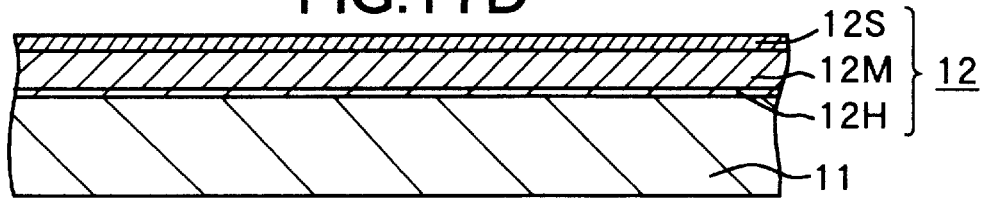

First, a current was supplied with a current density of 1 $mA/cm^2$ for 8 minutes. In this way, a surface layer 12S of a low porosity was formed (FIG. 17B). The current supply was stopped once, then a current was supplied at 7 $mA/cm^2$ for 8 minutes. In this way, an inter-mediate porosity layer 12M was formed (FIG. 17C). Further, the current supply was stopped once, then, in this embodiment, a current was supplied at 30 $mA/cm^2$ for 15 seconds. By this, a high porosity layer 12H was produced under the intermediate porosity layer 12M (FIG. 17D). After this, a current was supplied at 7 $mA/cm^2$ for 8 minutes. In this way, a porous layer 12 comprising the surface layer 12S, the intermediate porosity layer 12M, and the high porosity layer 12H is formed.

Figure 17E:
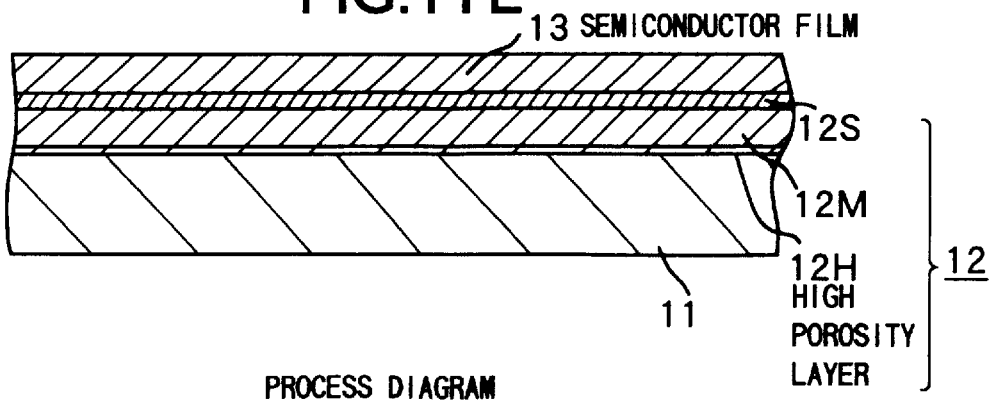

Thereafter, annealing similar to that in Embodiment 2 was carried out. Then, epitaxial growth of Si was carried out for 17 minutes on the porous layer 12 to form an epitaxial semiconductor film 13 made of single crystal Si having a thickness of about 5 μm (FIG. 17E).

Then, an external force was given in the direction for separating the epitaxial semiconductor film 13 from the semiconductor substrate 11. In this case, however, there were some cases where the epitaxial semiconductor film 13 could not always be separated from the semiconductor substrate 11 well.

[Embodiment 17]

Figure 18A:
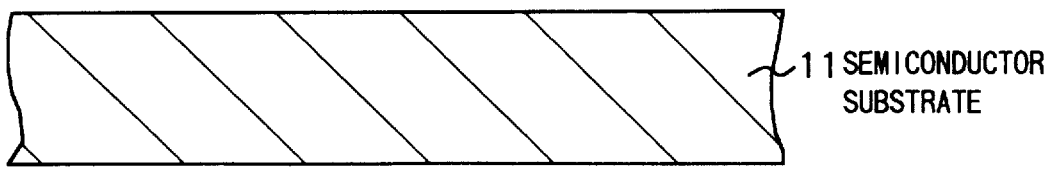
FIGS. 18(a)–18(e) are cross-sectional views illustrating formation of another porous structure on a semiconductor substrate and formation of a thin film semiconductor thereon.

The explanation will be made by referring to the process diagram of FIG. 18. In this case, similar to Embodiment 6, a semiconductor substrate 11 made of single crystal Si doped with boron B and having a resistivity of for example 0.01 to 0.02 Ωcm is prepared (FIG. 18A).

For forming the porous layer in this semiconductor substrate 11, an anodizing device of a double cell structure explained referring to FIG. 1 was used and an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

Figure 18B:
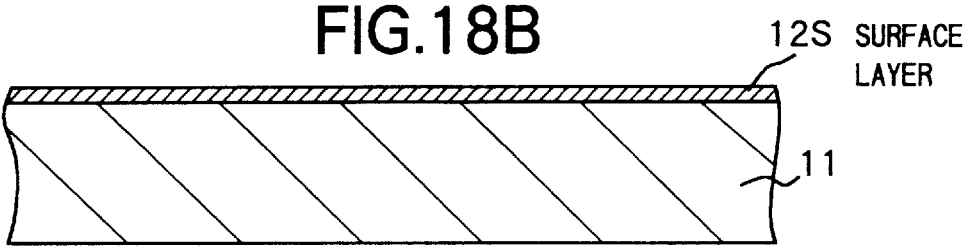
Figure 18C:
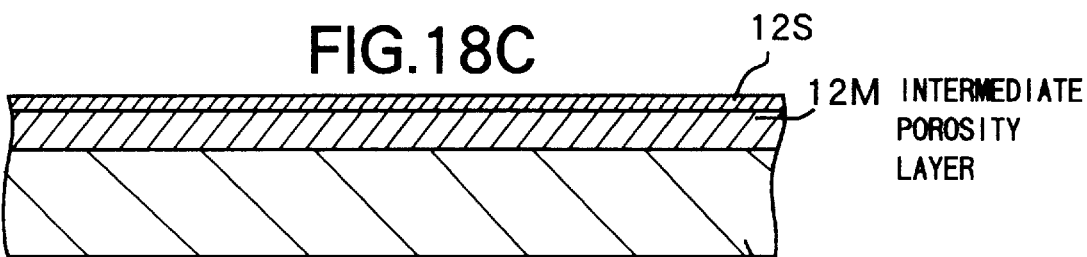
Figure 18D:
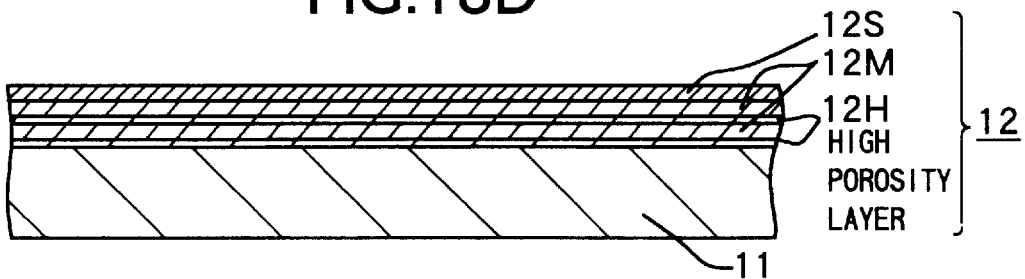

First, a current was supplied with a current density of 1 $mA/cm^2$ for 8 minutes. In this way, a surface layer 12S of low porosity was formed (FIG. 18B). The current supply was stopped once, then a current was supplied with 7 $mA/cm^2$ for 8 minutes. In this way, an intermediate porosity layer 12M was formed (FIG. 18C). Further, the current supply was stopped once, then, in this embodiment, a current was supplied at 80 $mA/cm^2$ for 5 seconds. By performing this, a high porosity layer 12H was respectively produced in the intermediate porosity layer 12M and beneath the intermediate porosity layer 12M, that is, at the interface with the semiconductor substrate 11 (FIG. 18D). After this, a current was supplied at 7 $mA/cm^2$ for 8 minutes. In this way, a porous layer 12 comprising the surface layer 12S, the intermediate porosity layer 12M, the high porosity layer 12H, the intermediate porosity layer 12M, and the high porosity layer 12H is formed.

Figure 18E:
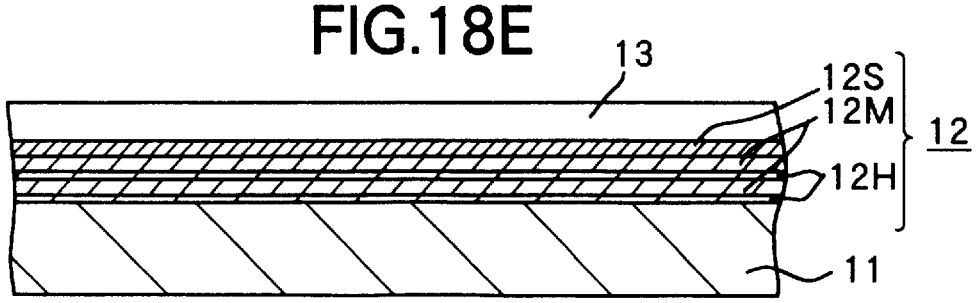

Thereafter, annealing similar to that in Embodiment 2 was carried out. Epitaxial growth of Si was carried out for 17 minutes on the porous layer 12 to form an epitaxial semiconductor film 13 made of single crystal Si having a thickness of about 5 μm (FIG. 18E).

Then, an external force was given in a direction for separating the epitaxial semiconductor film 13 from the semiconductor substrate 11. When performing this, the epitaxial semiconductor film 13 is separated at either high porosity layer 12H of the porous layer 12, and a thin film semiconductor made of the epitaxial semiconductor film 13 is obtained.

As explained above, as apparent from Embodiment 6 (FIG. 8), Embodiment 15 (FIG. 15 and FIG. 16), Embodiment 16 (FIG. 17), Embodiment 17 (FIG. 18), and further Embodiment 5 (FIG. 8), in the step for forming the high porosity layer 12H, the position of the high porosity layer 12H changes according to the amount of current supply for the anodization and further the method of supply of the cur-rent. For example, in a case where an electrolytic solution of the anodization of $HF:C_2H_5OH=1:1$ is used, if the current density is set to about 40 to 70 $mA/cm^2$, by the selection of the current supply time, the high porosity layer 12H can be formed in the lowermost layer of the porous layer, that is, at the interface of the semiconductor substrate 11 where the porous layer is not produced, and in the high current range of from 90 $mA/cm^2$ to for example about 300 $mA/cm^2$, it could be formed in the intermediate porosity layer 12M. Then, also in the high current range, when this current supply is made intermittent for a short time, it can be formed in the intermediate porosity layer 12M. It was confirmed that the position this high porosity layer could be selected according to design with a good reproducibility.

Further embodiments of the process for producing the solar cell according to the present invention will be explained.

[Embodiment 18]

In this embodiment, it is made easy to lead out the terminals from the electrodes on the light receiving side, that is, lead out the conductors. This will be explained by referring to FIG. 11, FIG. 12, FIG. 13 and FIG. 19. In this embodiment, similar steps as those explained by referring to FIGS. 11A to 11C, FIGS. 12A and 12B, and FIG. 13A of Embodiment 14 are employed. Further, in this embodiment, an epitaxial semiconductor film made of a $p^+/p^-/n^+$ three-layer structure is formed by a similar process as that for Embodiment 12. Namely, a wafer-like semiconductor substrate 11 made of single crystal Si doped with boron B at a high concentration and having a relative resistance of for example 0.01 to 0.02 Ωcm was prepared.

Next, in this case, an anodizing device of a double cell structure explained referring to FIG. 1 was used and an electrolytic solution made of $HF:C_2H_5OH=1:1$ was filled into both of the first and second cells 1A and 1B. Then, a current was passed between the Pt electrodes 3A and 3B immersed in the electrolytic solutions of the electrolytic solution cells 1A and 1B by a DC current source 2.

First, a current was supplied with a current density of 1 $mA/cm^2$ for 8 minutes to form a surface layer 12S (FIG. 11A). The current supply was stopped once, then a current was supplied with a current density of 7 $mA/cm^2$ for 8 minutes to form an intermediate porosity layer 12M (FIG. 11B). Further, the current supply was stopped once, then a current of 200 $mA/cm^2$ was supplied for 3 seconds. By performing this, a high porosity layer 12H was formed in the intermediate porosity layer 12M (FIG. 11C). In this way, a porous layer 12 comprised of the surface layer 12S, the intermediate porosity layer 12M, and the high porosity layer 12H is formed.

After forming this porous layer 12, annealing is carried out in an $H_2$ atmosphere in a Si epitaxially growing device by a process similar to that explained by referring to Embodiment 2. When performing this, the surface layer 12S is made smooth and the strength near the interface of the intermediate porosity layer 12M and the high porosity layer 12H is weakened.

Thereafter, in the Si epitaxial growing device in which the annealing was carried out, epitaxial growth using $SiH_4$ gas and $B_2H_6$ gas was carried out under the normal pressure for 2 minutes to form a first epitaxial semiconductor layer 131 made of $p^+$ Si having a thickness of 0.5 $\mu m$ and doped with boron B to $10^{19}$ atoms/$cm^3$. Next, the flow rate of the $B_2H_6$ gas was changed and the Si epitaxial growth was carried out for 17 minutes to form a second epitaxial semiconductor layer 132 made of $p^-$ Si having a thickness of 5 $\mu m$ and doped with boron B to $10^{16}$ atoms/$cm^3$. Further, $PH_3$ gas was supplied in place of the $B_2H_6$ gas and the epitaxial growth was carried out for 2 minutes to form a third epitaxial semiconductor layer 133 made by $n^+$ Si doped with phosphorus P to a high concentration of $10^{19}$ atoms/$cm^3$. An epitaxial semiconductor film 13 having a $p^+/p^-/n^+$ structure comprising the first to third epitaxial semiconductor layers 131 to 133 was formed as a result (FIG. 12A).

Next, in this embodiment, an $SiO_2$ film, that is, a transparent insulating film 16, was formed on the epitaxial semiconductor film 13 by surface thermal oxidation and was patterned by photolithography to form openings 16W for contact with the electrodes or interconnections (FIG. 12B). The openings 16W can be formed in a parallel array of stripes extending in a direction orthogonal to the sheet surface in the figure while maintaining a required interval between them. It is possible to reduce the production of carriers at the interface and recombination to a maximum extent by the $SiO_2$ film formed in this way.

Figure 19A:
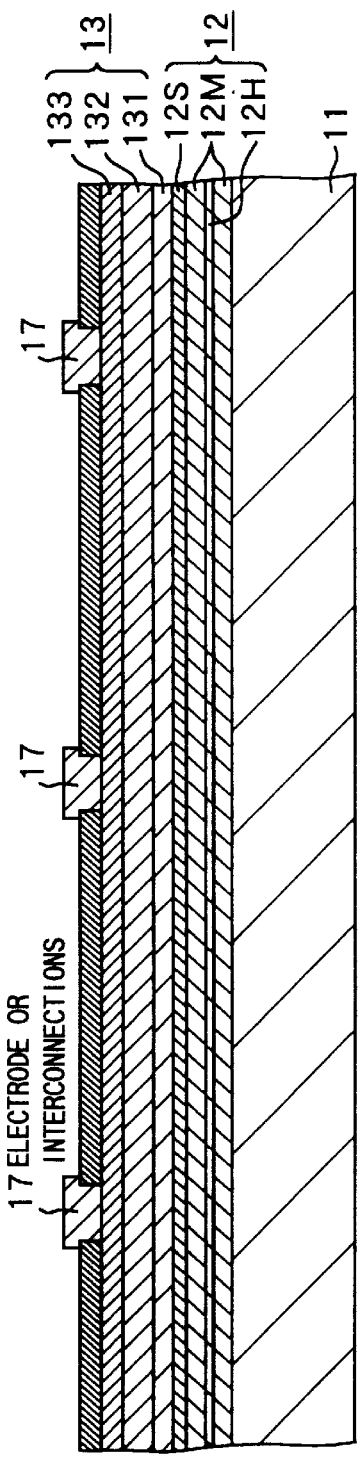
FIGS. 19(a) and 19(b) are cross-sectional views illustrating formation of an electrode structure on the semiconductor thin film and attachment of conductor members and a transparent substrate to the solar panel panel structure, respectively.

Next, a metal film is vapor deposited over the entire surface and pattern etching is carried out by photolithography to form the electrodes or interconnections 17 on the light receiving surface side along the stripe-like openings 16W (FIG. 13A, FIG. 19A). This metal film forming the electrodes or interconnections 17 can be constituted by a multi-layer film formed by successively vapor depositing for example a Ti film having a thickness of 30 nm, Pd having a thickness of 50 nm, and Ag of a thickness of 100 nm and further applying Ag plating on this. Thereafter, annealing is carried out for 20 to 30 minutes at 400° C.

Figure 19B:
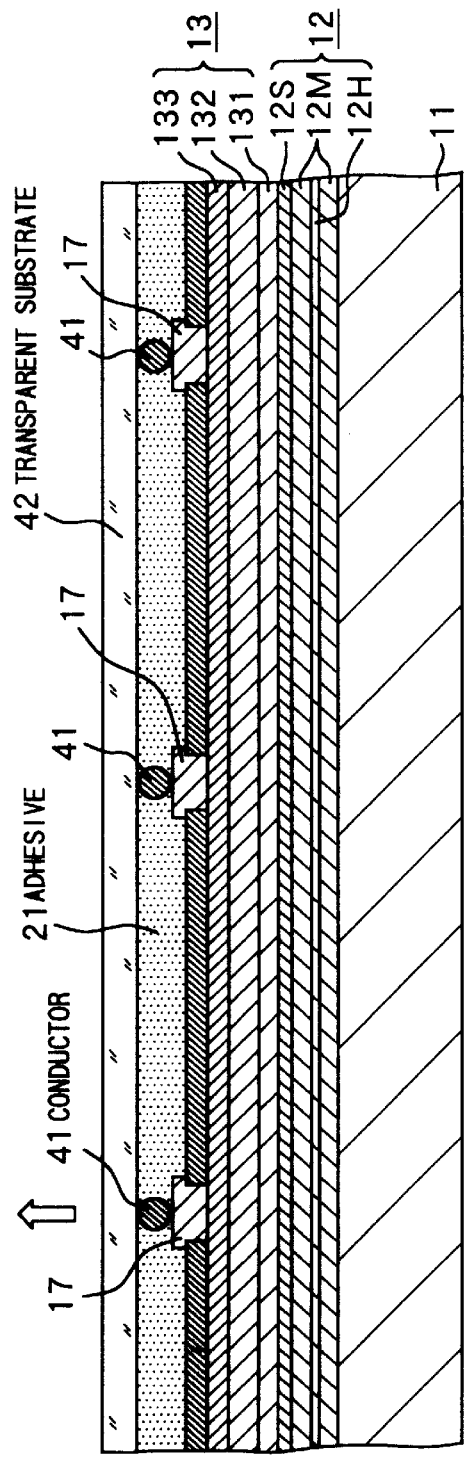

Next, in this embodiment, on the stripe-like electrodes or interconnections 17, conductors 41, i.e., in this embodiment, metal wires, are respectively bonded along them. A transparent substrate 42 is bonded onto this by a transparent binder 21 (FIG. 19B). The bonding of the conductors 41 to the electrodes or interconnections 17 can be by soldering. One or the other ends of these conductors 41 are respectively made longer than the electrodes or interconnections 17 and led outward.

Thereafter, an external force is given for separating the semiconductor substrate 11 and the transparent substrate 42 from each other. When performing this, the semiconductor substrate 11 and the epitaxial semiconductor film 13 are separated at the fragile high porosity layer 12H or the vicinity thereof, and a thin film semiconductor 23, to which the epitaxial semiconductor film 13 is bonded, is obtained on the transparent substrate 42 (FIG. 20A).

In this case, the porous layer 12 remains on the back surface of the thin film semiconductor 23. Silver paste is coated on this back surface and a sheet of metal is further bonded with it to constitute another back surface electrode 24. In this way, a solar cell having a thin film semiconductor 23 having a $p^+/p^-/n^+$ structure is constituted on the printed circuit board 20 (FIG. 20B). This metal electrode 24 acts also as a film protecting the device layer on the back surface of the solar cell.

In the solar cell formed in this way, despite the fact that the light receiving side electrodes or interconnections 17 are covered by the transparent substrate 42, since the conductors 41 are used for the electrical lead out to the outside, electrical connection to the outside is easy. Further, since, for example, as in the above embodiments, the conductors 41 are led out from a plurality of electrodes or interconnections 17 respectively brought into contact with the epitaxial semiconductor film 13, that is, the active portion of the solar cell, the number of serially connected resistors of the solar cell can be reduced.

Further, since the conductors 41 are led to the outside in this way, when a plurality of solar cells are connected to each other, they can be easily connected. Next, an explanation will be made of an embodiment where a plurality of solar cells are connected to each other and arranged on a common substrate.

[Embodiment 19]

Process diagrams of this embodiment are given in FIG. 21 and FIG. 22, but the steps up to FIG. 19B of Embodiment 18 are the same as those of Embodiment 19, so an explanation of the steps up to this overlapping that of Embodiment 18 will be omitted. In FIG. 21 and FIG. 22, parts corresponding to those in FIG. 19 and FIG. 20 are given the same references and overlapping explanations are omitted.

In this embodiment, a plurality of semiconductor substrates 11 similar to that shown in FIG. 19B, that is, substrates where the porous layer 12 is formed on the surface, an epitaxial semiconductor film 13 having a $p^+/p^-/n^+$ structure is formed on this, the electrodes or interconnections 17 are brought into contact with predetermined portions of this, and conductors 41 are bonded to this are prepared. These are bonded to a common transparent substrate 42 by a transparent binder 21. In this case as well, the end portions of a plurality of conductors 41 are led from the semiconductor substrates 11 to the outside (FIG. 21A).

Thereafter, an external force is given in a direction for separating the semiconductor substrates 11 and the common transparent substrate 42 from each other. When performing this, the semiconductor substrate 11 and the epitaxial semiconductor film 13 are separated at the fragile high porosity layer 12H or the vicinity thereof and thin film semiconductors 23 made by epitaxial semiconductor films 13 are arranged on the common transparent substrate 42 (FIG. 21B).

The porous layer 12 remains on each back surface of these thin film semiconductors 23. Silver paste is coated on each back surface and a metal sheet is further bonded to constitute another back surface electrode 24. In this way, the common transparent substrate 42 has arranged on it a plurality of solar cell elements 3 in each of which the active portion of the solar cell is formed by a thin film semiconductor 23 having a $p^+/p^-/n^+$ structure, a light receiving surface side electrode or interconnections 17 are formed, and an electrode 24 is formed on the back surface (FIG. 21C).

Figure 22A:
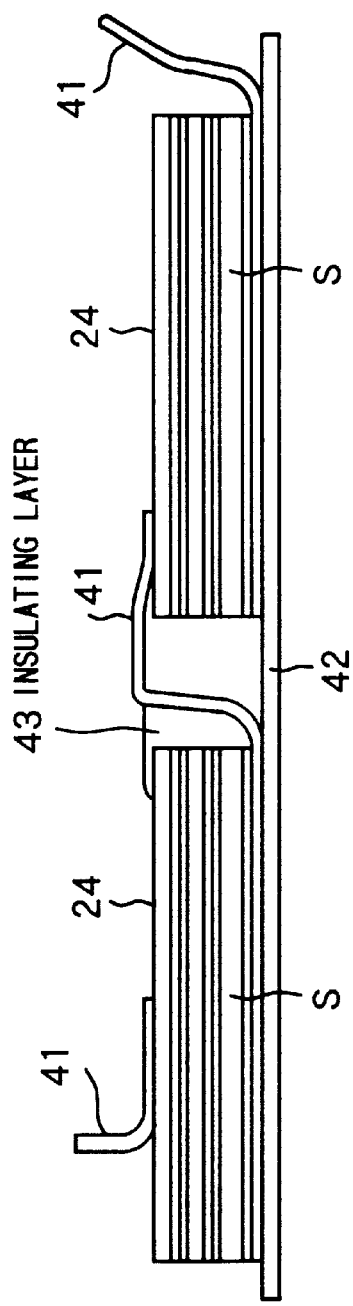
FIGS. 22(a)–22(b) are side elevation views illustrating the method showing the completion steps for the solar panels being prepared in FIGS. 21(a)–21(c)

Then, one end of a conductor 41 is soldered to each of the required electrodes 24 and an insulating material 43 such as resin is filled between the solar cell elements to insulate them from each other (FIG. 22A). In this case, the free ends of the conductors 41 on the light receiving surface side of the solar cell elements S which should be connected to each other are led to the outside of the insulating material 43, and the free ends are connected to the back surface electrodes 24 of for example adjoining solar cell elements S by soldering etc.

Figure 22B:
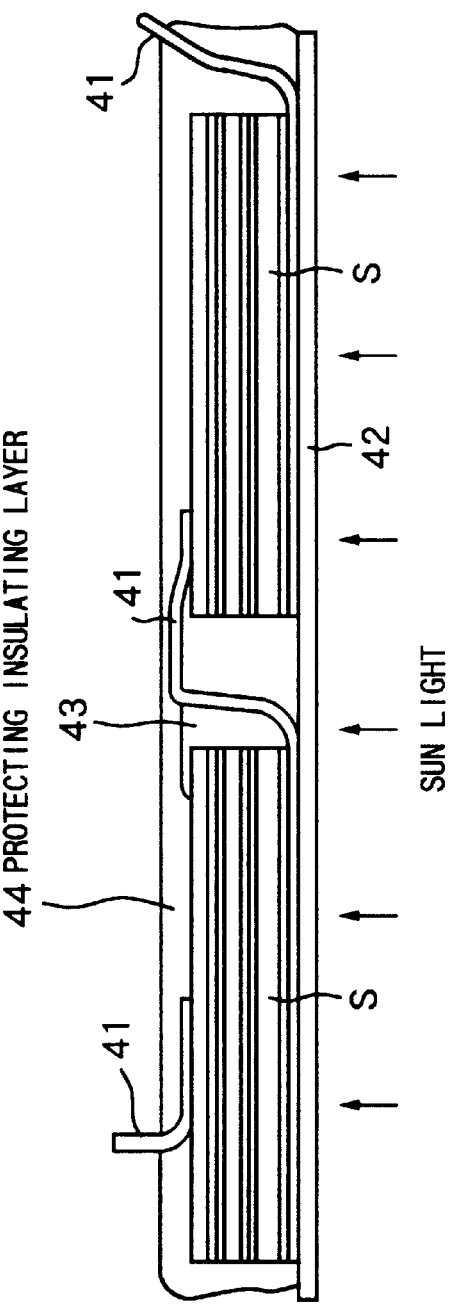

The free ends of the conductors 41, of the first stage and the last stage of the plurality of solar cell elements 3 connected to each other, are led to the outside, then a protective insulating layer 44 is applied by molding etc. in a manner to expose the transparent substrate 42 side and to cover the solar cell elements S. In this way, a solar cell in which a plurality of solar cell elements S are arranged on a common transparent substrate 42 and connected to each other in series is constituted (FIG. 22B). It goes without saying that the incident light such as sunlight strikes this solar cell from the transparent substrate 42 side.

Note that, in the above examples, the conductor 41 is not limited to a metal wire. It is also possible to constitute the same by for example a metal strip etc.

Further, it is possible to constitute the transparent substrate 42 by a rigid substrate such as a glass substrate or constitute the same by a flexible substrate made sheet. Where it is constituted by a flexible substrate in this way, the entire solar cell can be constituted flexible.

When producing a solar cell in this way, regardless of the fact that a transparent substrate is arranged on the light receiving surface, the conductors can be led out from the electrodes 17, so it is possible to reduce the number of serially connected resistors. Also, the conductors are connected in a state where they are formed on the semiconductor substrate 11 and are mechanically strong and stable before the separation of the thin film solar cell, therefore the connection can be reliably and easily carried out on a mass production basis. Further, a plurality of solar cells can be connected to each other easily by leading out the conductors in this way.

In FIG. 21 and FIG. 22, only two solar cell elements S were shown, but it goes without saying that more than two solar cell elements can be arranged and connected.

Further, in a solar cell, where the porous layer 12 remains on the back surface of the thin film semiconductor, the porous layer 12 also has a high impurity concentration when the semiconductor substrate 11 has a high impurity concentration. Thus there is sometimes the inconvenience that this porous layer 12 will absorb the light. In this case, this porous layer 12 can be removed by for example etching. Next, an explanation will be made of an embodiment of the process for producing a light emitting diode according to the present invention.

[Embodiment 20]

The explanation will be made by referring to FIG. 25 to FIG. 28. In this embodiment, a p-type Si single crystal semiconductor substrate 11 was prepared (FIG. 25A). The n-type impurity phosphorus was diffused in one main surface thereof to form an retype semiconductor layer 101 (FIG. 25B).

Using the anodizing device of FIG. 1, under irradiation of light, a current of 50 mA/cm$^2$ was supplied for 30 minutes to perform the anodization and thereby form a first high porosity layer 12H1 having a relatively high porosity in the surface of the semiconductor layer 101 (FIG. 25C). Next, without the irradiation of light, anodization was performed by supplying a current of 7 mA/cm$^2$ for 10 minutes to form an intermediate porosity layer 12M to a depth traversing the semiconductor layer 101 (FIG. 25D). Next, similarly without irradiating light, anodization was carried out at 200 mA/cm$^2$ for 7 seconds to form a second high porosity layer 12H2 acting as the separation layer in the intermediate porosity layer 12M (FIG. 25E).

On the high porosity layer 12H1 of the surface, stripe-like electrodes 102 extending in a direction orthogonal to the sheet surface in for example FIG. 26 were arranged in parallel by for example vapor deposition of Au (FIG. 26A) and photolithographic patterning and etching to provide stripe-like electrodes 102. Other methods for forming and attaching electrodes known to those skilled in this art may also be used. A transparent binder 103 was coated on the surface of the substrate 11 on which the electrodes 102 were formed (FIG. 26B) and a transparent substrate 104 was adhered on top (FIG. 26C).

Figure 26A:
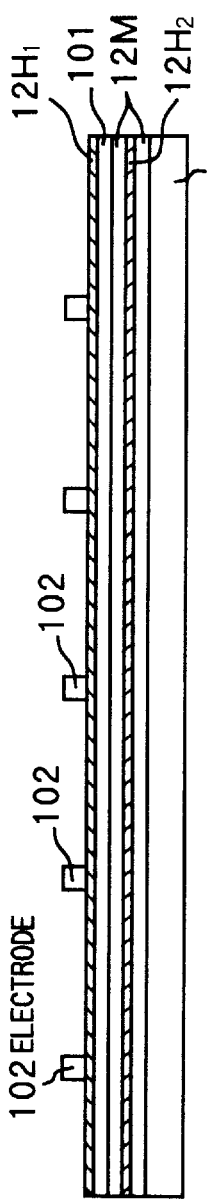
FIGS. 26(a)–26(d) are cross-sectional views illustrating the steps of attaching electrodes and a support substrate and separating a diode substrate from the semiconductor substrate in accordance with an embodiment of the invention.
Figure 26B:
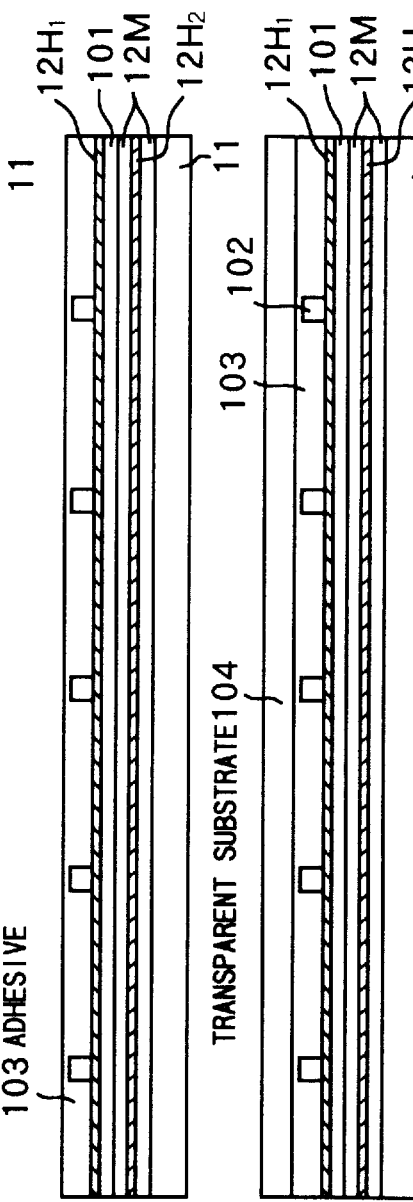
Figure 26C:
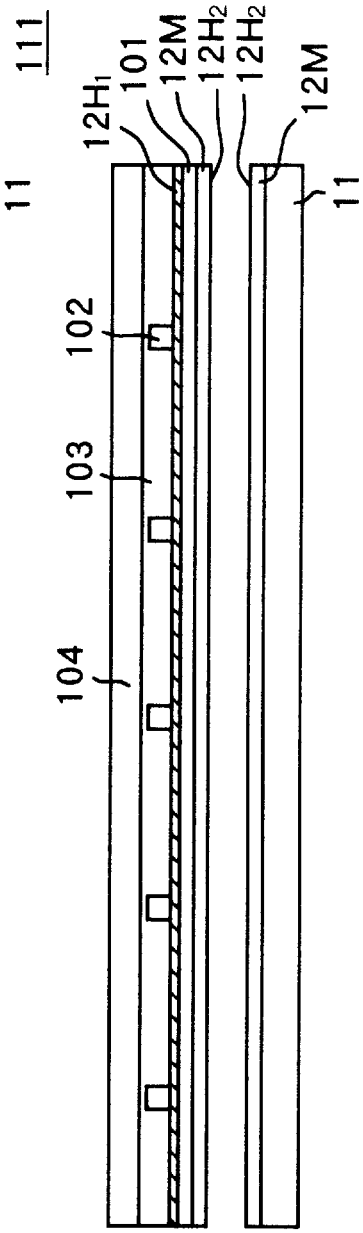
Figure 26D:
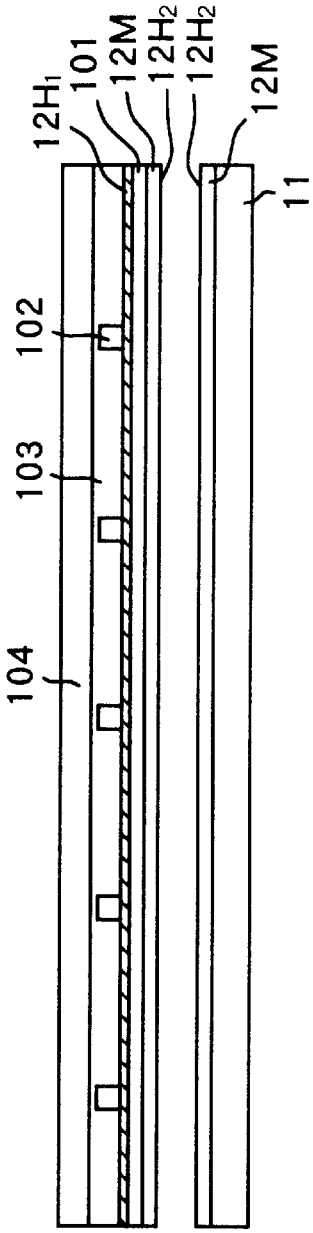

Next, using the second high porosity layer 12H2 as the separation layer, the front surface side, to which the transparent substrate 104 of the semiconductor substrate 11 was bonded, was separated from the substrate 11 to constitute the light emitting diode substrate 111 (FIG. 26D). The substrate 111 constituted in this way has a p-n junction comprised of a p-type semiconductor layer 105 formed by the intermediate porosity layer 12M and a p-type high porosity layer 12H1 formed on the surface of the n-type semiconductor layer 101 formed on this.

Figures 28A, 28B:
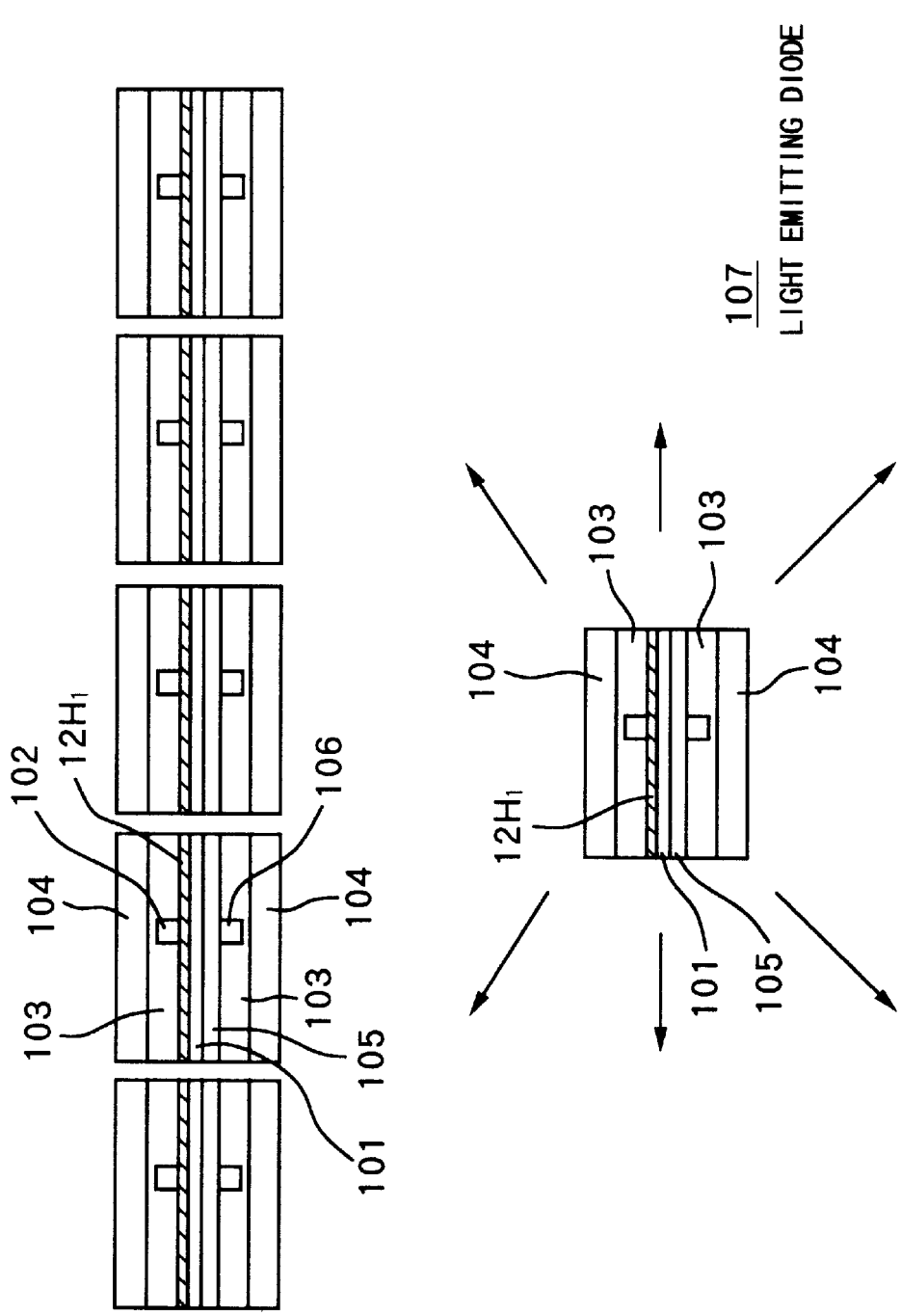
FIG. 28A and FIG. 28B are sectional views of the process.

On the back surface (separation surface) of the substrate 11, similarly, stripe-like back surface electrodes 106 comprised for example of an Au vapor deposited layer are formed facing the stripe-like electrodes 102 (FIG. 27A). A transparent binder 103 is coated on the electrode 106-forming surface of the substrate 111 (FIG. 27B) and a transparent substrate 104 is bonded (FIG. 27C). The substrate 111 is divided for every pair of electrodes 102 and 106 (FIG. 28A) to obtain the intended light emitting diodes 107 (FIG. 28B). The light emitting diode, i.e., so-called EL, constituted in this way, emits light as indicated by an arrow in FIG. 28B. The main light emitting portion becomes the high porosity layer 12H1 and has a high light emitting efficiency. This is because the super lattice structure is constituted by the high porosity layer 12H1, the active surface of which being formed sufficiently thin. The above embodiment shows a case where the semiconductor layer 101 is formed by the diffusion of impurities, but it is also possible to form this by ion implantation of the impurities, or by an epitaxially grown semiconductor layer, solid phase growth, CVD (Chemical Vapor Deposition), etc. Further, the semiconductor layer 101 is not always formed on entire surface. It can be formed at predetermined parts by selective diffusion, ion implantation, etc. as well. Further, the semiconductor substrate 11 can be constituted as an n-type too, and the light emitting efficiency can be enhanced by using a high resistance substrate. Further, when the substrate 111 is thermally oxidized in an oxygen atmosphere and then separated, a blue-shift of the emitted light wavelength can be obtained.

Note that, the above examples showed a case where the semiconductor film 3 was peeled from the semiconductor substrate 11 by giving an external force for separating them from each other, but it is also possible to peel the semiconductor film 3 by supersonic wave vibration (ultrasonic irradiation) in certain cases.

In the above examples, in the anodization, peeling of the semiconductor film from the substrate may occur due to the supply of a larger current, the long time current supply, etc. This Si waste is sometimes adhered to the electrolytic liquid cell. In this case, by taking the substrate 11 out and then filling fluoronitric acid into the cell in place of the electrolytic solution, the unnecessary semiconductor waste such as Si can be removed by etching. Further, the device for performing the anodization is not limited to the example of FIG. 2. A device immersing the semiconductor substrate in a single cell can also be used.

According to the process the present invention, the porous layer is formed in the surface of the semiconductor substrate and a semiconductor is epitaxially grown on this and then peeled, therefore the semiconductor substrate is consumed by only the thickness of the porous portion. After the formation and peeling of the epitaxial semiconductor film, it is possible to grind the surface of the semiconductor substrate and repeat the formation of the porous layer, the formation of the epitaxial semiconductor film, and the peeling. Therefore, repeated use of the semiconductor substrate is possible, and therefore the semiconductor film can be cheaply produced. Further, when the semiconductor substrate becomes thin due to the repeated use, this semiconductor substrate per se can be used as the thin film semiconductor, for example, used for production of a solar cell. Accordingly, the semiconductor substrate never becomes useless and can be used with almost no waste. This also makes it possible to reduce the costs.

Further, by epitaxially growing on a semiconductor substrate, reduced in thickness by production of a thin film semiconductor or solar cell, a semiconductor, having a thickness corresponding to this reduction of thickness so as to repeatedly produce a thin film solar cell, permanent use of the same semiconductor substrate becomes possible and therefore solar cells can be produced at a further lower cost and lower energy.

Further, according to the process of the present invention, a method in which a support substrate such as a printed circuit board is bonded onto the epitaxial semiconductor film, the substrate and the epitaxial semiconductor film are integrally joined, and then the support substrate is peeled from the semiconductor substrate together with the epitaxial semiconductor film, therefore the type of this substrate is not limited and a thin film single crystal or solar cell can be formed on a substrate which never was able to be considered by the conventional method in semiconductor technology, for example, metal plate, ceramic, glass, and resin.

Further, where the method of merely epitaxially growing the semiconductor layer on a porous layer, having a single porosity, is adopted, it is necessary to reduce the porosity of the porous layer which becomes the seeds of the crystal growth so as to enhance the crystallinity of the semiconductor film, therefore, at anodization, it is necessary to lower the current density and raise the HF mixing ratio of the electrolytic solution. However, when the porosity is lowered in this way, the porous layer becomes hard, and the separation of the epitaxial semiconductor film becomes difficult. Therefore, when the current density is raised in the anodization and the HF mixing ratio of the electrolytic solution is reduced so as to raise the porosity for weakening the separation strength, the separation becomes easier, but the crystallinity of the epitaxial semiconductor film becomes extremely poor. However, as mentioned before, by forming a porous layer having two natures, i.e., where the porosity of the surface part of the porous layer is made smaller and the porosity of the internal portion of the porous layer is larger, the epitaxial semiconductor film can be formed well on the porous layer and in addition the epitaxial semiconductor film can be easily separated. For example, it is also possible to form a porous layer which is so weak that it can be easily separated by for example a supersonic wave.

Further, in the high porosity layer to be formed as the a part of porous layer, the larger the porosity, the easier the peeling, but the strain is large and the influence thereof reaches up to the surface layer of the porous layer. For this reason, cracking sometimes occurs in the surface layer. Further, when performing the epitaxial growth, it becomes a cause inducing defects in the epitaxial semiconductor film. Contrary to this, as mentioned before, by forming an intermediate porosity layer having a slightly higher porosity than that of the surface layer between the layer having a very high porosity and the surface layer having a low porosity as a buffer layer for relieving the strain generated from these layers, an epitaxial semiconductor film which is easy to peel and has a good quality can be formed.

Further, according to the present invention, in the anodization with a high current density, by intermittently passing the current, the high porosity layer 12H can be formed in the porous layer at the bottom of the porous layer or the vicinity thereof, therefore the surface layer and the high porous layer, acting as the peeling layer, can be spaced apart to the highest limit, and therefore the buffer layer can be made thin, the thickness of the porous layer is reduced by that amount, and the consumption of the semiconductor substrate can be reduced, thus it becomes possible to further lower the costs.

Further, in the process of the present invention, in the anodization with a low current density, when the porosity of the buffer layer, to be formed between the surface layer and peeling layer, is gradually increased toward the internal portion by gradually increasing the current, the function of the buffer layer can be further enhanced.

Further, by performing the anodization in an electrolytic solution containing a mixture of hydrogen fluoride and ethanol or hydrogen fluoride and methanol, the porous layer can be easily formed. In this case, by changing the composition of this electrolytic solution also when changing the current density of the anodization, the range of adjustment of porosity becomes further larger.

Further, generation of unevenness at the surface of the porous layer becomes conspicuous due to irradiation of light during the anodization and the crystallinity of the epitaxial semiconductor film becomes poor, but in the present invention, by performing the anodization in a dark place, this unevenness can be reduced or avoided and an epitaxial semiconductor film having a good crystallinity can be formed.

Further, by heating the porous layer in a hydrogen gas atmosphere after formation, the surface of the surface layer of the porous layer becomes smooth and thus an epitaxial semiconductor film having a good crystallinity could be formed. Further, by thermally oxidizing the porous layer after formation and before the heating step in the hydrogen gas atmosphere, the internal portion of the porous layer is oxidized and therefore even next annealing in hydrogen, it becomes hard to cause a large structural change in the porous layer and it becomes hard for the strain to transfer from the internal portion to the surface of the porous layer, and therefore an epitaxial semiconductor film having a good crystallinity can be formed.

Further, by using single crystal silicon as the semiconductor substrate, a single crystal silicon thin plate to be used in a solar cell can be produced. Further, the semiconductor substrate doped with boron at a high concentration is made porous at the anodization while maintaining the crystal state, therefore a good quality epitaxial semiconductor film can be formed.

Further, according to the process the present invention, two or more semiconductor layers may be epitaxially grown on the surface of the porous layer and for example solar cells etc. can be easily produced.

Further, in the case where for example a solar cell is produced, by forming an insulating film on the surface of this multi-layer epitaxial semiconductor film and further forming an electrode on this, the current can be led out from the epitaxial semiconductor film while reducing the generation of carriers and recombination at the interface with the epitaxial semiconductor film as much as possible.

Further, according to the process of the present invention, by bonding a transparent printed circuit board to the electrode surface of the solar cell, a substrate on which the interconnections of the circuit for the solar cell are formed and the solar cell can be integrally joined and the combination of a printed circuit board and thin film single crystal solar cell, which could never have been thought of in the field of semiconductor technology in past, can be easily achieved.

Further, in the solar cell produced according to the present invention, for example the single crystal Si can be formed thin, that is, flexible as the epitaxial semiconductor film, therefore a solar cell having a certain extent of flexibility can be obtained by the selection of the support substrate etc. For this reason, it is possible to use the same for a window glass with solar cells on the glass surface, the roof of a solar car, etc.

Further, since a single crystal is excellent in opto-electric conversion efficiency, the amount of electric power generated per unit area is better than conventional amorphous silicon. In addition, this can be produced with low energy, therefore the time for energy recovery can be greatly shortened.

According to the process for producing a thin film semiconductor of the present invention explained above, a thin film semiconductor having a large surface area and excellent crystallinity can be easily and inexpensively produced. Further, according to the process for producing a solar cell of the present invention, a solar cell which has a large surface area, excellent crystallinity, and sufficient thinness and accordingly high efficiency can be cheaply produced. Due to the reduction of costs in this way, it is possible to shorten the time for recovery of the energy.

What is claimed is:

1. A method for making a thin film semi-conductor comprising the steps of:

providing a semi-conductor substrate having a surface;

anodizing the semi-conductor substrate to provide a first porous layer adjacent the surface having a first porosity;

anodizing the semi-conductor substrate to provide at least one second porous layer adjacent the first porous layer opposite the surface, each said second porous layer having a second porosity greater than said first porosity;

forming a semi-conductor film on the first porous layer; and separating the semi-conductor film from the semi-conductor substrate along a line of relative weakness defined in or adjacent one of said second porous layers.

2. A method for making a thin film semi-conductor comprising the steps of:

providing a semi-conductor substrate having a surface;

anodizing the semi-conductor substrate at a first current density to provide a first porous layer adjacent the surface having a first porosity;

anodizing the semi-conductor substrate at a second current density higher than said first current density to provide a second porous layer adjacent the first porous layer opposite the surface, the second porous layer having a second porosity greater than the first porosity;

anodizing the semi-conductor substrate at a third current density higher than said second current density to provide a third porous layer in or adjacent the second porous layer, the third porous layer having a third porosity higher than said second porosity;

forming at least one semi-conductor film on the surface and first porous layer; and separating the semi-conductor film from the semi-conductor substrate along a line of relative weakness defined in the third porous layer or at or adjacent an interface defined between said third porous layer and the second porous layer.

3. A method as defined in claim 2, wherein in said anodizing steps, the semi-conductor substrate is contacted by an electrolytic solution and exposed to a flow of current at said first, second and third current density, respectively.

4. A method as defined in claim 3, wherein the electrolytic solution comprises hydrogen fluoride and a hydrocarbon alcohol.

5. A method as defined in claim 3, wherein in the anodizing steps, the composition of the electrolytic solution used in each anodizing step is the same.

6. A method as defined in claim 3, wherein in the anodizing steps, the composition of the electrolytic solution used in the anodizing steps varies.

7. A method as defined in claim 2, further comprising the step of annealing the semi-conductor substrate in a hydrogen atmosphere after the third anodizing step and before the forming step.

8. A method as defined in claim 7, further comprising the step of oxidizing the anodized substrate after the third anodizing step and before the hydrogen annealing step.

9. A method as defined in claim 2, wherein in the forming step the semi-conductor film is epitaxially grown.

10. A method as defined in claim 2, wherein the semi-conductor substrate is a single crystal silicon substrate.

11. A method as defined in claim 2, wherein the semi-conductor substrate is an impurity-doped semi-conductor substrate.

12. A method as defined in claim 2, wherein the semi-conductor substrate is a compound semi-conductor substrate.

13. A method as defined in claim 2, further comprising the step of attaching a support substrate to the semi-conductor film after the forming step and before the separating step.

14. A method as defined in claim 13, wherein the support substrate is a rigid substrate.

15. A method as defined in claim 13, wherein the support substrate is a flexible substrate.

16. A method as defined in claim 13, wherein the support substrate is attached to the semi-conductor film by adhesive bonding.

17. A method for making a thin film semi-conductor comprising the steps of:

providing a semi-conductor substrate having a surface;

anodizing the semi-conductor substrate at a first current density to provide a first porous layer adjacent the surface having a first porosity;

anodizing the semi-conductor substrate at a second current density higher than said first current density to provide a second porous layer adjacent the first porous layer opposite the surface, the second porous layer having a second porosity greater than the first porosity;

anodizing the semi-conductor substrate at a third current density higher than said second current density to provide a third porous layer in or adjacent the second porous layer, the third porous layer having a third porosity higher than said second porosity;

forming at least one semi-conductor film on the surface and first porous layer; and separating the semi-conductor film from the semi-conductor substrate along a line of relative weakness defined in the third porous layer or at or adjacent an interface defined between said third porous layer and the second porous layer, wherein in said anodizing steps, the semi-conductor substrate is contacted by an electrolytic solution and exposed to a flow of current at said first, second and third current density, respectively, and wherein the anodizing steps, the electrolytic solution is the same.

18. A method for making a thin film semi-conductor comprising the steps of:

providing a semi-conductor substrate having a surface;

anodizing the semi-conductor substrate at a first current density to provide a first porous layer adjacent the surface having a first porosity;

anodizing the semi-conductor substrate at a second current density higher than said first current density to provide a second porous layer adjacent the first porous layer opposite the surface, the second porous layer having a second porosity greater than the first porosity;

anodizing the semi-conductor substrate at a third current density higher than said second current density to provide a third porous layer in or adjacent the second porous layer, the third porous layer having a third porosity higher than said second porosity;

forming at least one semi-conductor film on the surface and first porous layer; and separating the semi-conductor film from the semi-conductor substrate along a line of relative weakness defined in the third porous layer or at or adjacent an interface defined between said third porous layer and the second porous layer, wherein in said anodizing steps, the semi-conductor substrate is contacted by an electrolytic solution and exposed to a flow of current at said first, second and third current density, respectively, and wherein the electrolytic solution used in the anodizing steps varies.

19. A method for making a thin film semi-conductor comprising the steps of:

providing a semi-conductor substrate having a surface;

anodizing said semi-conductor substrate at a first current density to provide a first porous layer adjacent said surface having a first porosity;

anodizing said semi-conductor substrate at a second current density higher than said first current density to provide a second porous layer adjacent said first porous layer opposite said surface, said second porous layer having a second porosity greater than said first porosity;

annealing said semi-conductor substrate in a hydrogen atmosphere after said step of anodizing said semi-conductor substrate to provide said second porous layer; and forming at least one semi-conductor film on said surface.

20. A method for making a thin film semi-conductor comprising the steps of:

providing a semi-conductor substrate having a surface;

forming a first porous layer adjacent said surface having a first porosity;

forming a second porous layer within said first porous layer having a second porosity higher than said first porosity;

forming at least one semi-conductor film on said surface; and separating said semi-conductor film from said semi-conductor substrate.

* * * * *

Disclaimer

6,107,213—Hiroshi Tayanaka, Kanagawa, Japan. METHOD FOR MAKING THIN FILM SEMICONDUCTOR. Patent dated Aug. 22, 2000. Disclaimer filed Jul. 25, 2005, by the assignee, Sony Corporation.
Hereby enters this disclaimer to claim 20, of said patent.

*Official Gazette, March 21, 2006*

Disclaimer

6,107,213 - Hiroshi Tayanaka, Kanagawa, (JP). METHOD FOR MAKING THIN FILM SEMICONDUCTOR. Patent dated Aug. 22, 2000. Disclaimer filed Oct. 5, 2010, by the assignee, Sony Corporation.

Hereby enters this disclaimer to claim 1 of said patent.

(*Official Gazette, November 23, 2010*)